United States Patent
Maruyama

(10) Patent No.: US 7,027,947 B2
(45) Date of Patent: Apr. 11, 2006

(54) INTEGRATED CIRCUIT TESTING METHOD, PROGRAM, STORING MEDIUM, AND APPARATUS

(75) Inventor: Daisuke Maruyama, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 48 days.

(21) Appl. No.: 10/791,725

(22) Filed: Mar. 4, 2004

(65) Prior Publication Data

US 2004/0243339 A1 Dec. 2, 2004

(30) Foreign Application Priority Data

Apr. 3, 2003 (JP) .............................. 2003-100341

(51) Int. Cl.
 *G01R 31/303* (2006.01)

(52) U.S. Cl. ...................................... 702/120; 714/725
(58) Field of Classification Search ............ 702/57–59, 702/64, 108, 117, 118, 119, 120, 124, 126, 702/185, 189, 188, 176, 178, 146–149, 142, 702/145, 12, 80, 92, 93, 95, 96, 104, 116; 714/30, 718, 724, 725, 741; 324/76.11, 534; 327/203; 340/988–990; 701/22, 23, 25, 701/96

See application file for complete search history.

(56) References Cited

U.S. PATENT DOCUMENTS

| 6,003,150 A * | 12/1999 | Stroud et al. ................ 714/725 |
| 6,065,145 A * | 5/2000 | Bencivenga ................ 714/724 |
| 6,708,139 B1 * | 3/2004 | Rearick et al. ............. 702/185 |
| 6,708,301 B1 * | 3/2004 | Ohta et al. .................. 714/724 |
| 2004/0088627 A1 * | 5/2004 | Nishioka et al. ........... 714/741 |
| 2004/0103352 A1 * | 5/2004 | Gupte et al. ................ 714/718 |
| 2004/0268181 A1 * | 12/2004 | Wang et al. .................. 714/30 |

FOREIGN PATENT DOCUMENTS

| JP | 08-101258 A | 4/1996 |
| JP | 2001-042012 A | 2/2001 |
| JP | 2002-131399 A | 5/2002 |

* cited by examiner

*Primary Examiner*—Marc S. Hoff
*Assistant Examiner*—Mohamed Charioui
(74) *Attorney, Agent, or Firm*—Arent Fox PLLC

(57) ABSTRACT

An ATPG unit permits allocation of a don't care X as a state for activating a propagating path of a failure and, after a change in network, transfers the state from the don't care X to an uncontrol value, thereby activating the propagating path of the failure. Further, the ATPG unit supplies a system clock as a sending clock to a sending FF, gives a change to the network from the sending FF, propagates the change, supplies the system clock as a receiving clock to a receiving FF, and captures the network change, thereby propagating a state for detecting a delay failure to a path between the sending FF and the receiving FF and generating a test pattern when the propagation succeeds.

54 Claims, 35 Drawing Sheets

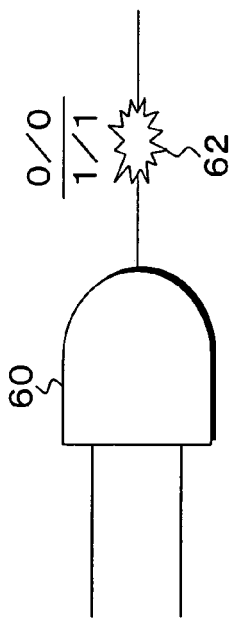
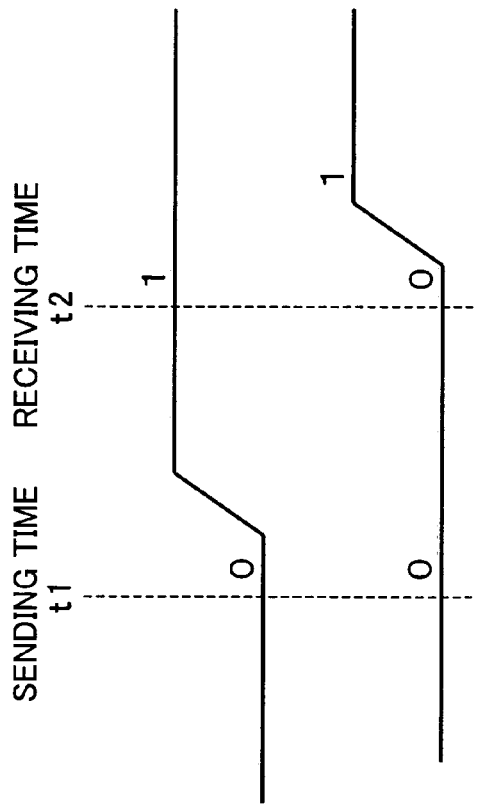
FIG. 9A
LEADING FAILURE
EXCITATION
FIG. 9B
NORMAL
FIG. 9C
DELAY FAILURE
FIG. 9D
NOTATION

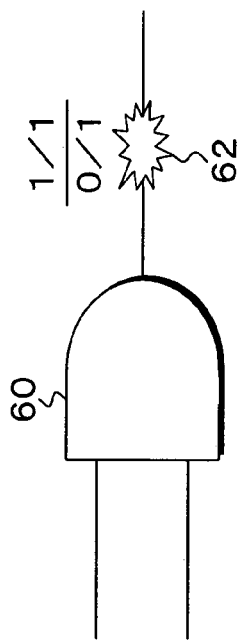
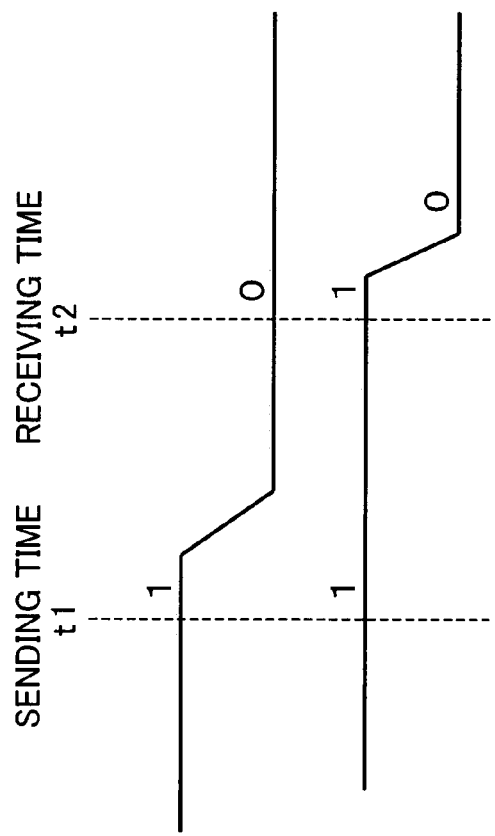
FIG. 10A TRAILING FAILURE EXCITATION
FIG. 10B NORMAL
FIG. 10C DELAY FAILURE
FIG. 10D NOTATION FIG. 11A $\quad\dfrac{0/0}{0/0}$ FIG. 11B $\quad\dfrac{1/1}{1/1}$ FIG. 11C $\quad\dfrac{X/X}{0/0}$ FIG. 11D $\quad\dfrac{X/X}{1/1}$ FIG. 11E $\quad\dfrac{1/1}{0/0}$ FIG. 11F $\quad\dfrac{0/0}{1/1}$

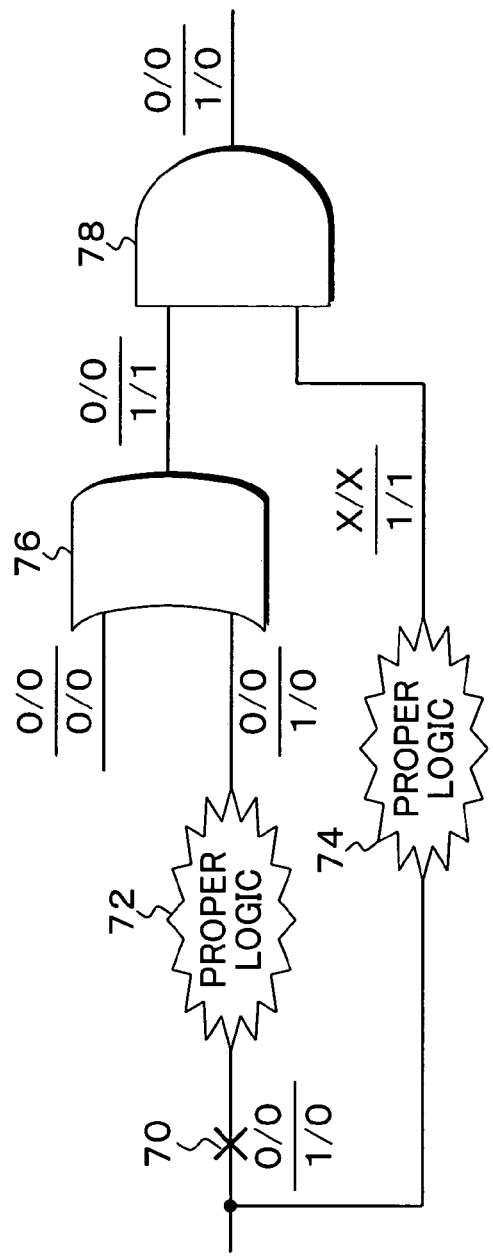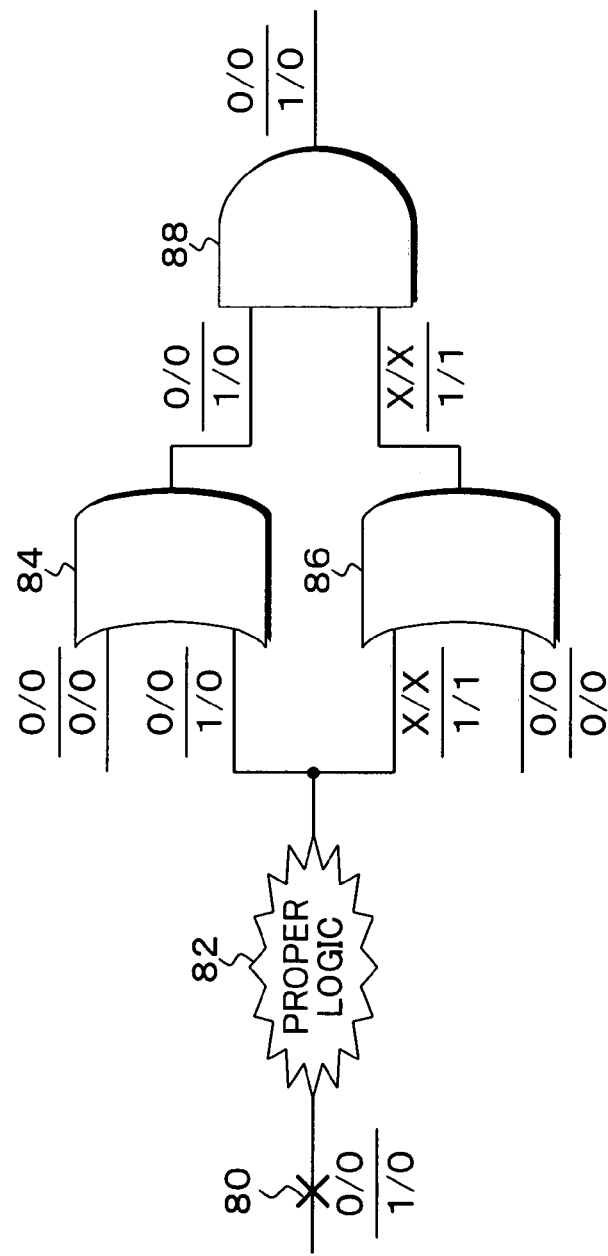
FIG. 13A
FIG. 13B

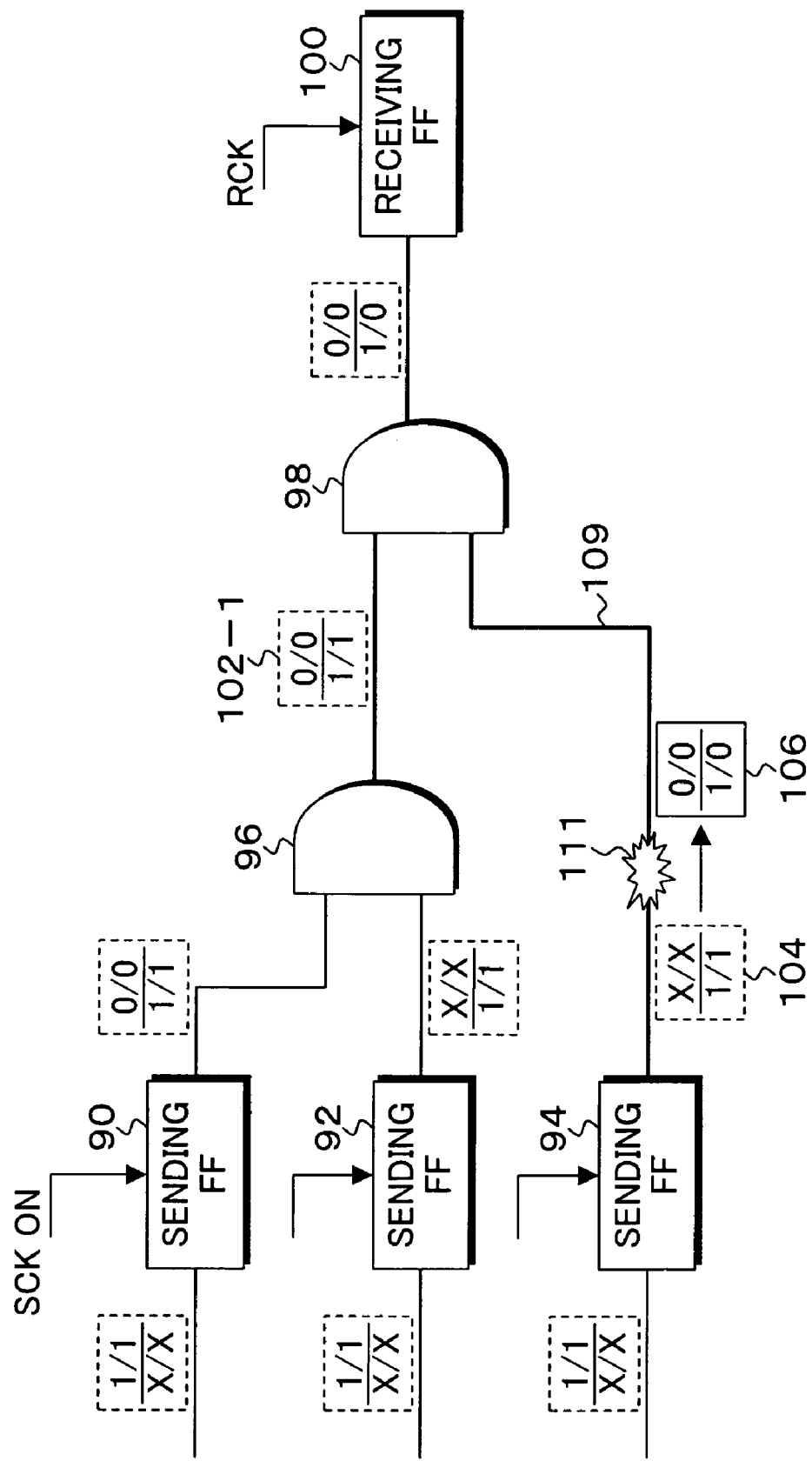

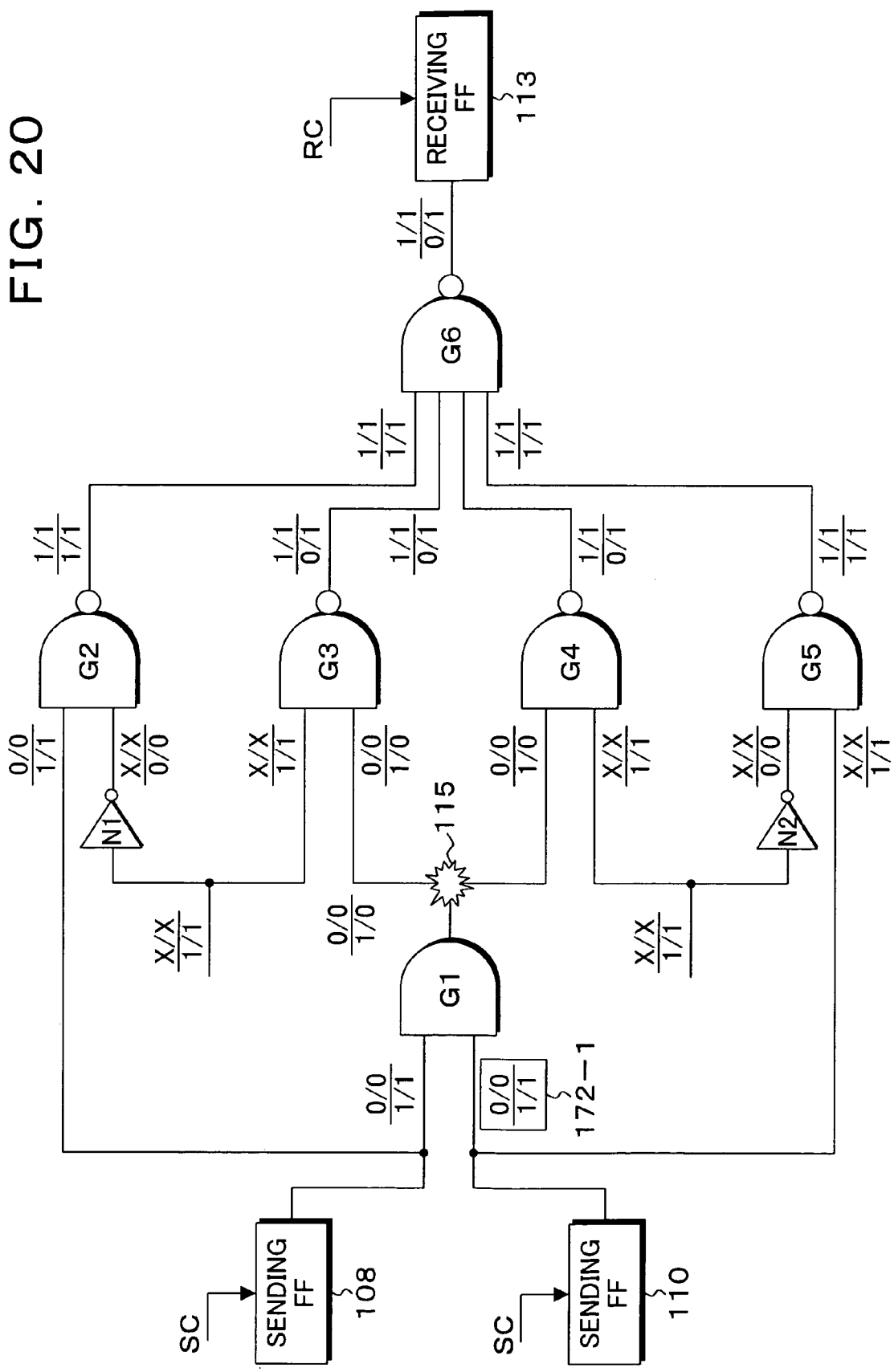

INTEGRATED CIRCUIT TESTING METHOD, PROGRAM, STORING MEDIUM, AND APPARATUS

BACKGROUND OF THE INVENTION

1. Field of the Invention

The invention relates to integrated circuit testing method, program, storing medium, and apparatus for automatically forming a test pattern of a dynamic function test and testing, more particularly, to integrated circuit testing method, program, storing medium, and apparatus in which a failure detection ratio of a dynamic function test for detecting a delay failure by applying a system clock is improved, thereby shortening a processing time.

2. Description of the Related Arts

In recent years, an influence by delay failures which are mixed due to a variation in manufacturing processes of LSIs has been increasing due to the realization of a high speed and microminiaturization of a circuit, and those delay failures cannot be detected if only a conventional low-speed static function test (SFT) is used. Therefore, sufficient test quality cannot be guaranteed with respect to the operation in a state where the LSI is actually assembled into a system. Therefore, there has been proposed a dynamic function test (DFT) in which a system clock is supplied as a sending clock, a change is given to a network from a sending FF and propagated, similarly, the system clock is supplied as a receiving clock, and the change is detected by a receiving FF, thereby detecting a delay failure of a path between the sending FF and the receiving FF.

An automatic test pattern generation (ATPG) method of automatically generating a test pattern for such a conventional dynamic function test is used, as a target, for detection of a transition failure which is presumed on the network or for the transferring operation of a path between the specific sending FF and the receiving FF. In this case, as a method of activating the failure propagating path, due to a restriction for improving resolution regarding the detection of the transition failure or the measurement of the specific path serving as a target, that is, due to a restriction for suppressing the occurrence of a hazard, a method of monotonously activating only the propagating path of the transition failure to be detected or the specific path for allowing the transferring operation to be executed is often used.

However, in such a automatic test pattern generation using the conventional activating method of the single path as mentioned above, in all multi-input gates existing on the activating path, states before and after the sending clock need to be aligned to uncontrol values with respect to inputs from paths other than the path to be activated. The test certainly fails in the case where an inevitable change is propagated to the gate input to which the uncontrol value is to be set at timing before and after the sending clock due to re-convergence of the path to be activated or the like. Therefore, it is difficult to obtain the sufficient detection ratio with respect to the transition failure or the specific path for allowing the transferring operation to be executed as a target of the automatic test pattern generation.

In automatic test pattern generation according to the activating method of the single path, since, no change exists in the gate inputs from the paths other than the path to be activated before and after the sending clock, the transition failure which is detected by the test pattern or the specific path which allows the transferring operation to be executed is limited to the transition failure on the path to be activated or the specific path for allowing the transferring operation to be executed. There is a problem such that if it is intended to obtain the highest failure detection ratio as possible, the number of tests which are generated increases. When considering the operation of an LSI assembled in an actual system, a situation such that only the single path is activated in the transfer path from the sending FF to the receiving FF is considered to be a unique case. There is a problem such that a possibility that the operation of the test pattern formed by the conventional testing method is deviated from the operation of the LSI assembled in the actual system is high.

SUMMARY OF THE INVENTION

According to the invention, there are provided integrated circuit testing method, program, storing medium, and apparatus for improving a detection ratio of a delay failure in a dynamic function test which applies a system clock, reducing the number of generation tests, and shortening a processing time.

The invention provides an integrated circuit testing method comprising: a reading step wherein circuit data is read out by a circuit data reading unit; a path cut step wherein a path cut point is selected from a target circuit and a state is fixed by a path cut countermeasure unit; and an automatic test pattern generating step wherein test data to detect a delay failure with respect to the circuit whose path cut has been finished as a target is generated by an automatic test pattern generation unit (ATPG unit).

(Permission of don't care X as a propagating path activating state)

As such an integrated circuit testing method, according to the invention, the automatic test pattern generating step comprises:

a narrowing step wherein an area including a sending FF group corresponding to failure presumption points, a receiving FF, and further, a preparation FF group that is one-stage precedent to the sending FF group is specified as a processing target circuit by a narrowing processing unit;

a failure exciting step wherein states of failure excitation at sending time and receiving time which have an inverting relation such that the state changes from 0 to 1 in a leading failure and changes from 1 to 0 in a trailing failure are allocated to the failure presumption points by a failure exciting unit;

a path activating step wherein states at the sending time and the receiving time for activating a propagating path of the failure are allocated to the residual preparation FFs and sending FFs by a failure propagating state setting unit; and a failure propagating step wherein, by an automatic test pattern generation control unit, a system clock is supplied as a sending clock to the sending FF, a change is given to a network from the sending FF and propagated, the system clock is supplied as a receiving clock to the receiving FF, and the network change is captured, thereby propagating a state for detecting the delay failure to a path between the sending FF and the receiving FF and generating a test pattern when the propagation succeeds, and further, in the path activating step, an allocation of a don't care X is permitted as a state for activating the propagating path of the failure, and in the failure propagating step, after the change in network, the state is transferred from the don't care X to an uncontrol value, thereby activating the propagating path of the failure. The don't care X is a logic value constructing a test pattern which does not exert an influence on the failure detection ratio even if the state value is replaced with the opposite value.

As mentioned above, hitherto, the uncontrol value without a change, for example, an uncontrol value 1 has been allocated in the case of an AND gate as a condition to activate the path for propagating the delay failure. However, according to the invention, since the activating condition in which the state value is set from the don't care X at the sending time before the change into the uncontrol value at the receiving time after the change is admitted, even in the case where the inevitable change is propagated to the network to which the activating conditions are given by the state allocation which performs the failure excitation, the test pattern can be generated. Even in the case where the failure propagating path itself is converged and the inevitable change is propagated to a plurality of paths, the test pattern can be generated. Since the change in uncontrol value from the don't care X is admitted as an activating condition, the state allocation of 0 and 1 at the sending time is collected to X and the number of states which are allocated decreases. Since the allocation states decrease, a possibility of the occurrence of a contradiction decreases.

(Failure Excitation in Compaction)

According to the integrated circuit testing method of the invention, after the failure propagating step is finished, the method comprises:

a compaction failure exciting step wherein the don't care X in the path activating step changes to a value opposite to that of the state at the receiving time and the state of the failure excitation is allocated; and a compaction failure propagating step wherein the system clock is supplied as a sending clock to the sending FF, the change is given to the network from the sending FF and propagated, the system clock is supplied as a receiving clock to the receiving FF, and the network change is captured, thereby propagating the state for detecting the delay failure to the path between the sending FF and the receiving FF and generating the test pattern when the propagation succeeds.

As mentioned above, after the failure propagation succeeded and was finished in the failure propagating step which was executed first, by the failure excitation such that the don't care X changes to a value opposite to that of the state at the receiving time and the state of the failure excitation is allocated, the path to which the activating condition has been given in the first failure propagation can be set to the failure propagating path. By repetitively executing such a process with respect to all residual undetectable presumption failures which can be selected, efficiency of the pattern compaction is improved and the number of generation test patterns decreases.

(Discrimination about Whether the Failure Excitation is Impossible or Not)

The failure exciting step is characterized in that when a clock-off is allocated to the sending FF at the sending time, an uncontrol value (u) showing that a failure value is in a state where the failure excitation is impossible is conditional-implicated for an output of the sending FF at the receiving time, the allocation itself of the uncontrol value (u) is determined that the failure excitation is impossible and the failure is excluded from targets of the delay failure. Since the uncontrol value (u) is conditional-implicated in the failure value of the failure presumption point of the sending clock off as mentioned above, the allocation itself of the failure excitation is determined to be contradictory (the excitation is impossible) and the wasteful target is reduced.

(Discrimination of Undetectable Failure)

When the failure propagation fails in the failure propagating step, among the failures which are presumed into the network from the network in which the failed failure has been presumed to a branch input of a fan-out free area, the failure in which the inverting relation is equal to that of the failed failure and a failure value is equal to a control value of a gate is extracted and excluded as an undetectable failure. As mentioned above, when the automatic test pattern generation regarding a certain failure fails, the failures which satisfies the conditions in which the inverting relation is equal to that of the failed failure and the failure value is equal to the control value of the gate are determined as undetectable failures and excluded from the targets, thereby realizing a high speed of the automatic test pattern generation.

(Path Cut Countermeasure)

In the path cut step, in a gate input of driving the path cut point, a control value of a gate is given at the sending time and the receiving time and the state is fixed, or the uncontrol value of the gate is given to all gate inputs at the sending time and the receiving time and the state of the path cut point is fixed by allocating a fixed state "from 0 to 0" or "from 1 to 1". If the path to be cut has a loop construction, the fixing of the state which is performed by giving the control value of the gate is similar to that of the path cut countermeasure against the ordinary loop path. However, if it does not have the loop construction, unlike the path cut countermeasure, the path itself to be cut can be also controlled to the ordinary loop path. In addition to the foregoing control, according to the invention, attention is paid to a point that in the test of the delay failure, it is sufficient that the path cut point is set to the uncontrol value of the same value between the sending time and the receiving time, the uncontrol value of the gate is given to all of the gate inputs at the sending time and the receiving time, thereby fixing the state of the path cut point. Thus, the states of nτ paths which exist in the transfer between the FFs and does not need the completion of the transfer in one cycle (1τ) are fixed at the sending time and the receiving time, thereby performing the path cut.

The path cut step has a fixed state selecting step wherein, with respect to the fixed state "from 0 to 0" or "from 1 to 1" which is allocated to the path cut point, the failure detection impossible number is measured by the automatic test pattern generating step and the fixed state whose failure detection impossible number is small is selected. By selecting the fixed state which minimizes the failure detection impossible number as mentioned above, a decrease in failure detecting ratio is prevented. Further, the path cut step has a hazard-freeing step wherein in the case where a transfer in-which a pin input position of the control value changes at the sending time and the receiving time exists among a plurality of input pins of the driver side gates for the path cut point, by adding and allocating the control value at the sending time to at least one input pin to which the control value is given at the receiving time, the hazard-free fixed state is generated for the path cut point.

(Trace Stopping Method of Narrowing)

In the narrowing step, as a preparation of the failure exciting step, a narrowing range is marked by back traces of two stages from the failure presumption point to the sending FF group via the receiving FF and from the sending FF group to the preparation FF group, and if both of the state at the sending time of the network and the state at the receiving time are not the don't care X, the back trace after the network is stopped.

In the case of performing the narrowing by the dynamic function test of the invention, to generate the change in the sending clock, the backward trace in the range from the receiving FF to the sending FF is executed and, further, it is necessary to perform the backward trace from the sending FF to the preparation FF at the front stage. In this case, if extents of the fan-outs between the FFs are uniformly equal, since the trace range from the sending FF to the preparation FF has a square extent on average as compared with that of the trace range from the receiving FF to the sending FF, it takes a time for the tracing process for performing the narrowing. Therefore, if both of the states at the sending time and the receiving time of the network are not the don't care X in the back trace, the back trace after the network is stopped and the marking process for conditional implication is reduced.

(Pair Failure Targets)

In the automatic test pattern generating step, if the detection of the delay failure fails with respect to either the leading delay failure or the trailing delay failure of the same network, the unmarking of the narrowing range which has been marked by the back trace in the narrowing step is not performed but the mark is used as it is, and the test pattern generation is executed by using the other undetected delay failure as a target. As mentioned above, with respect to the pair of failures as two failures, the narrowing process is executed once, thereby reducing the processing amount by half.

(Program)

The invention provides a program for executing an integrated circuit test. That is, the program of the invention allows a computer to execute:

a reading step wherein circuit data is read out;

a path cut step wherein a path cut point is selected from a target circuit and a state is fixed by a path cut countermeasure unit; and an automatic test pattern generating step wherein test data to detect a delay failure with respect to the circuit whose path cut has been finished as a target is generated, wherein the automatic test pattern generating step allows the computer to execute:

a narrowing step wherein an area including a sending FF group corresponding to failure presumption points, a receiving FF, and further, a preparation FF group that is one-stage precedent to the sending FF group is specified as a processing target circuit;

a failure exciting step wherein states of failure excitation at sending time and receiving time which have an inverting relation such that the state changes from 0 to 1 in a leading failure and changes from 1 to 0 in a trailing failure are allocated to the failure presumption points;

a path activating step wherein states at the sending time and the receiving time for activating a propagating path of the failure are allocated to the residual preparation FFs and sending FFs; and a failure propagating step wherein a system clock is supplied as a sending clock to the sending FF, a change is given to a network from the sending FF and propagated, the system clock is supplied as a receiving clock to the receiving FF, and the network change is captured, thereby propagating a state for detecting the delay failure to a path between the sending FF and the receiving FF and generating a test pattern when the propagation succeeds, and further, in the path activating step, an allocation of a don't care X is permitted as a state for activating the propagating path of the failure, and in the failure propagating step, after the change in network, the state is transferred from the don't care X to an uncontrol value, thereby activating the propagating path of the failure.

(Storing Medium)

The invention provides a computer-readable storing medium which stores a program for an integrated circuit test. That is, the storing medium of the invention stores the program for allowing the computer to execute:

a reading step wherein circuit data is read out;

a path cut step wherein a path cut point is selected from a target circuit and a state is fixed by a path cut countermeasure unit; and an automatic test pattern generating step wherein test data to detect a delay failure with respect to the circuit whose path cut has been finished as a target is generated, wherein the automatic test pattern generating step allows the computer to execute:

a narrowing step wherein an area including a sending FF group corresponding to failure presumption points, a receiving FF, and further, a preparation FF group that is one-stage precedent to the sending FF group is specified as a processing target circuit;

a failure exciting step wherein states of failure excitation at sending time and receiving time which have an inverting relation such that the state changes from 0 to 1 in a leading failure and changes from 1 to 0 in a trailing failure are allocated to the failure presumption points;

a path activating step wherein states at the sending time and the receiving time for activating a propagating path of the failure are allocated to the residual preparation FFs and sending FFs; and a failure propagating step wherein a system clock is supplied as a sending clock to the sending FF, a change is given to a network from the sending FF and propagated, the system clock is supplied as a receiving clock to the receiving FF, and the network change is captured, thereby propagating a state for detecting the delay failure to a path between the sending FF and the receiving FF and generating a test pattern when the propagation succeeds, and further, in the path activating step, an allocation of a don't care X is permitted as a state for activating the propagating path of the failure, and in the failure propagating step, after the change in network, the state is transferred from the don't care X to an uncontrol value, thereby activating the propagating path of the failure.

(Apparatus)

The invention provides an integrated circuit testing apparatus. That is, the integrated circuit testing apparatus of the invention comprises:

a circuit data reading unit which reads out circuit data;

a path cut countermeasure unit which selects a path cut point from a target circuit and fixes a state; and an automatic test pattern generation unit which generates test data to detect a delay failure with respect to the circuit whose path cut has been finished as a target, wherein the automatic test pattern generation unit comprises: a narrowing unit which specifies an, area including a sending FF group corresponding to failure presumption points, a receiving FF, and further, a preparation FF group that is one-stage precedent to the sending FF group as a processing target circuit; a failure exciting unit which allocates states of failure excitation at sending time and receiving time which have an inverting relation such that the state changes from 0 to 1 in a leading failure and changes from 1 to 0 in a trailing failure to the failure presumption points; a failure propagating state setting unit which allocates states at the sending time and the receiving time for activating a propagating path of the failure to the residual preparation FFs and sending FFs; and an automatic test pattern generation control unit which supplies a system clock as a sending clock to the sending FF, gives a change to a network from the sending FF and propagates the change, supplies the system clock as a receiving clock to the receiving FF, and captures the network change, thereby propagating a state for detecting the delay failure to a path between the sending FF and the receiving FF and generating a test pattern when the propagation succeeds, and further, the failure propagating state setting unit permits an allocation of a don't care X as a state for activating the propagating path of the failure, and the automatic test pattern generation control unit transfers the state from the don't care X to an uncontrol value after the change in network, thereby activating the propagating path of the failure.

Details of the storing medium and the apparatus are fundamentally the same as those in the case of the integrated circuit testing method and the program.

The above and other objects, features, and advantages of the present invention will become more apparent from the following detailed description with reference to the drawings.

BRIEF DESCRIPTION OF THE DRAWINGS

FIGS. 9A to 9D are explanatory diagrams of a failure exciting state of a leading failure in the dynamic function test of the invention;

FIGS. 10A to 10D are explanatory diagrams of a failure exciting state of a trailing failure in the dynamic function test of the invention;

FIGS. 11A to 11F are explanatory diagrams of activating states which are allocated in the invention;

FIGS. 13A and 13B are explanatory diagrams of failure propagating paths in which test pattern generation is enabled by the activation in which the don't care X is permitted in the invention;

FIGS. 14A and 14B are explanatory diagrams of a failure propagation in the case where activating conditions due to a change from the don't care X to an uncontrol value 1 are admitted and a process for setting a path to which activating conditions after success in the test were given into a failure propagating path according to the invention;

FIG. 20 is an explanatory diagram of state resetting to a control value 0 of the don't care X at the time of sending to 2nd failure selection in step S4 in FIG. 5;

DETAILED DESCRIPTION OF THE PREFERRED EMBODIMENTS

Figure 1:
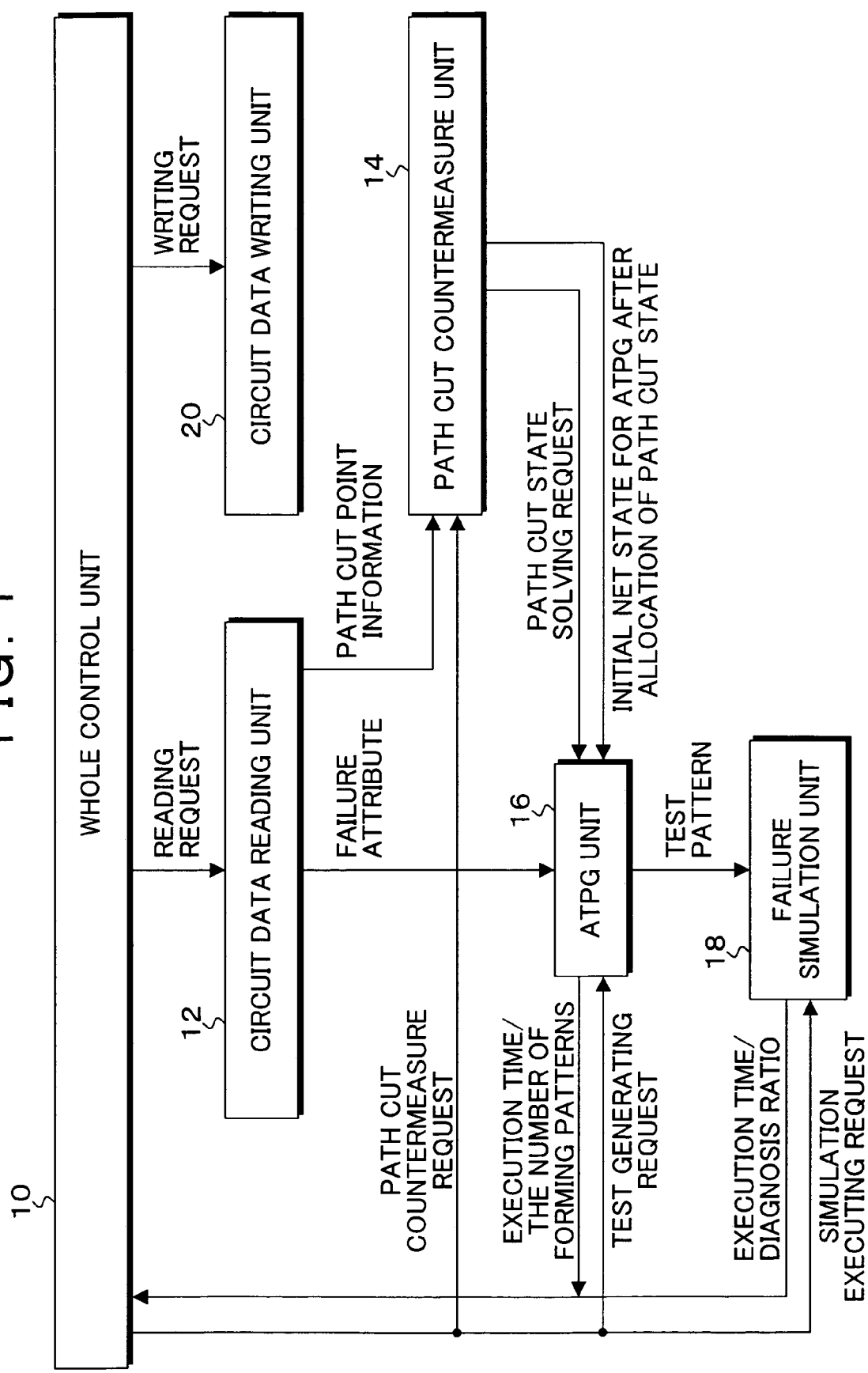
FIG. 1 is a block diagram of a functional construction of an integrated circuit testing apparatus according to the invention.

<Content>
1. Dynamic function test and automatic test pattern generation
2. Permission of don't care X
3. Discrimination about impossibility of failure excitation 4. Discrimination about undetectable failure
5. Path cut countermeasure
6. Narrowing process (1. Dynamic Function Test and Automatic Test Pattern Generation)

FIG. 1 is a block diagram of a functional construction of an integrated circuit testing apparatus according to the invention. In FIG. 1, the integrated circuit testing apparatus of the invention is constructed by: a whole control unit 10; a circuit data reading unit 12; an automatic test pattern generation unit (hereinafter, abbreviated to an "ATPG unit") 16; a path cut countermeasure unit 14; a failure simulation unit 18; and a circuit data writing unit 20.

The circuit data reading unit 12 receives a reading request from the whole control unit 10 and reads circuit data from a network list formed by automatic circuit setting. The path cut countermeasure unit 14, receives a path cut countermeasure request from the whole control unit 10, selects the path cut points from the target circuits read out by the data reading unit 12, and fixes the state. The ATPG unit 16 generates a test pattern for defining a delay failure with respect to the circuit whose path cut has been finished as a target. The test pattern generated by the ATPG unit is inputted to the failure simulation unit 18. On the basis of a simulation executing request from the whole control unit 10, a simulation by the test pattern is executed and an executing time and a diagnosis ratio are obtained. The circuit data writing unit 20 writes out the circuit data in which the process has been finished by the test pattern. The processing routine is finished. The ATPG unit 16 automatically generates the test pattern of the dynamic function test (DFT). The dynamic function test supplies a system clock as a sending clock, gives a change to the network from the sending FF, and propagates the change. Similarly, in the dynamic function test, the system clock is supplied as a receiving clock and a change is given to the network by the receiving FF, thereby stopping the delay failure of the path between the sending FF and the receiving FF.

Figure 2:
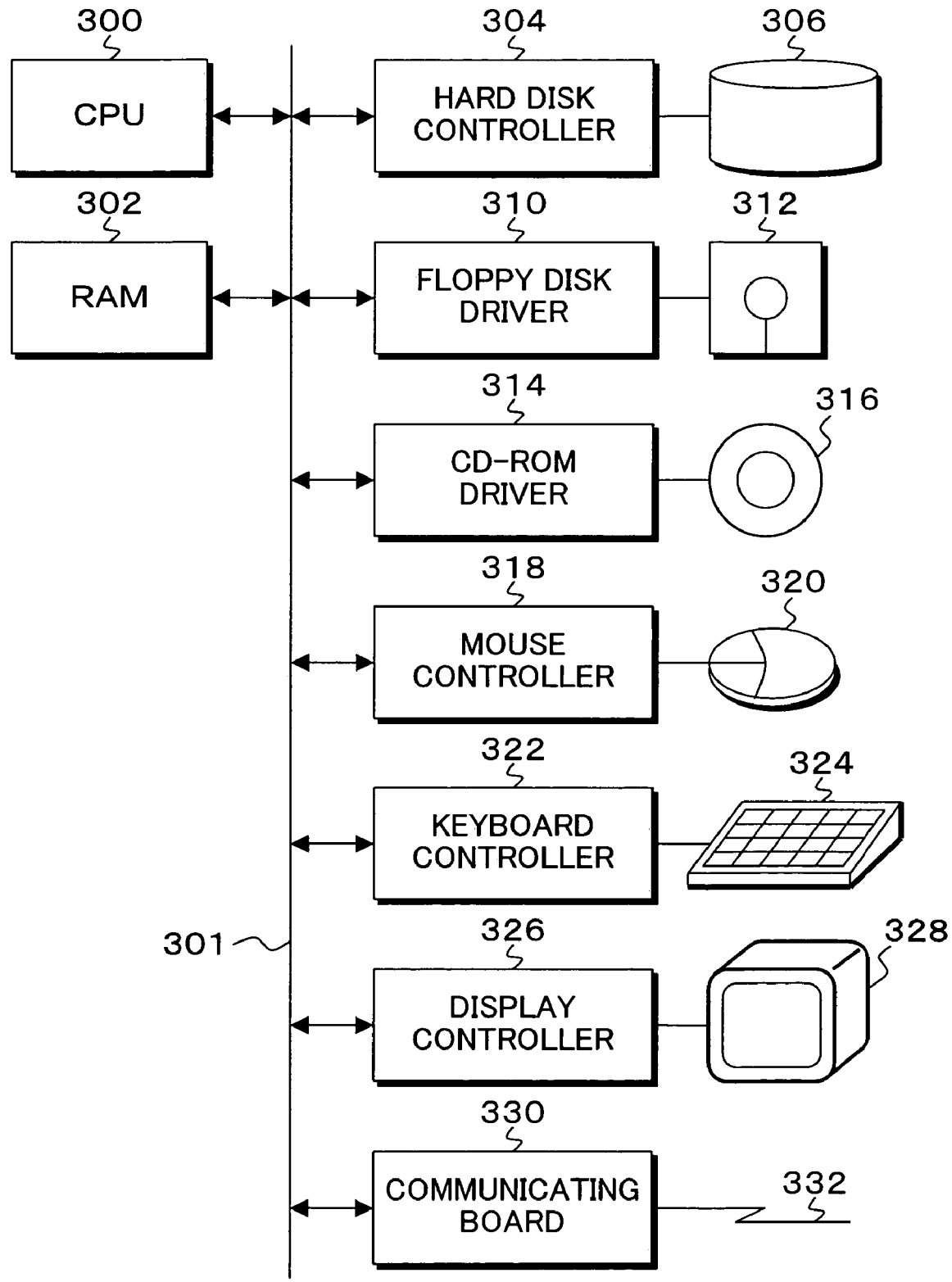
FIG. 2 is an explanatory diagram of a hardware environment of a computer in which the apparatus of FIG. 1 is realized.

The integrated circuit testing apparatus of the invention in FIG. 1 is realized by, for example, hardware resources of a computer as shown in FIG. 2. In the computer in FIG. 2, a RAM 302, a hard disk controller (software) 304, a floppy disk driver (software) 310, a CD-ROM driver (software) 314, a mouse controller 318, a keyboard controller 322, a display controller 326, and a communicating board 330 are connected to a bus 301 of a CPU 300. A hard disk drive 306 is connected to the hard disk controller 304 and programs to execute the integrated circuit testing process of the invention have been loaded in the hard disk drive 306. The necessary program is called from the hard disk drive 306 at the time of activation of the computer, developed into the RAM 302, and executed by the CPU 300. A floppy disk drive (hardware) 312 is connected to the floppy disk driver 310. Data can be read out from and written into the floppy disk® 312. A CD drive (hardware) 316 is connected to the CD-ROM driver 314 and data and programs stored in the CD can be read out. The mouse controller 318 transfers the inputting operation of a mouse 320 to the CPU 300. The keyboard controller 322 transfers the inputting operation of a keyboard 324 to the CPU 300. The display controller 326 controls a display unit 328 so as to display. The communicating board 330 uses a communication line 332 including wireless communication and communicates with another computer via a network such as Internet or the like.

Figure 3:
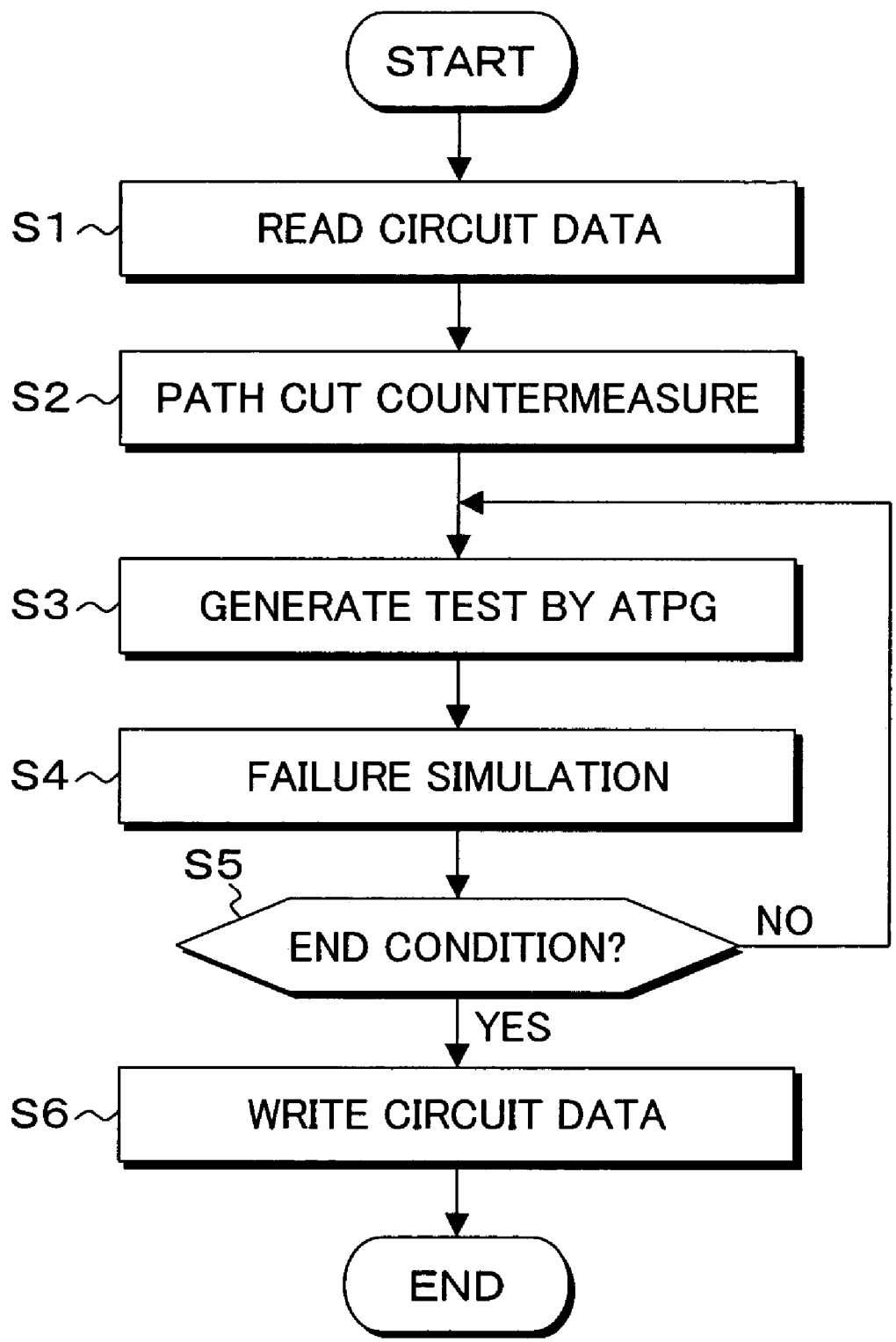
FIG. 3 is a flowchart for an integrated circuit testing process according to the invention.

FIG. 3 is a flowchart showing a whole processing procedure in the integrated circuit testing apparatus in FIG. 1. The whole processing procedure will be executed as follows.

Step S1: The circuit data is read out from the network list.
Step S2: The path cut is performed.
Step S3: The test data is generated by the automatic test pattern generating process.
Step S4: A failure simulation is executed on the basis of the generated test data.
Step S5: An execution result is analyzed and if an end condition is satisfied, step S6 follows. If NO, the processing routine is returned to step S3.
Step S6: The circuit data is written out and the processing routine is finished.

Figure 4:
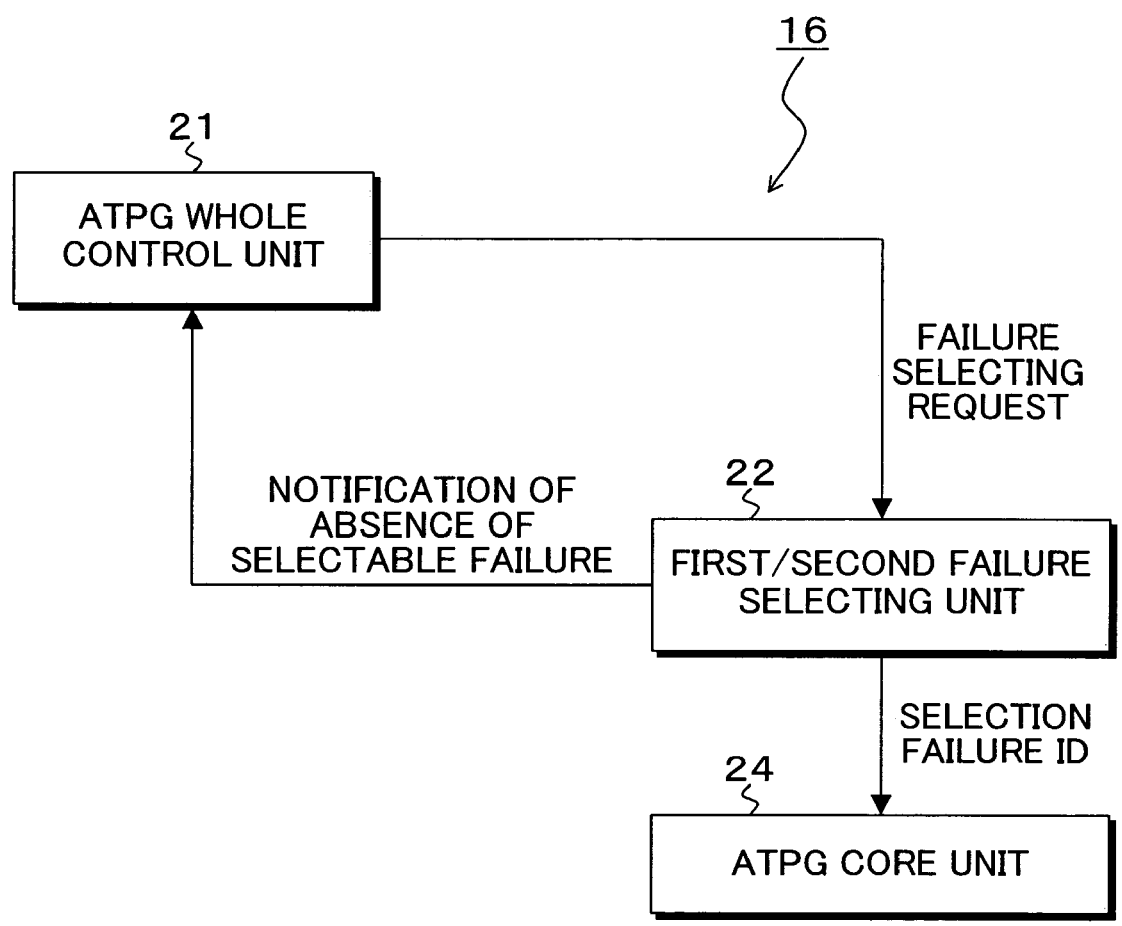
FIG. 4 is a block diagram of an automatic test pattern generation unit in FIG. 1.

FIG. 4 is a block diagram of the ATPG unit 16 in FIG. 1. The ATPG unit 16 is constructed by an ATPG whole control unit 21, a 1st/2nd failure selecting unit 22, and an ATPG core unit 24.

Figure 5:
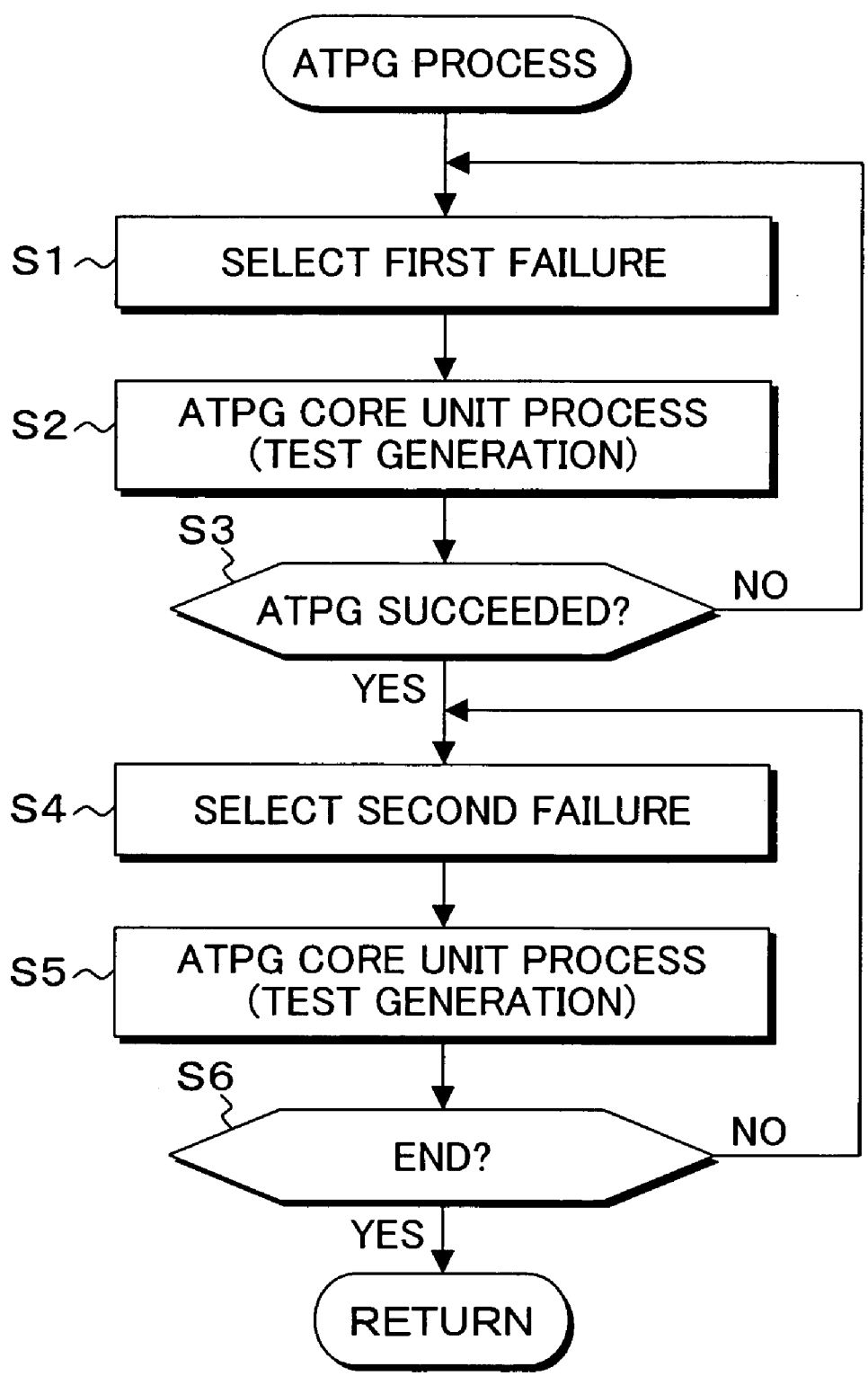
FIG. 5 is a flowchart for an automatic test pattern generating process in FIG. 4.

FIG. 5 is a flowchart for an automatic test pattern generating process by the ATPG unit 16 in FIG. 4 and it is processed by the following procedure.

Step S1: One of the undetected failures is arbitrarily selected as a 1st failure from a failure set.
Step S2: A test to detect the 1st failure is generated by the ATPG core unit with respect to the 1st failure selected in step S1.
Step S3: If the test generation to the 1st failure is succeeded by the ATPG core unit in step S2, the processing routine advances to a pattern compaction in step S4 and subsequent steps. If the test generation fails, a test generation is returned to a return value.
Step S4: In the current network state (network state to detect the 1st failure or to detect a 2nd failure selected before it), one of the undetected failures is arbitrarily selected as a 2nd failure from the failure set.
Step S5: A test to detect the 2nd failure is generated by the ATPG core unit with respect to the 2nd failure selected in step S4.
Step S6: If the undetected failures which can be selected exist in the failure set, the processing routine is returned to step S4. If they do not exist, the test generation is returned to the return value.

Figure 6:
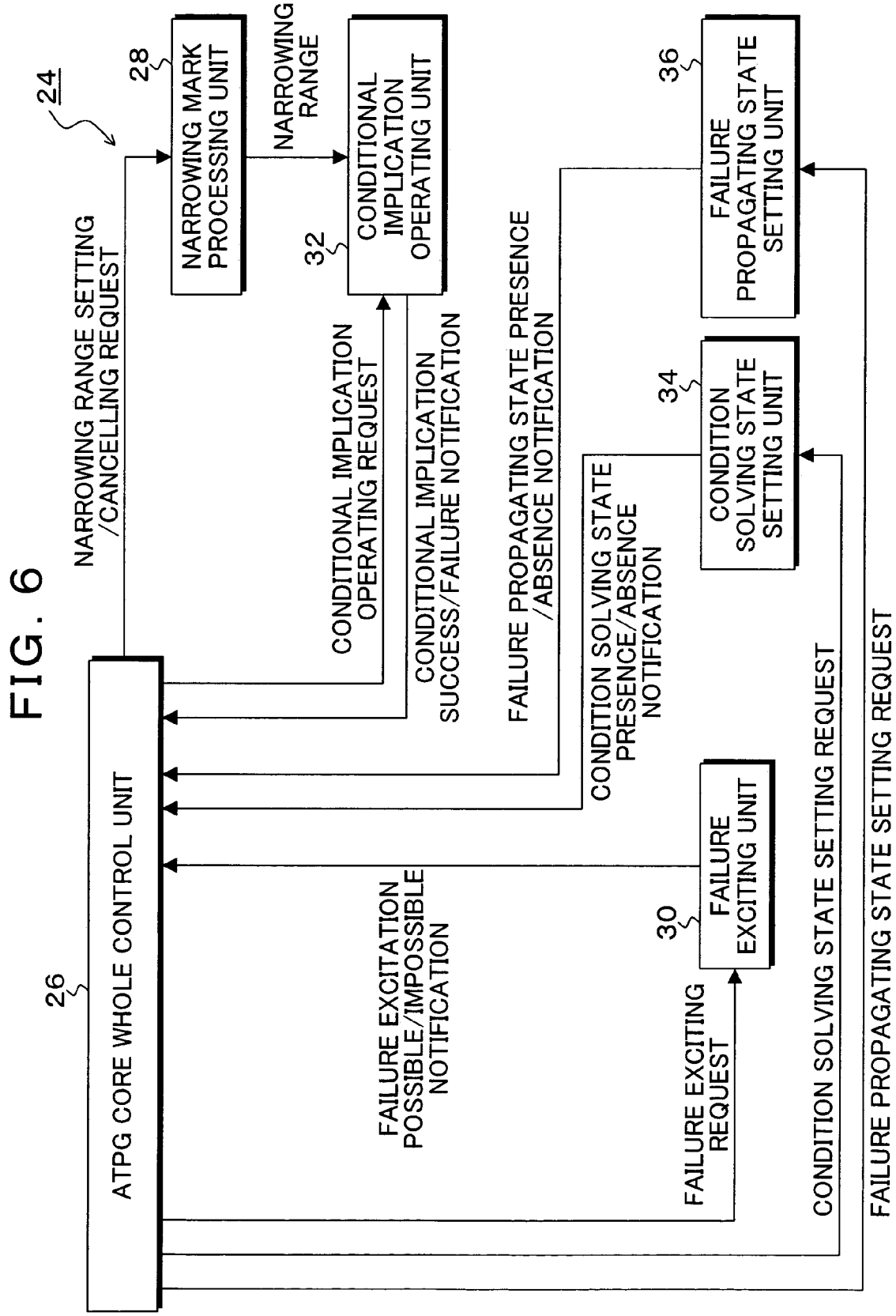
FIG. 6 is a block diagram of an automatic test pattern generation core unit in FIG. 5.

FIG. 6 is a block diagram of the ATPG core unit 24 provided in the ATPG unit 16 in FIG. 5. The ATPG core unit 24 is constructed by: an ATPG core whole control unit 26; a narrowing mark processing unit 28; a failure exciting unit 30; a conditional implication operating unit 32; a condition solving state setting unit 34; and a failure propagating state setting unit 36.

The narrowing mark processing unit 28 executes a marking process to specify an area including a sending FF group corresponding to the failure exciting unit 30, a receiving FF, and further, a preparation sending FF group that is one-stage precedent to the sending FF group as a processing target circuit. The narrowing process is executed in response to a narrowing range setting request from the ATPG core whole control unit 26. The marked narrowing range is outputted to the conditional implication operating unit 32. When the automatic test pattern generation regarding a certain failure presumption point succeeds, the ATPG core whole control unit 26 outputs a narrowing range cancelling request. In response to it, the narrowing mark processing unit 28 cancels the mark of the narrowing range in which the process has been finished. In response to a failure exciting request from the ATPG core whole control unit 26, the failure exciting unit, 30 allocates states of the failure excitation at sending time and receiving time in which a normal value changes from 0 to 1 and a failure value changes from 0 to 0 in a leading failure and the normal value changes from 1 to 0 and the failure value changes from 1 to 1 in a trailing failure to the failure presumption point as a processing target.

The failure propagating state setting unit 36 allocates states at the sending time and the receiving time for accelerating the failure propagating path to the preparation FF and the sending FF. The conditional implication operating unit 32 receives a conditional implication operating request from the ATPG core whole control unit 26, discriminates success/failure of the conditional implication about whether the states at the sending time and the receiving time allocated for failure propagation are adapted to the conditional implication or not, and notifies of a discrimination result. The condition solving state setting unit 34 notifies of the presence/absence of the failure propagating state, receives a presence/absence notification of a condition solving state from the ATPG core whole control unit 26 in response to such a notification, and sets the condition solving state.

By the functions of the conditional implication operating unit 32 and the condition solving state setting unit 34, the system clock is supplied as a sending clock to the sending FF, a change is given to the network from the sending FF and propagated, the system clock is supplied as a receiving clock to the receiving FF, and the change in network is captured, thereby propagating the state for detecting the delay failure to the path between the sending FF and the receiving FF. When the propagation succeeds, the automatic test pattern generation control process to generate the test pattern is executed. The invention is characterized in that in such an ATPG core unit 24, the allocation of the don't care X is permitted as a state for activating the propagating path of the failure by the failure propagating state setting unit 36. Thus, according to the failure propagating process in the invention, the don't care X in the activating state is controlled to the uncontrol value after the network was changed by the sending clock, the propagating path of the failure can be activated, and also with respect to the activating path for failure propagation, the change in states in the sending time and the receiving time is permitted.

Figure 7A:
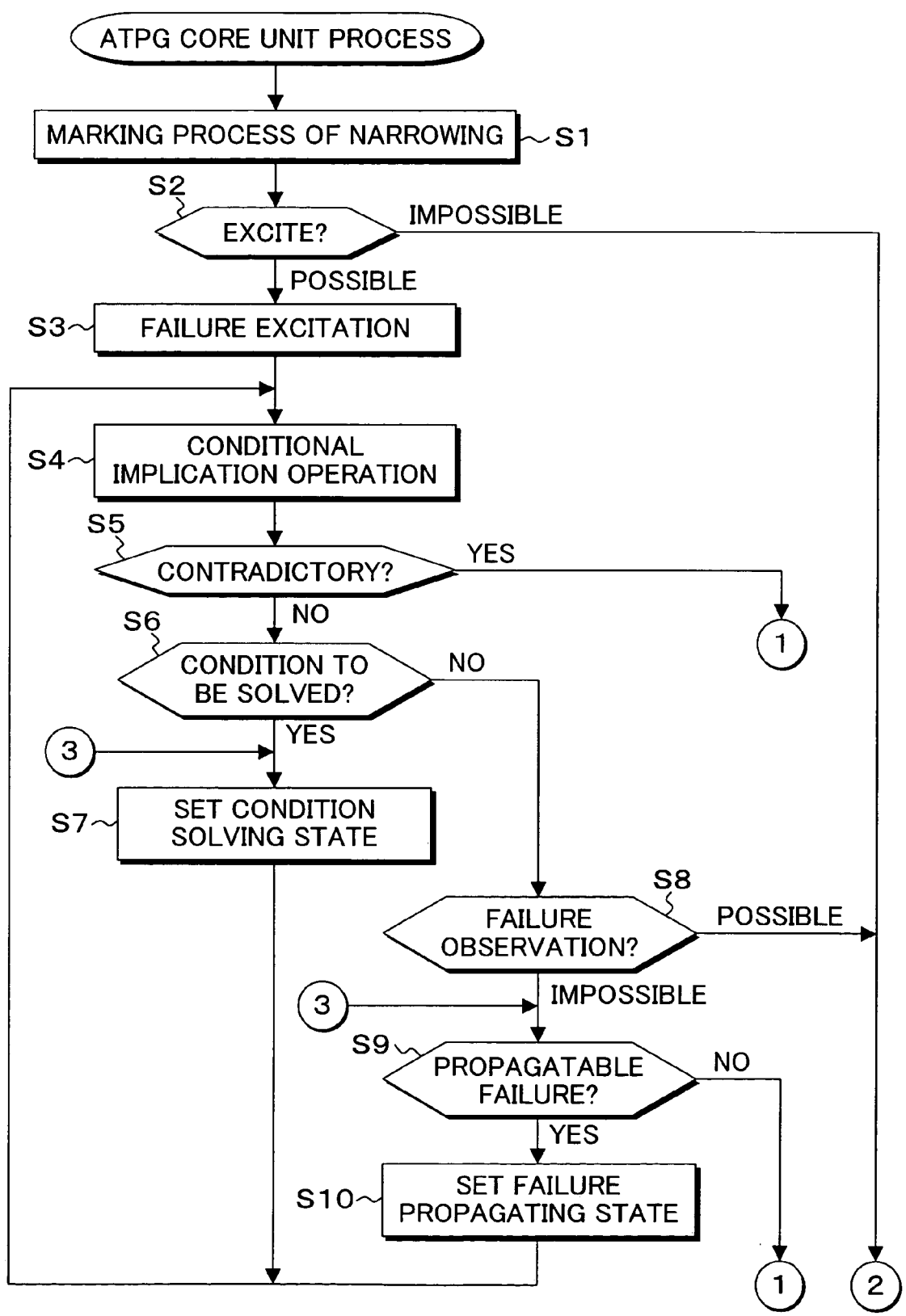
FIGS. 7A and 7B are flowcharts for an automatic test pattern generation core process in FIG. 6.
Figure 7B:
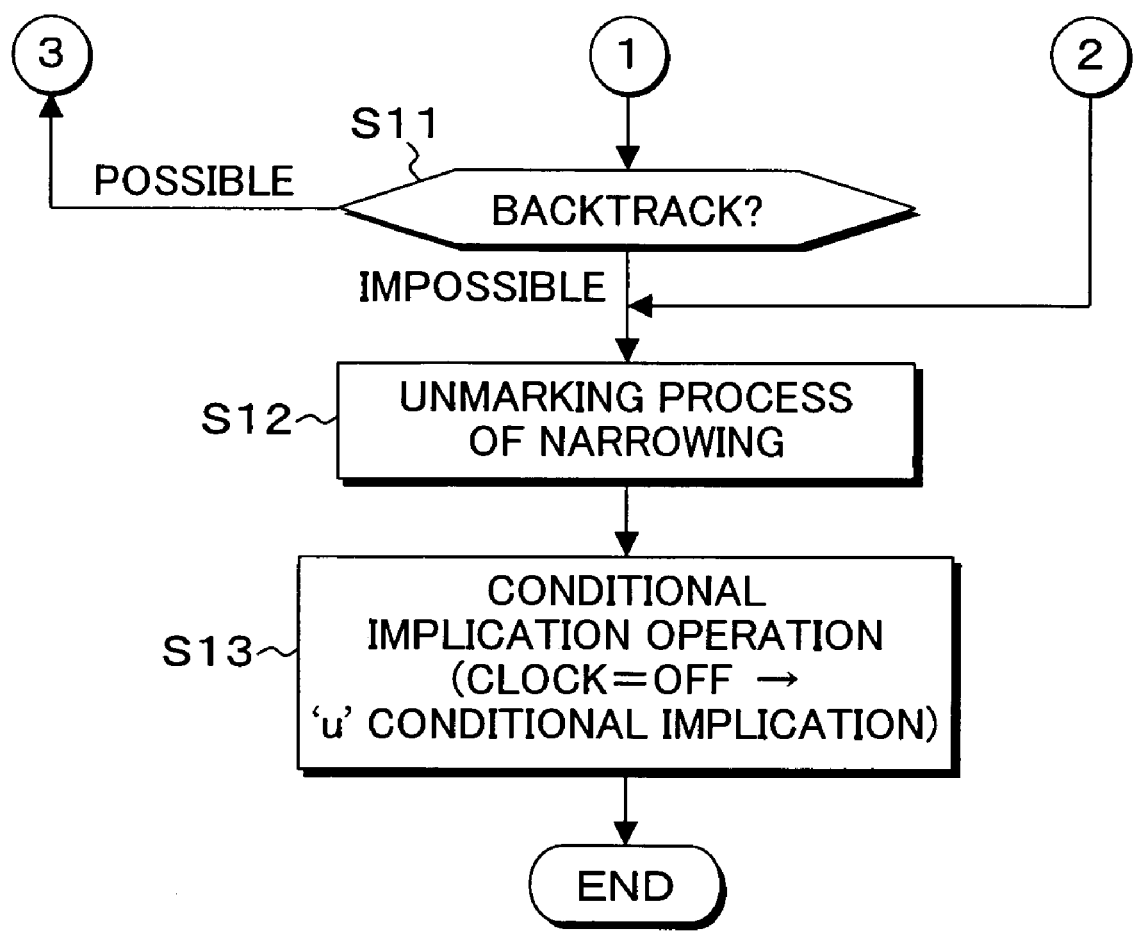

FIGS. 7A and 7B are flowcharts showing a processing procedure by the ATPG core unit 24 in FIG. 6 and it is executed as follows.

Step S1: The network connection which is related with respect to the failure given to the ATPG core unit is marked as a narrowing range.

Step S2: Whether the given failure can be excited in the present network state or not is discriminated. If it can be excited, step S3 follows. If it cannot be excited, the test failure is returned to the return value and the processing routine advances to step S12.

Step S3: An initial network state for failure excitation is set as a conditional implication start state.

Step S4: The conditional implication operation is executed on the basis of the given conditional implication start state.

Step S5: If a contradiction occurs by the conditional implication operation in step S4, step S11 follows. If it does not occur, step S6 follows.

Step S6: If gate conditions which are not solved yet exist in the conditional implication operation in step S5, step S7 follows. If they do not exist, step S8 follows.

Step S7: A state to solve the unsolved gate is set as a conditional implication start state and the processing routine is returned to step S4.

Step S8: If the fact that the failure has reached an observation point can be observed, the test success is returned to the return value and step S12 follows. If it cannot be observed, step S9 follows.

Step S9: If the gate at which the failure that can be propagated has arrived still exists, step S10 follows. If it does not exist, step S11 follows.

Step S10: The failure propagating state as a gate condition for propagating the failure is set as a conditional implication start state and the processing routine is returned to step S4.

Step S11: The conditional implication operation is returned and if the next conditional implication start state can be selected (back track), the processing routine is returned to next steps S7 and S10 of steps S6 and S9 on the control branching source side in which the processing routine has been shifted to step S11, respectively. If the back track is impossible, the test failure is returned to the return value and step S12 follows.

Step S12: The narrowing range marked in step S1 is unmarked. If the test generation has the return value of the test success, the network state which was conditional-implicated in step S4 is again conditional-implicated and "u" is conditional-implicated from a sending latch which is set to clock-off at this time.

With respect to the automatic pattern generating process of the invention by such a dynamic function test as a prerequisite, the permission of the don't care X as an activating state, the discrimination of the impossibility of the failure excitation, the discrimination of the undetectable position, the path cut countermeasure, and the narrowing process as features of the invention will be described in detail hereinbelow.

(2. Permission of Don't Care X)

In the dynamic function test as a target of the automatic pattern generating process according to the invention, the system clock is supplied as a sending clock, the change is given to the network from the sending FF, and the change is received in the receiving FF by the sending clock, thereby designating the transfer between the sending FF and the receiving FF.

Figure 8:
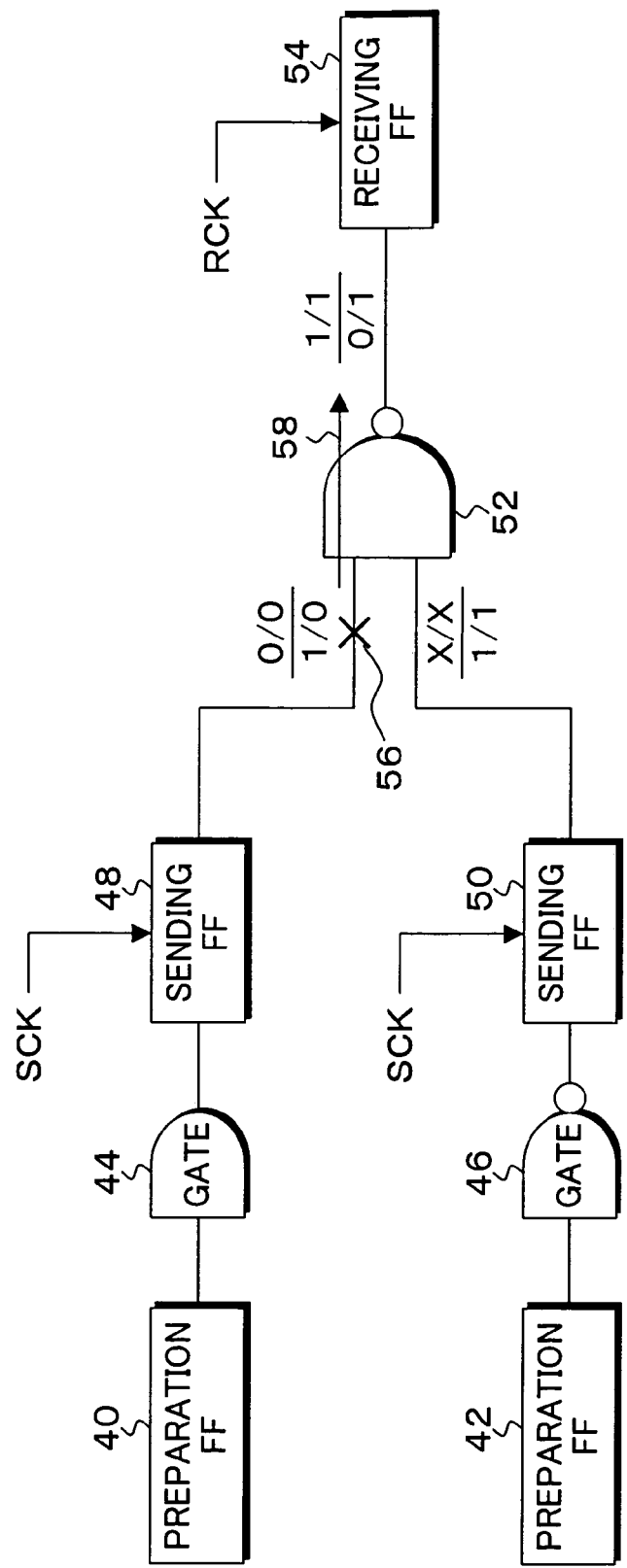
FIG. 8 is an explanatory diagram of a dynamic function test according to the invention which permits activation according to a don't care X.

FIG. 8 is a schematic explanatory diagram of the dynamic function test which permits the don't care X as an activating condition. In FIG. 8, the dynamic function test supplies a sending clock SCK as a system clock to sending FFs 48 and 50, gives a change to the network on which a NAND gate 52 exists, supplies a receiving clock RCK to a receiving FF 54, and captures the change in network, thereby propagating the failure state of, for example, a failure presumption point 56 selected with respect to one input of the NAND gate 52 and testing. A participant as a target of the automatic test pattern generation at this time is a delay failure which acts so as to delay the change in network.

In the dynamic function test, since values of setting states of the sending FFs 48 and 50 and one-stage preceding preparation FFs 40 and 42 to which activating conditions are given are changed by applying the sending clock SCK, the area from the sending FF 48 to the one-stage preceding preparation FF 40 is traced and the state is determined. As an automatic test pattern generation to perform the dynamic function test as mentioned above, in order to propagate the failure state of the failure presumption point 56 on the sending FF 48 side of the NAND gate 52 and observe it by the receiving FF 54, an activating state to activate a failure propagating unit 58 of the failure presumption point 56 is set onto the sending FF 50 side of the gate 52. In the invention, as a state of the sending clock, the don't care X is permitted for the activating state. The delay failure in the dynamic function test of the invention will now be described. FIGS. 9A to 9D are explanatory diagrams of a failure exciting state of a leading failure (also referred to as a 0-delay failure) among the delay failures in the dynamic function test of the invention. FIG. 9A relates to an example of an AND gate 60. If a failure presumption point 62 is selected as an output network of the AND gate 60, states at the failure presumption point 62 in the normal state and at the time of the delay failure are as shown in FIGS. 9B and 9C, respectively.

In the normal state in FIG. 9B, the state of the failure presumption point 62 is equal to 0 at sending time t1 and the state is equal to 1 at receiving time t2. On the other hand, at the time of the delay failure in FIG. 9C, the state 0 at sending time t1 is not changed to 1 at receiving time t2 but is held in the state 0, so that the delay failure occurs. Such a failure exciting state of the failure presumption point 62 for the dynamic function test can be expressed as shown in FIG. 9D. That is, a normal value and a failure value at the sending time are shown as (0/0) on the numerator side and a normal value and a failure value at the receiving time are shown as (1/0) on the denominator side, respectively.

From the above expression, it will be understood that although the state at the sending time is equal to 0 and the state at the receiving time normally rises to 1 in the normal state, at the time of the failure, the state at the sending time is equal to 0 and the state at the receiving time is still equal to 0 due to the delay failure. The failure exciting states of the leading failure in FIGS. 9A to 9D as mentioned above are similarly displayed with respect to the failure presumption point 56 in FIG. 8.

FIGS. 10A to 10D are explanatory diagrams of a failure exciting state of a trailing failure (also referred to as a 1-delay failure) in the dynamic function test of the invention. FIG. 10A relates to the case of selecting as a failure presumption point 62 of the output network of the AND gate 60. States at the sending time and the receiving time in the normal state and the failure state in this instance are as shown in FIGS. 10B and 10C, respectively. In the normal state in FIG. 10B, the state is equal to 1 at sending time t1 and the state is equal to 0 at receiving time t2. On the other hand, at the time of the delay failure in FIG. 10C, the state is equal to 1 at sending time t1 and it is still equal to 1 at receiving time t2 due to the delay failure. After that, the state changes to 0. Such a failure exciting state of the failure presumption point 62 in the trailing failure is expressed as shown in FIG. 10D. This expressing method is the same as that in the case of FIG. 9D. That is, with respect to a normal value, the state at the sending time is equal to 1 and the state at the receiving time is equal to 0, so that the trailing change occurs. However, at the time of the failure, the state at the sending time is equal to 1 and the state at the receiving time is equal to 1, so that the trailing change does not occur but the delay failure is caused.

FIGS. 11A to 11F are explanatory diagrams of activating states which are allocated to activate the failure propagating path according to the invention. FIGS. 11A and 11B show uncontrol values of the gates which are fixedly set without having a concept like sending time and receiving time in the conventional static function test (SFT). They are expressed by the activating states in the same dynamic function test as those in FIGS. 9D and 10D.

That is, FIG. 11A expresses the uncontrol value 0 of an OR gate as an activating state of the dynamic function test and a normal value and a failure value are set to the state 0 at the sending time and the receiving time. FIG. 11B shows the activating state of the uncontrol value 1 of the AND gate and all normal values and all failure values are set to the state 1 at the sending time and the receiving time.

FIGS. 11C and 11D show the activating states by the don't care X newly permitted by the invention. FIG. 11C shows the activating state of an OR gate and a normal value and a failure value at the sending time are set to the don't care X and both of a normal value and a failure value at the receiving time which need the activation are set to the state 0.

FIG. 11D shows the activating state of an AND gate, both of a normal value and a failure value at the sending time are set to the don't care X, and both of a normal value and a failure value at the receiving time are set to the state 1 serving as an uncontrol value.

In FIGS. 11E and 11F, the don't care X is set to the state 1 or 0 with respect to the activating states of FIGS. 11C and 11D in which the states at the sending time are set to the don't care X. As will be obvious from FIGS. 11E and 11F, the activating states in the dynamic function test of the invention permit the change in states at the sending time and the receiving time. The activating state in FIG. 11D is set as an activating state into the input on the sending FF 50 side of the NAND gate 52 in order to propagate the failure exciting state of the failure presumption point 56 by the failure propagating unit 58 in FIG. 8.

Figure 12A:
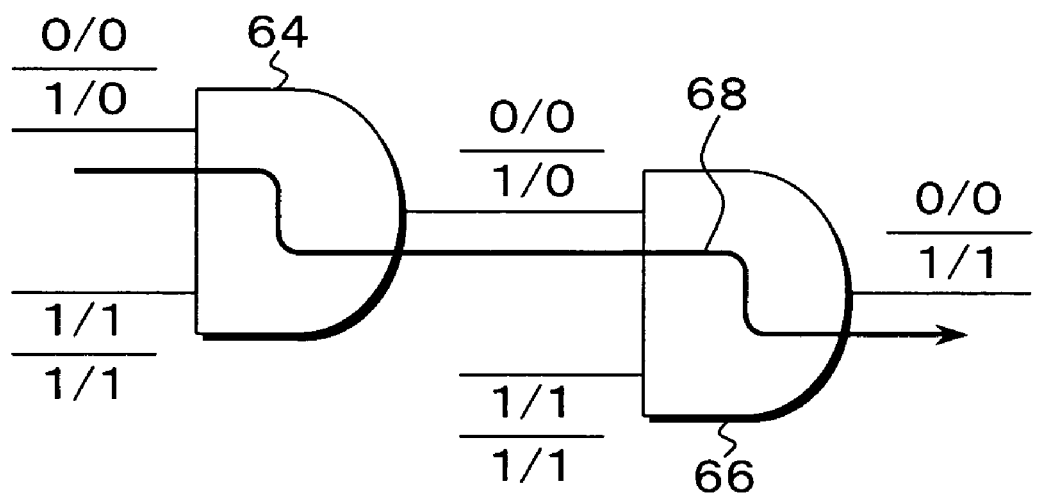
FIGS. 12A and 12B are explanatory diagrams of a failure propagation according to the activation in which the don't care X is permitted in the invention.
Figure 12B:
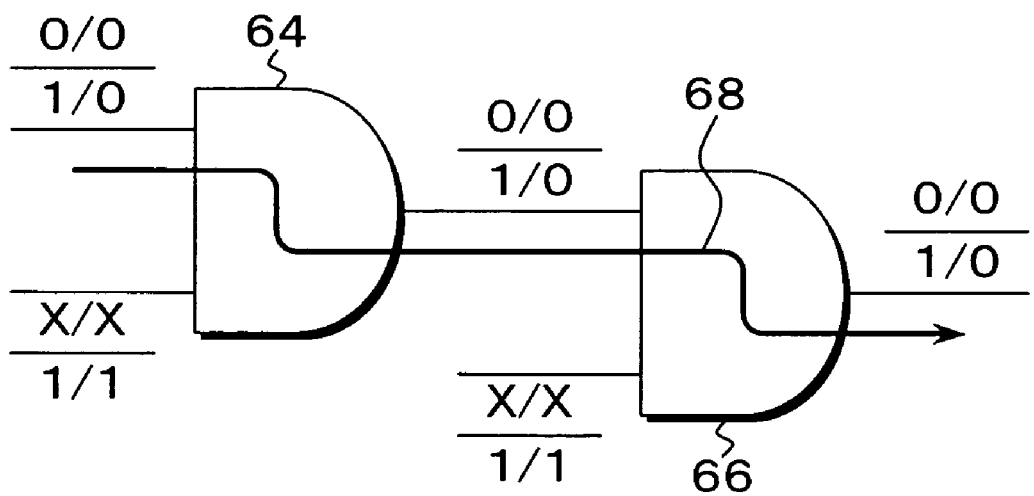

FIGS. 12A and 12B are explanatory diagrams of a failure propagation according to the activating states of the don't care X in the invention. FIG. 12A shows a failure propagating state in the case of fixedly setting the uncontrol values of the gates as a conventional activating condition with respect to AND gates 64 and 66.

That is, in the case of propagating the failure state as shown in a failure propagating path 68 with respect to the AND gates 64 and 66, the state 1 as an uncontrol value is fixedly set to input pins on the opposite sides of the AND gates 64 and 66 and the failure propagating path 68 is activated. On the other hand, according to the invention, the don't care X at the sending time is permitted as an activating state as shown in FIG. 12B and the state is set to the uncontrol value 1 at the receiving time, thereby activating the failure propagating path 68.

By the setting of the activating state which permits the don't care X at the receiving time as mentioned above, the test pattern which could not be realized by the conventional setting in the activating state which is fixed to a gate control value as shown in FIGS. 13A and 13B can be generated. FIG. 13A shows states in the case where a failure exciting state of a leading failure is allocated to a failure presumption point 70 and the failure is propagated to the side of gates 76 and 78 via proper logics 72 and 74. In the case where the conventional activating states of the single path according to the path activation as mentioned above, that is, all states are fixed to the uncontrol value with respect to the proper logic 74 side, if an inevitable change is propagated to the input pin of the gate 78 to which the uncontrol value is to be set at timings before and after the sending clock, the automatic test pattern generation fails.

However, in the invention, even in the case where the inevitable change is propagated to the gate 78 at timings before and after the sending clock by the proper logic 74, the automatic test pattern can be generated by allocating the state of the don't care X as an activating state of the gate 78 with respect to the normal value and failure value at the sending time. In the invention, the automatic test pattern generation which failed in the conventional activating states which are fixed to the uncontrol value can be succeeded and the failure detection ratio can be improved.

FIG. 13B relates to the case where the failure propagating path itself is converged by a proper logic 82 of the network subsequent to a failure presumption point 80 and the inevitable change is propagated to a plurality of paths comprising gates 84 and 86. In this case, since an activating state of a gate 88 is subjected to the inevitable change at timings before and after the sending clock, the conventional automatic test pattern generation fixed to the uncontrol value fails. Even in the case where the inevitable change is propagated to the path onto which the activating state is set due to the convergence of the failure propagating path itself as mentioned above, according to the invention, since the don't care X is permitted as a normal value and a failure value at the sending time, the automatic test pattern generation by the failure propagation in FIG. 13B is also succeeded and the failure detection ratio can be improved.

Figure 14A:
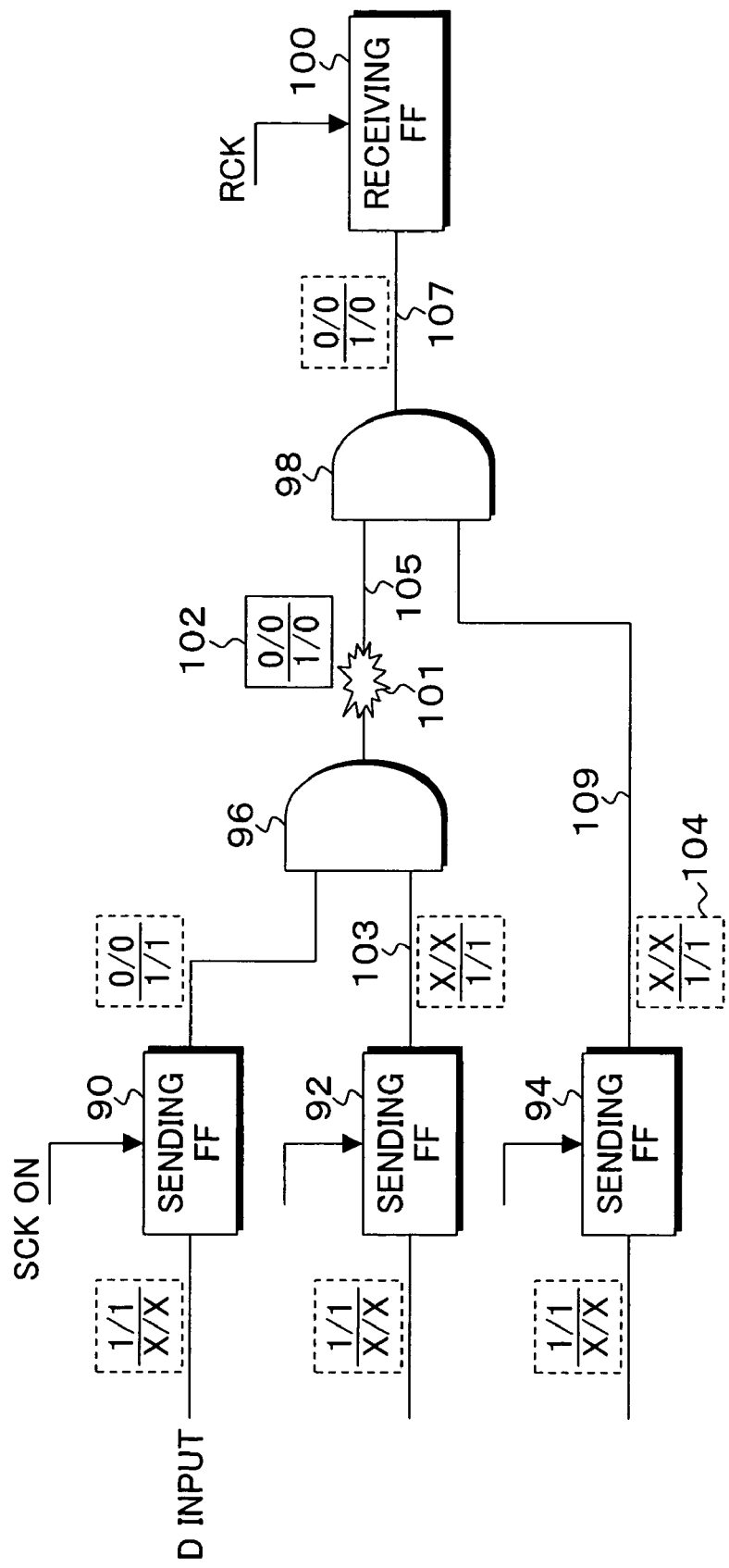

FIGS. 14A and 14B are explanatory diagrams of a failure propagation in the case where activating conditions due to a change from the don't care X to the uncontrol value 1 are admitted and a process for setting a path to which activating conditions after success in the test were given into a failure propagating path according to the invention.

FIG. 14A shows states in the automatic test pattern generation for the dynamic function test of the network in which two AND gates 96 and 98 are provided between sending FFs 90, 92, and 94 and a receiving FF 100. In this case, there is shown a state where the test succeeds by state allocation and conditional implication operation for selecting a failure presumption point 101 to an output of the AND gate 96, a failure exciting state 102 of the leading failure is set there, and propagating the failure exciting state 102 to the receiving FF 100. As will be obvious from the allocating state of the failure state and activating state in the case where the automatic test pattern generation in FIG. 14A succeeds, since the state of the don't care X is permitted at the sending time with respect to the activating state, it is necessary to allocate the activating states by a process similar to that of the conventional static function test with respect to each of the state 1 and state 0 with regard to the don't care X. However, in the invention, by using the state of the don't care X, they are combined to one state, the number of states to be allocated decreases. Since the number of states to be allocated is reduced, the occurrence of a contradiction decreases, so that the failure detection ratio can be improved.

Further, if the failure propagation of the failure exciting state 102 regarding the failure presumption point 101 succeeds and the test pattern is generated as shown in FIG. 14A, as for a network 109 for activating to propagate the failure exciting state 102 of the failure presumption point 101, by changing the don't care X at the sending time in an activating state 104 to the state 0, a test pattern generating process in which a network 105 to which the activating conditions are given is set to the failure propagating path can be executed as shown in FIG. 14B. In the automatic test pattern generation in FIG. 14A, 1st failure selection and an ATPG core unit process in steps S1 and S2 of the ATPG process in FIG. 5 are executed and if the ATPG success is determined in step S3, processes in steps S4 and S5 as an ATPG core unit process by the selection of the 2nd failure in the pattern compaction serving as a process in FIG. 14B are executed. A processing procedure for the test pattern generation by the 2nd failure selection in which the network 105 to which the activating conditions were given by the 1st failure selection in FIG. 14B is set to the failure propagating path is executed in the following manner.

(Procedure 1: Removal of Influence of the 1st Failure)

An influence by the failure points existing on the paths of the network 105 and a network 107 in FIG. 14A is removed and the state of the normal values=the failure values is obtained. Since the states of the network 107 in FIG. 14B show the states obtained after the conditional implication operation of a procedure 3, which will be explained hereinlater, the states of the normal value and the failure value at the receiving time differ. However, at this point of time, the states of the network 107 are aligned to the normal values=the failure values by the procedure 1.

(Procedure 2: 2nd Failure Excitation)

In the network 109 in FIG. 14B, the states of "0/0" are allocated to sending time states "X/X" of the state 104 in FIG. 14A and a leading delay failure (0-delay failure) is excited at a failure presumption point 111 by the allocation of a failure exciting state 106 having a change of "0→1" with respect to the failure values at the sending time and the receiving time.

(Procedure 3: Conditional Implication Operation)

The failure exciting state 106 excited in the network 109 is propagated to the network 109, network 107, and receiving FF 100.

In FIGS. 14A and 14B, it is assumed that the sending clock SCK is inputted to all of the sending FFs 90, 92, and 94, and a capture state (D input of the sending FF) serving as a state at the receiving time is shown. Specific examples of the automatic test pattern generating process for the dynamic function test of the invention by the process of the ATPG core unit in FIGS. 7A and 7B will now be described with reference to FIGS. 15 to 20.

Figure 15:
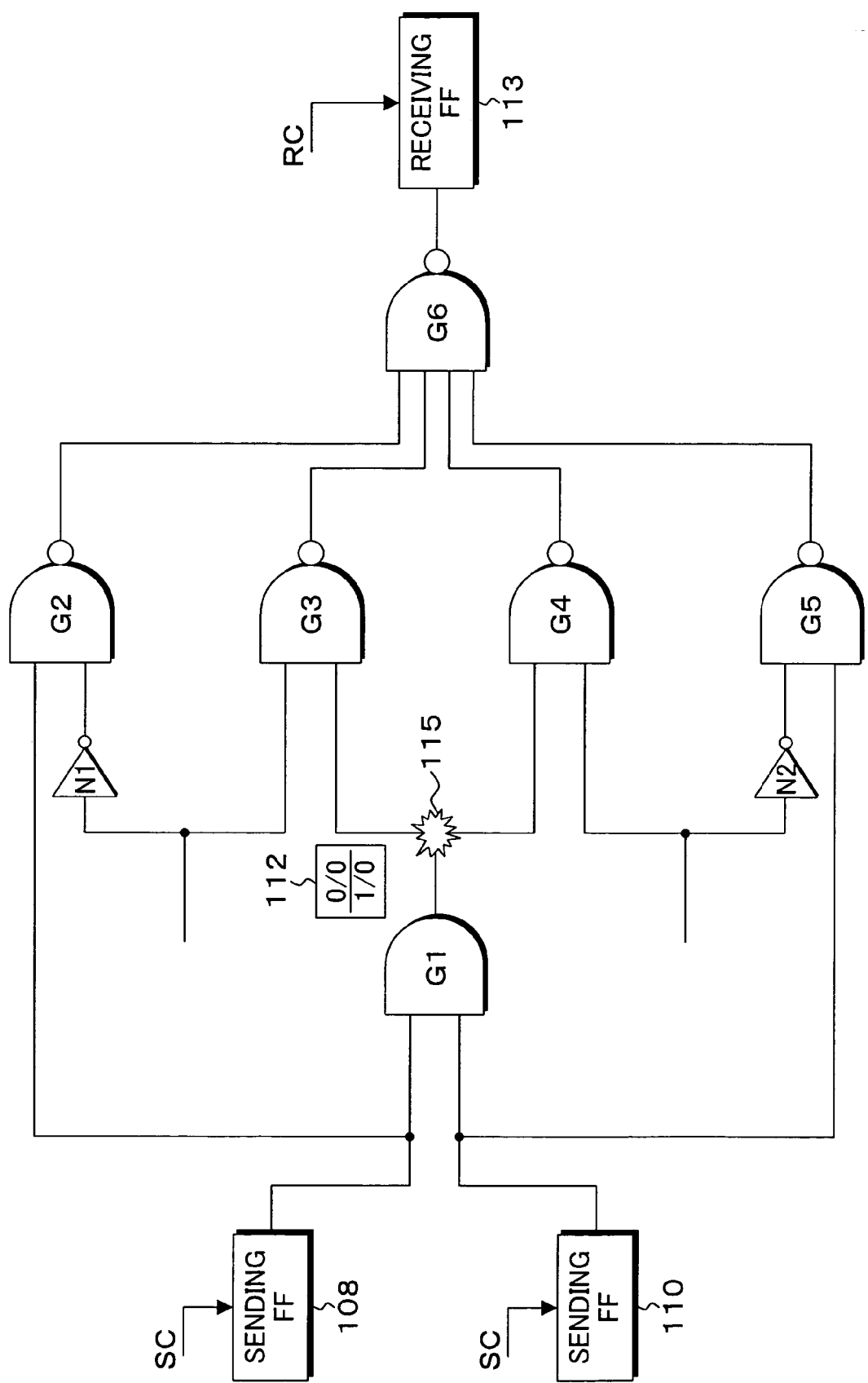
FIG. 15 is an explanatory diagram of a specific example of failure excitation in step S3 in FIGS. 7A and 7B.

FIG. 15 is an explanatory diagram of a specific example in the case where in the ATPG core unit process in FIGS. 7A and 7B, the marking process of narrowing is finished in step S1, the excitation is discriminated in step S2, and the failure excitation is executed in step S3.

FIG. 15 shows a case, as an example, where a network comprising an AND gate G1, inverters N1 and N2, and NAND gates G2 to G6 exists between sending FFs 108 and 110 and a receiving FF 113 and a failure presumption point 115 is selected to an output of the AND gate G1. In the following description, G1 to G6 are simply referred to as gates. In the target circuit, although the sending FFs are provided for inputs of the inverter N1 and gate G3 and input pins of the gate G4 and inverter N2, they are not shown here. In the failure excitation of FIG. 15, a failure exciting state 112 is allocated to the selected failure presumption point 115. The failure exciting state 112 excites a leading failure in which a normal value is set to the state 0 at the sending time and rises to the state 1 at the receiving time and a failure value is set to the state 0 at the sending time and set to the state 0 at the receiving time.

Figure 16:
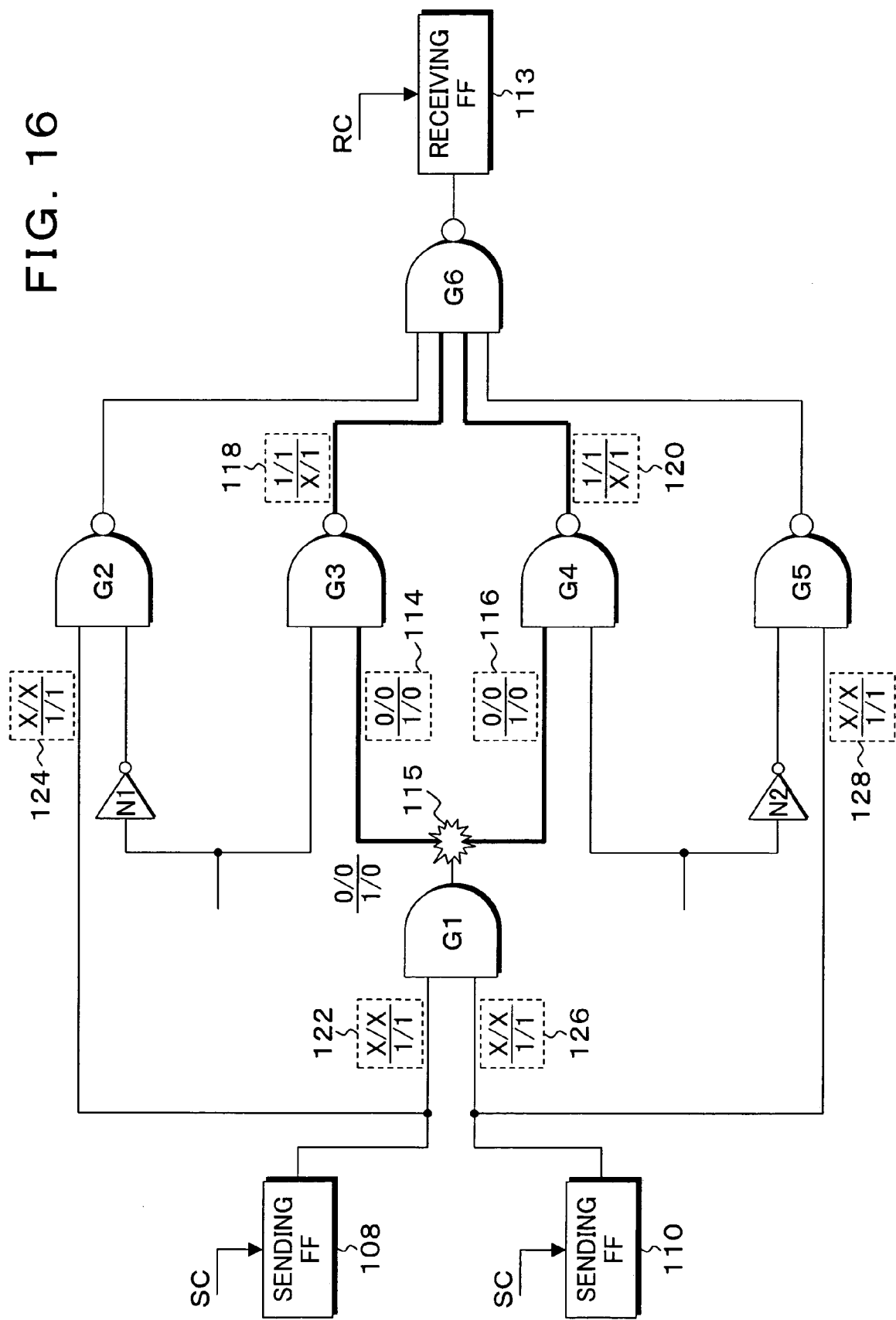
FIG. 16 is an explanatory diagram of a specific example of the conditional implication operation in step S4 in FIGS. 7A and 7B.

Subsequently, as shown in FIG. 16, the processing routine advances to step S4 in FIGS. 7A and 7B and the conditional implication operation is executed. According to the conditional implication operation, same states 114 and 116 as the failure exciting state are allocated to the input pins of the gates G3 and G4 before the failure presumption point 115 and states 118 and 120 are allocated to their output pins. States 122 and 126 are allocated to the input pin of the gate G1 locating behind the failure presumption point 111, thereby allocating same states 124 and 128 to the input pins of the gates G2 and G5, respectively.

Figure 17:
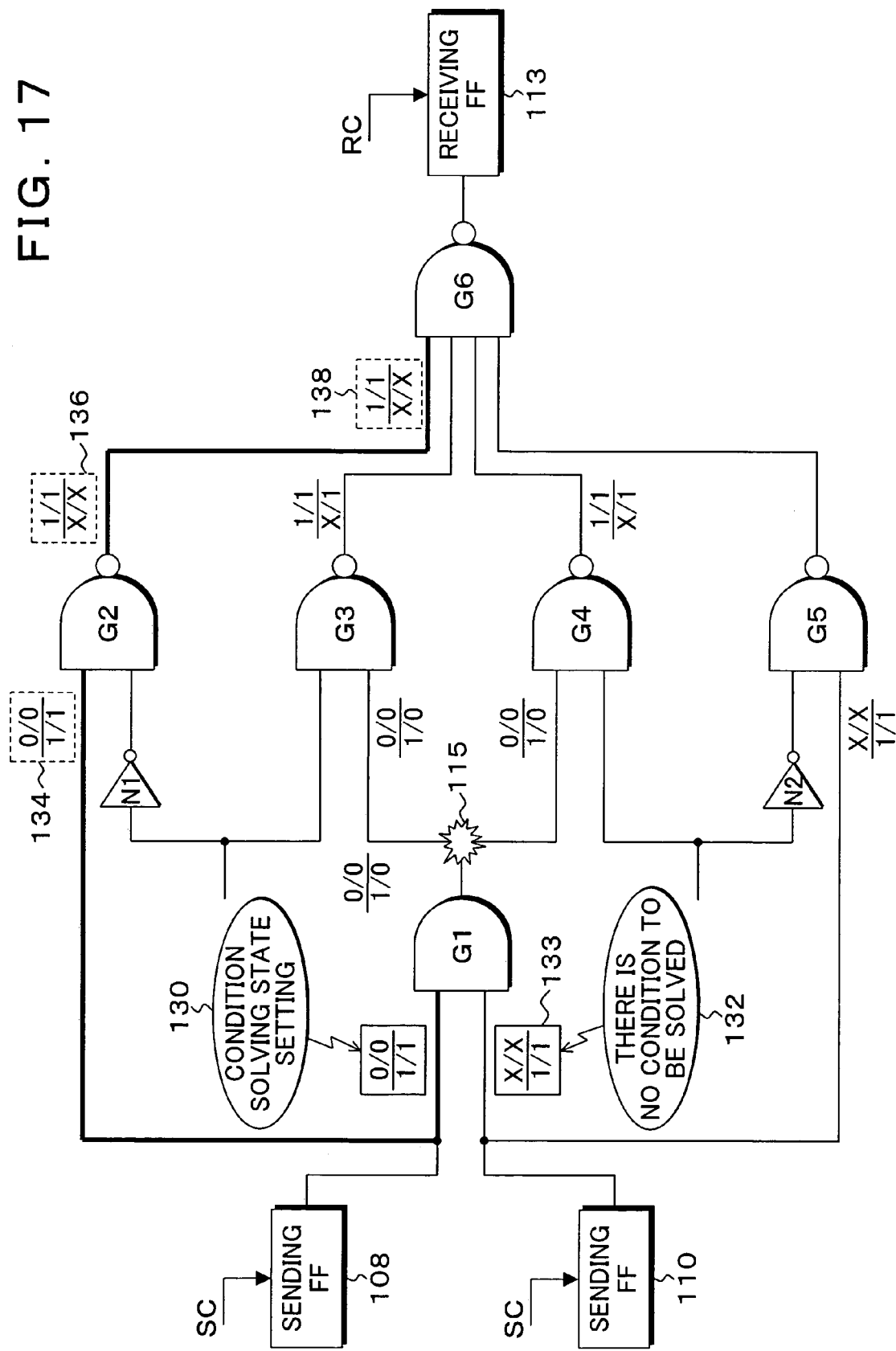
FIG. 17 is an explanatory diagram of a specific example in the case where the conditional implication operation in step S4 was executed via setting of a condition solving state in step S7 in FIGS. 7A and 7B.

FIG. 17 is an explanatory diagram in the case where after the conditional implication operation as shown in FIG. 16 was executed in step S4 in FIGS. 7A and 7B, the absence of a contradiction is discriminated in step S5, the conditions to be solved are discriminated in step S6, the processing routine advances to step S7, a condition solving state is set, subsequently, the processing routine is returned to step S4, and the conditional implication operation is executed.

That is, in FIG. 17, the conditions to be solved with respect to the states 122 and 126 of the two input pins of the gate G1 in FIG. 16 are discriminated and, in this case, with respect to the state of the input pin on the lower side, a condition solving state 130 is set by assuming that there is no condition to be solved (132), and a state 133 is allocated. After the setting of the condition solving state, states 134, 136, and 138 are allocated by executing the conditional implication operation in step S4 with respect to the input pin and output pin of the gate G2. Subsequently, since the absence of a contradiction is determined in step S5 in FIGS. 7A and 7B and there is no condition to be solved in step S6, a failure observation is made with respect to the receiving FF 113 in step S8. In this case, since the failure observation is impossible, step S9 follows and whether the failure which can be propagated exists or not is discriminated. In this case, since the failure which can be propagated exists, the failure propagating state is set in step S10. After that, the processing routine is returned to step S4 and the conditional implication operation is executed.

Figure 18:
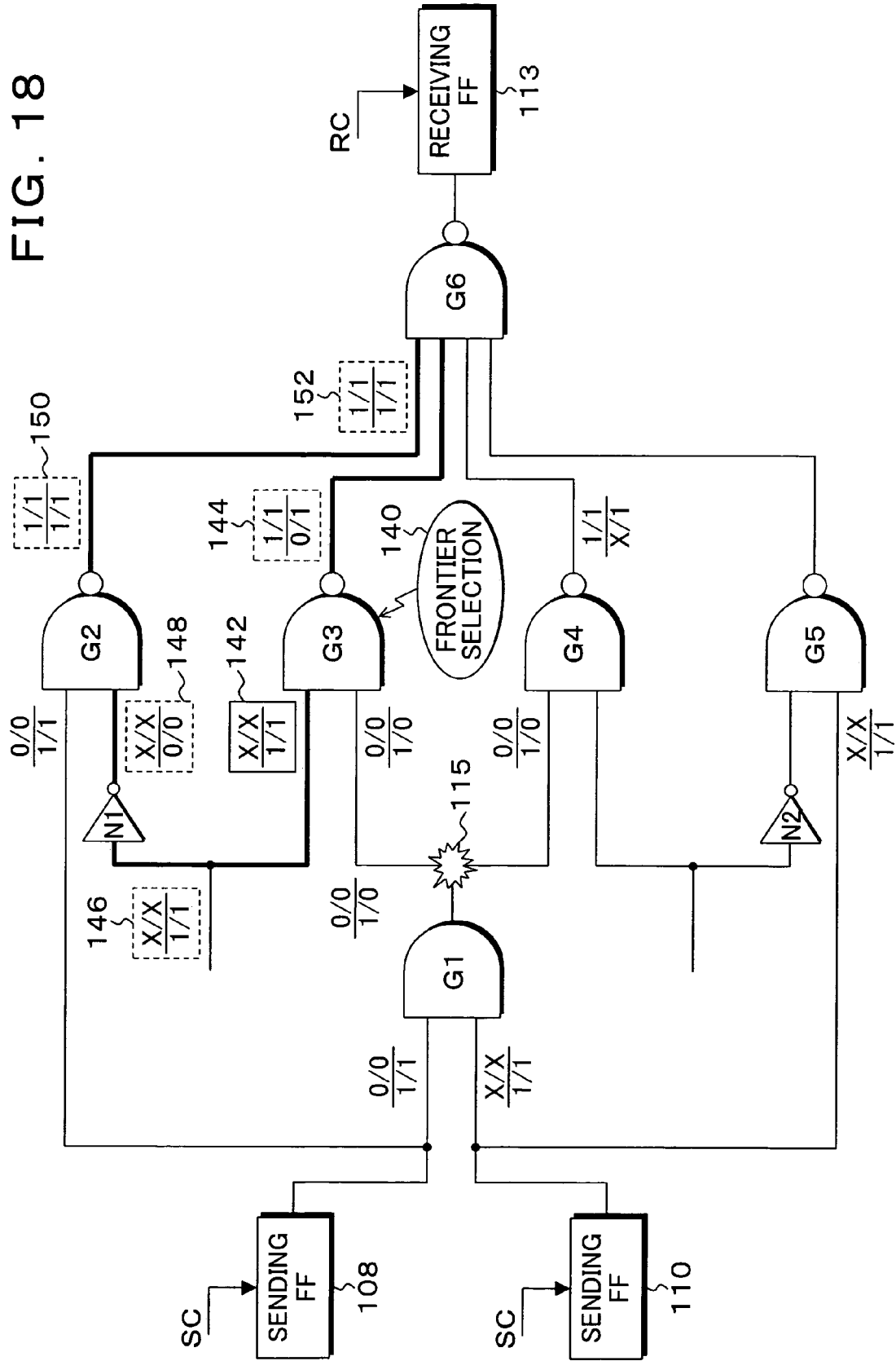
FIG. 18 is an explanatory diagram of a specific example in the case where the conditional implication operation in step S4 was executed via setting of a failure propagating state in step S10 in FIGS. 7A and 7B.
Figure 19:
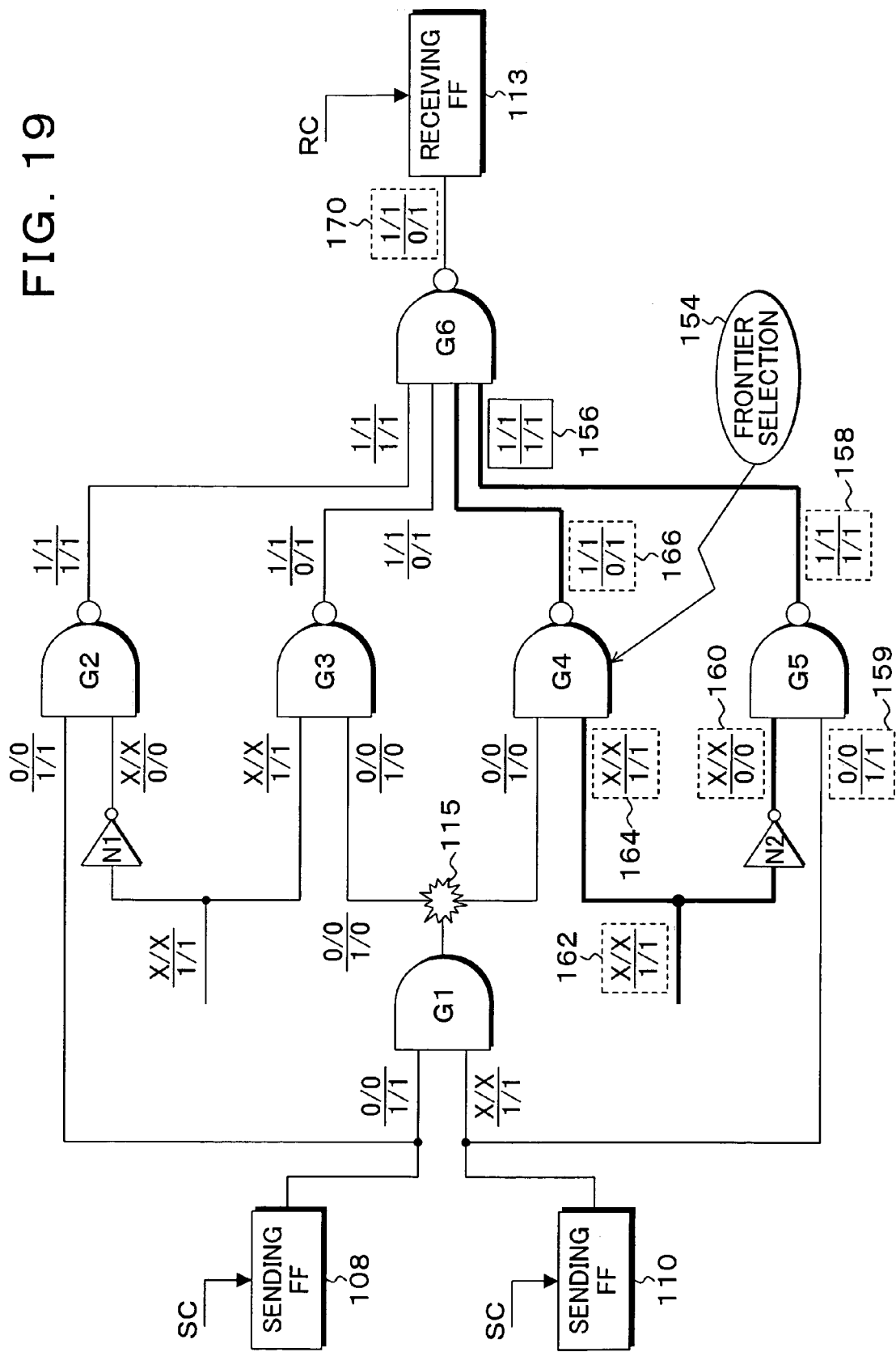
FIG. 19 is an explanatory diagram of a specific example in the case where the failure propagation is enabled to be observed and the test pattern generation succeeds in FIGS. 7A and 7B.

FIG. 18 shows a specific example of the setting of the failure propagating state in step S10 and the subsequent conditional implication operation in step S4. First, as a failure which can be propagated, between the gates G3 and G4, in this case, frontier selection 140 is made to the gate G3 and a state 142 of the input pin on the upper side of the gate G3 to which the failure state from the failure presumption point 111 is propagated is set.

In association with the setting of the state 142, a failure state 144 is propagated to the output pin of the gate G3. By the subsequent conditional implication operation in step S4 accompanied with the setting of the failure propagating state 142, a state 146 of the input gate of the inverter N1 and a state 148 of the output pin are allocated. Further, a state 150 of the output pin of the gate G2 is determined and, at the same time, a state 152 of the input pin of the gate G6 is allocated. Subsequently, the setting of the failure propagating state in step S10 and the conditional implication operation in step S4 are executed via steps S5, S6, S8, and S9 in FIGS. 7A and 7B. The setting of the failure propagating state and the conditional implication operation accompanied with the process of the second time are executed as shown in a specific example of FIG. 19. As a failure which can be propagated at the second time, it is sufficient to set the gate G4 to frontier selection 154 and execute the allocating operation of the same state as that in FIG. 8. In this example, however, when seeing from the failure presumption point 115 of the output pins of the gates G6 and G1, since they are vertically symmetrical, a failure propagating state 156 of the gate G6 can be exceptionally and immediately set.

By the core operation to the failure propagating state 156, a state 158 of the output pin of the gate G5, an input pin state 160 from the inverter N2, a state 162 of the input pin of the inverter N2, an input state 164 of the input pin of the gate G4, and further, a state 166 of the output pin of the gate G4 can be allocated in a lump. By the setting of the failure propagating state and the conditional implication operation as mentioned above, with respect to the input pin of the gate G6, the input pins other than the input pin from the gate G3 to which the failure state is inputted are set into the allocating state to which the failure can be propagated. A failure state 170 is propagated to the output pin of the gate G6.

Therefore, the failure observation can be made when the processing routine advances to step S8 via steps S5, S6, and S7 in FIGS. 7A and 7B. The processing routine advances to step S12 and the unmarking process of the narrowing is executed. In step S13, the conditional implication operation (which will be clearly explained hereinafter) of the state of the uncontrol "u" of the clock-off of the FF is executed. When the test succeeds, the automatic test pattern generating process is finished.

The ATPG core unit process in FIGS. 7A and 7B shown in FIGS. 15 to 19 is the ATPG core unit process by the 1st failure selection in steps S1 to S2 in FIG. 5. If it is determined in step S3 that the ATPG succeeds, the ATPG core unit process by the 2nd failure selection for pattern compaction is executed in steps S4 and S5. In this case, in the invention, as shown in FIG. 20, with respect to a state 172 to which the activating conditions of the gate G1 in FIG. 19 in which the test pattern generation by the 1st failure selection succeeds are given, a compaction failure excitation which allocates a failure state 172-1 changed to an opposite value 0 of the state 1 at the receiving time of the don't care X as a state at the sending time is executed. The failure propagation and the conditional implication operation accompanied with the compaction failure excitation are executed in accordance with a procedure similar to that in the case of FIG. 14B.

As mentioned above, by the allocation of the compaction failure exciting state 172-1, the condition which gives the activating condition in the successful test pattern generation can be set to the failure propagating path. Thus, processing efficiency of the test pattern generating process of the pattern compaction can be raised and the total number of generation test patterns can be reduced.

(3. Discrimination about Impossibility of Failure Excitation)

In the dynamic function test using the system clock in the invention, as shown in FIG. 8, the state change from the sending FFs 48 and 50 is caused by the inverting relation between the output states of the preparation FFs 40 and 42 which have been set before the sending clock is applied and the states of the input pins of the sending FFs 48 and 50 which are captured by the applied sending clock SCK. Therefore, to excite the transition failure such as leading failure or trailing failure, it is an indispensable condition that the system clock is applied to at least one sending FF to drive the network of the failure presumption point 56 to which the transition failure is presumed. In this instance, in the automatic test pattern generation by the dynamic function test which makes gate management similar to the conventional static function test, as for the conditional implication operation of the gates in the FFs, at the sending time, for example, even if "off"has been allocated to the sending clock of the sending FF 48, the conditional implication which is derived by the clock-off is limited to a holding state of the output of the sending FF 48 at the receiving time.

However, if both of the output states of the FFs at the sending time and the receiving time when the clock-off is allocated are equal to the don't care X, as an output of the receiving FF 54 at the receiving time, "from X to X" is merely conditional-implicated and updating of the states is never performed. That is, even in the case where the transition state of the network which is controlled only by the output of the sending FF indicates the impossibility of the failure excitation, according to the automatic test pattern generation that is equivalent to the static function test, it is impossible to immediately know that the excitation to the transition failure is impossible.

Therefore, in the automatic test pattern generation in which only the conditional implicating process which is equivalent to the conventional static function test is executed, after the state allocation for excitation was actually executed, at a point of time when the process reaches the FF of the clock-off, the contradiction is detected for the first time and it is determined that the pattern generation is unsuccessful. There is, consequently, a problem such that it takes a time for the process which is supposed to be wasteful.

Figure 21A:
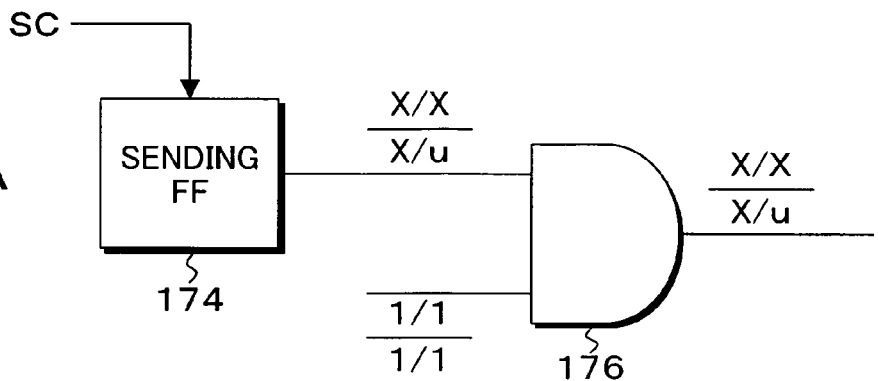
FIGS. 21A to 21C are explanatory diagrams of a discriminating process about impossibility of the failure excitation in clock off of a sending FF.

In the gate conditional implication of the dynamic function test of the invention, therefore, as shown in FIG. 21A, if the sending clock-off has been allocated to a sending FF 174 at the sending time, a condition such that the uncontrol "u" is allocated as a state of the failure value at the receiving time into the output pin of a gate 176 at the receiving time corresponding to the sending FF 174 is conditional-implicated. That is, with respect to the sending FF 174 received by the clock-off side in FIG. 21A, the state allocation in which the state of the failure value at the receiving time is set to the uncontrol "u" is made as a state of the output of the sending FF 174 and it is propagated.

Figure 21B:
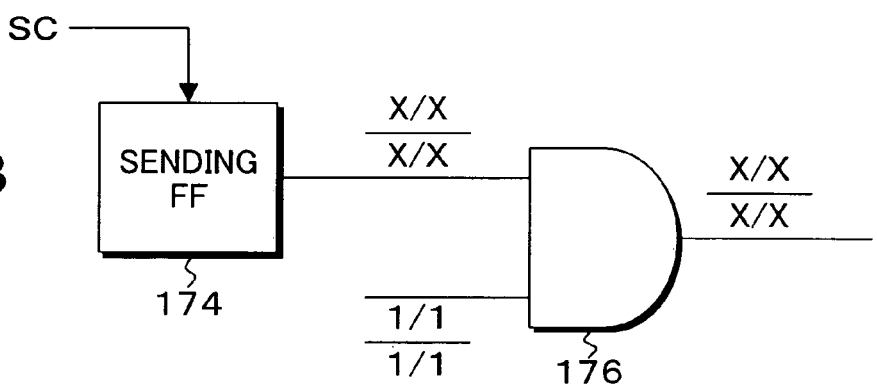
Figure 21C:
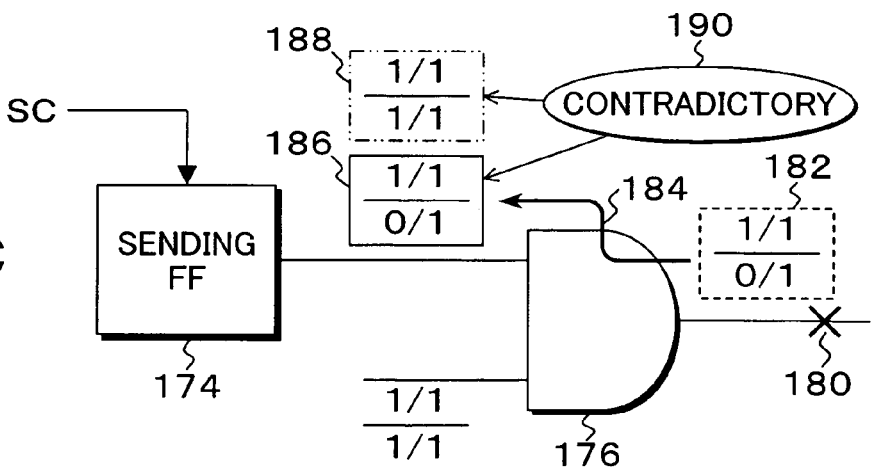

FIG. 21B shows a state of conditional implication process in the conventional static function test. In this case, the state of the output of the sending FF 174 is all set to the same don't care X by clock-off with respect to the sending time and the receiving time and it is propagated by giving the activating conditions to the gate 176. On the basis of such a conventional state allocation of the sending FF 174 of the clock-off as mentioned above, a failure exciting state 182 is allocated to a failure presumption point 180 as shown in FIG. 21C. If the propagated failure is confirmed in the receiving FF, the conditional implication operation to the backward circuits is executed. In the conditional implication operation, a state 186 is allocated as a state of the output pin of the sending FF 174 in correspondence to the failure exciting state 182 at the failure presumption point 180.

In this case, however, since the sending FF 174 is in the clock-off state, both of a normal value and a failure value of the state of the output are supposed to be the state 1 like a state 188 at each at the sending time and the receiving time. Such a state is contradictory to the state 188. At this point of time, it is determined that the failure excitation by the failure exciting state 182 at the failure presumption point 180 is impossible. Therefore, a long processing time is necessary for the discrimination about the impossibility of the failure excitation in the output state of the sending FF of the clock-off due to the conditional implication operation of the static function test as shown in FIGS. 21B and 21C. On the other hand, according to the invention, as shown in FIG. 21A, by allocating the state of the uncontrol "u" as a failure value at the receiving time of the output of the sending FF 174 and propagating it, if the failure value at the receiving time of the state observed by the receiving FF is the uncontrol "u", the failure excitation to the failure presumption point on the failure propagating path from the sending FF of the clock-off is regarded to be impossible and such a failure is removed from the targets. Thus, the automatic test pattern generation to the wasteful target is made unnecessary and a high speed of the whole automatic test pattern generating process can be realized.

(4. Discrimination about Undetectable Failure)

In the invention, in the case of handling the transition failure serving as a target of the dynamic function test, since the possibility and impossibility of the excited failure are defined as a relation between the states at at least two times at the sending time and the receiving time, it is impossible to use a concept of an equivalent failure that is equal to a degenerate failure which is handled in the static function test. For example, each 0-degenerate failure which is presumed to the input pin and the output pin in the AND gate is the equivalent failure because they have the same condition such that the states of all of the input pins and output pins are set to 1 with respect to the failure propagation.

However, in the transition failure as a target of the invention, for example, in the AND gate having two inputs serving as a network A and a network B, when considering the detection of a 0-transition failure which is presumed to the network A, that is, the failure which is excited as "from 0 to 0" when the state of the network A changes from 0 to 1, conditions that are indispensable in this AND gate are as follows: a change in normal value at timings from the sending time to the receiving time of the network A is "from 0 to 1" and a change in failure value is "from 0 to 0"; and in the network B, a change in normal value at timings from the sending time to the receiving time is "from X to 1" and a change in failure value is "from X to 1".

Similarly, when considering the detection of a 0-transition failure which is presumed to the network B, a change in normal value at timings from the sending time to the receiving time of the network A is "from X to 1" and, similarly, a change in failure value is also "from X to 1", and with respect to the network B, a change in normal value at timings from the sending time to the receiving time is "from 0 to 1" and a change in failure value is "from 0 to 0". Therefore, since the states before the change, that is, the indispensable conditions at the sending time differ, the 0-transition failures which are presumed to the network A and the network B are not the equivalent failures. Therefore, in the transition failure serving as a target of the dynamic function test of the invention, since the equivalent failure that is equal to the well-known degenerate failure cannot be obtained, if no countermeasure is taken, the automatic test pattern generation has to be performed to all failures as targets, or only an excluding process such that only in the case where the transition failure in which the automatic test pattern generation failed does not have a fan-out and is presumed to the input and output pins of an inverter having one input and one output or a gate such as a buffer or the like, the failure is excluded as an undetectable failure from the targets can be executed.

Figure 22:
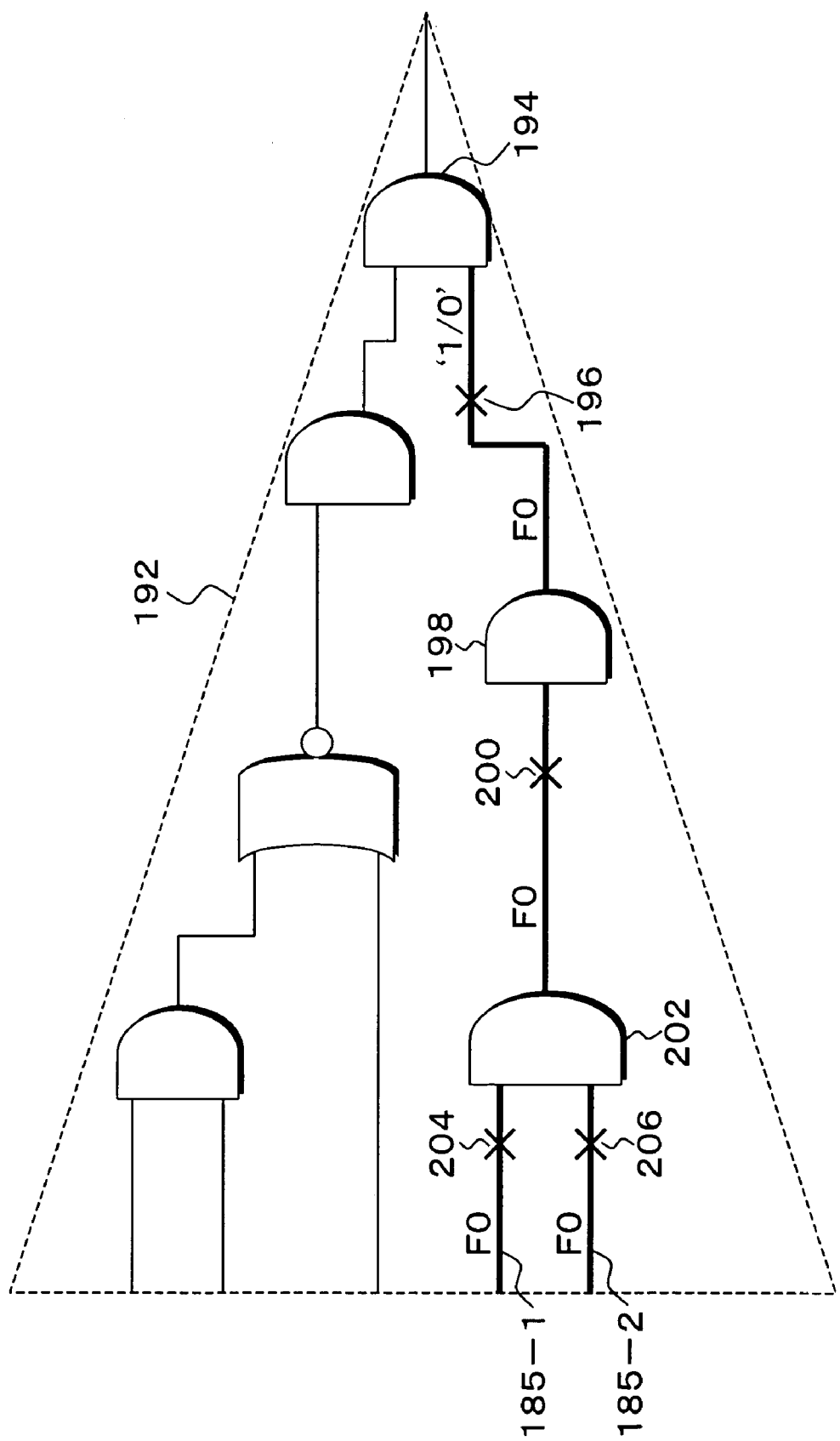
FIG. 22 is an explanatory diagram of the discriminating process about impossibility of the failure based on a failure in which the automatic test pattern generation failed.

Therefore, in the automatic test pattern generation in the dynamic function test of the invention, a very long processing time is required as compared with that in the case based on the static function test. In the invention, therefore, as shown in FIG. 22, for example, when the automatic test pattern generation to the failure excitation of a failure presumption point 196 fails, among failure presumption points 200, 204, and 206 in the network from the network in which the failure presumption point 196 has been selected to branches 185-1 and 185-2 in a fan-out free area 192, between the failure and the failed failure presumption point 196, the failures which satisfy the following conditions (condition 1) the inverting relation with the failed failure is equal, and (condition 2) the failure value is equal to the normal value of the gate is assumed to be the undetectable failure, a mark F0 is given, and this marked undetectable failure is excluded from the targets of the automatic test pattern generation. The fan-out free area 192 to discriminate the undetectable failure denotes an area where the circuit is converged to the failed failure presumption point 196 in which the automatic test pattern generation failed and does not diverge.

Figure 23:
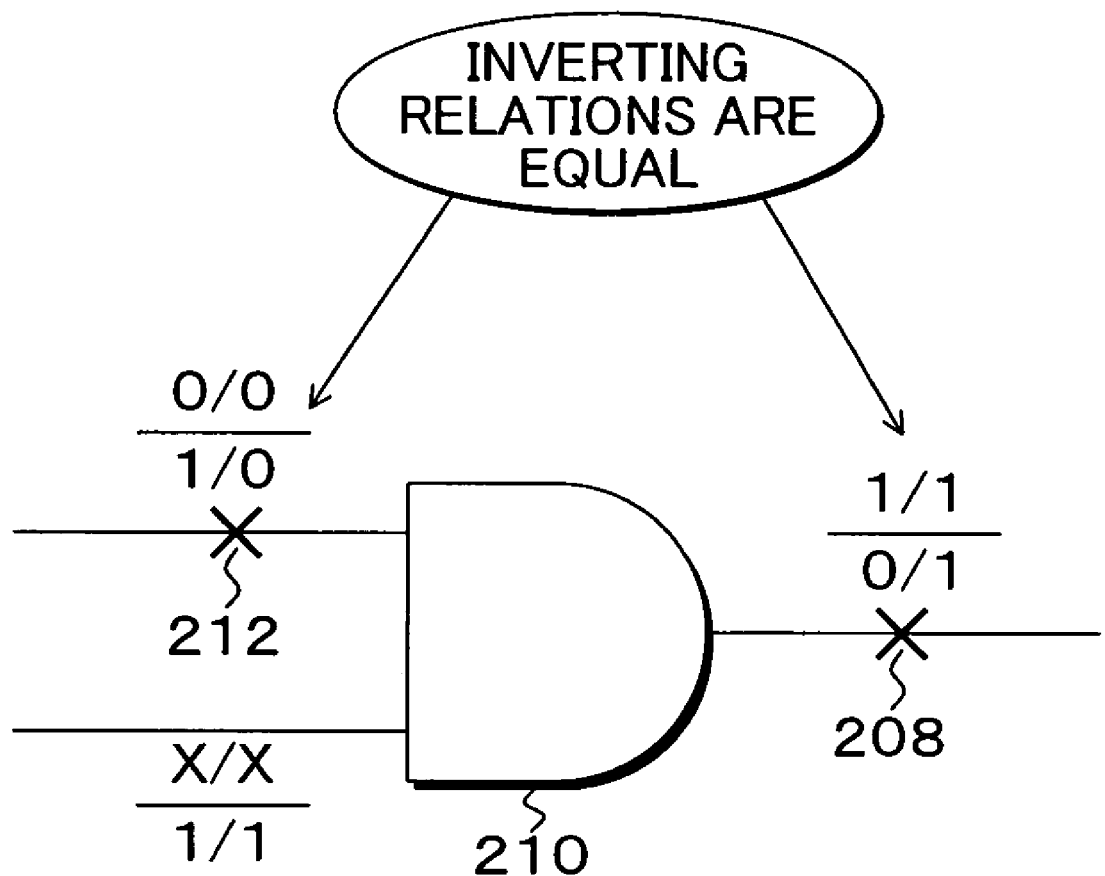
FIG. 23 is an explanatory diagram of discriminating conditions in FIG. 22.

FIG. 23 is an explanatory diagram of conditions 1 and 2 for discriminating the undetectable failure. In FIG. 23, when the automatic test pattern generation by the failure excitation of a failure presumption point 208 of an output of a gate 210 fails, since the inverting relation of the failure exciting state of a failure presumption point 212 of an input of the gate 210 is equal to that of the state of the failure presumption point 208 which failed as a condition 1, the condition 1 is satisfied. Since the failure value 0 of the failure presumption point 212 at the receiving time is equal to the normal value 0 of the AND gate 210, the condition 2 is satisfied. Therefore, with respect to the failure presumption point 212, such a failure is assumed to be the undetectable failure and the mark F0 indicative of the failure is given.

Figure 24A:
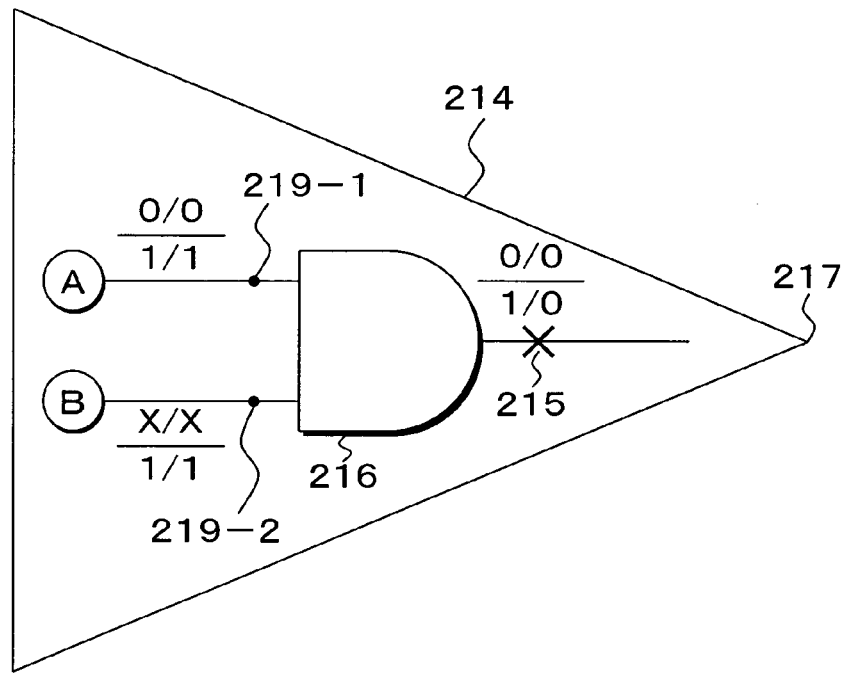
FIGS. 24A and 24B are explanatory diagrams in the case where the automatic test pattern generation fails with respect to a leading failure in the case of using an AND gate as an example.
Figure 24B:
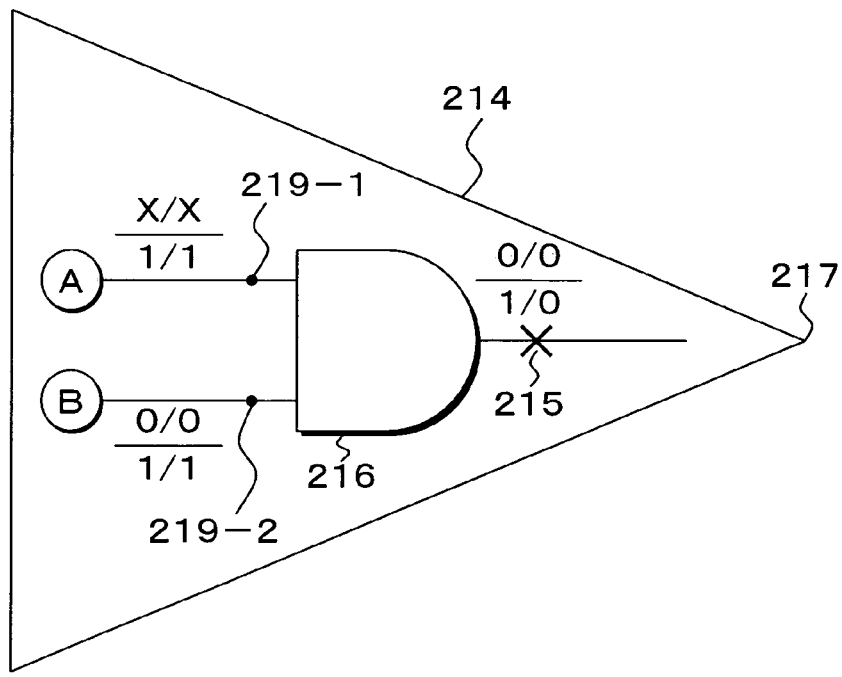

FIGS. 24A and 24B are explanatory diagrams of discriminating conditions of the undetectable failure in an AND gate 216 having two inputs comprising the networks A and B.

FIG. 24A shows the case where a failure presumption point 215 is selected to an output pin of the AND gate 216 of a fan-out free area 214 and the failure exciting state is allocated. The state setting for successfully executing the automatic test pattern generation in the networks A and B in this case is either the state of FIG. 24A or the state of FIG. 24B. Therefore, the automatic test pattern generation in the allocation of the failure exciting state of the failure presumption point 215 of the output pin of the AND gate 216 fails in either the case where the state allocation of the input gate in FIG. 24A or 24B fails or the case where an activating path from a stem 127 to a fan-out destination does not exist.

The state of the input in which the allocation failed is the failure exciting state in which the failure value at the receiving time is equal to the normal value 0 of the AND gate 216 among the failure states which are presumed to failure presumption points 219-1 and 219-2 of the networks A and B and its inverting relation is equal to that of the failure exciting state of the failed failure presumption point 215. Therefore, with respect to the failure presumption points 219-1 and 219-2 of the networks A and B, it is also impossible to detect the failure which satisfies the conditions 1 and 2. When the automatic test pattern generation to a certain failure exciting state fails, the failure presumption points which satisfy the conditions 1 and 2 are discriminated with respect to a range from the branch to the stem in the fan-out free area 214, and the mark F0 indicative of the undetectable failure is given, and the failure presumption point to which the mark F0 has been added is excluded from the targets of the automatic test pattern, thereby preventing the wasteful automatic test pattern generation from being executed and realizing a high processing speed.

(5. Path Cut Countermeasure)

Figure 25:
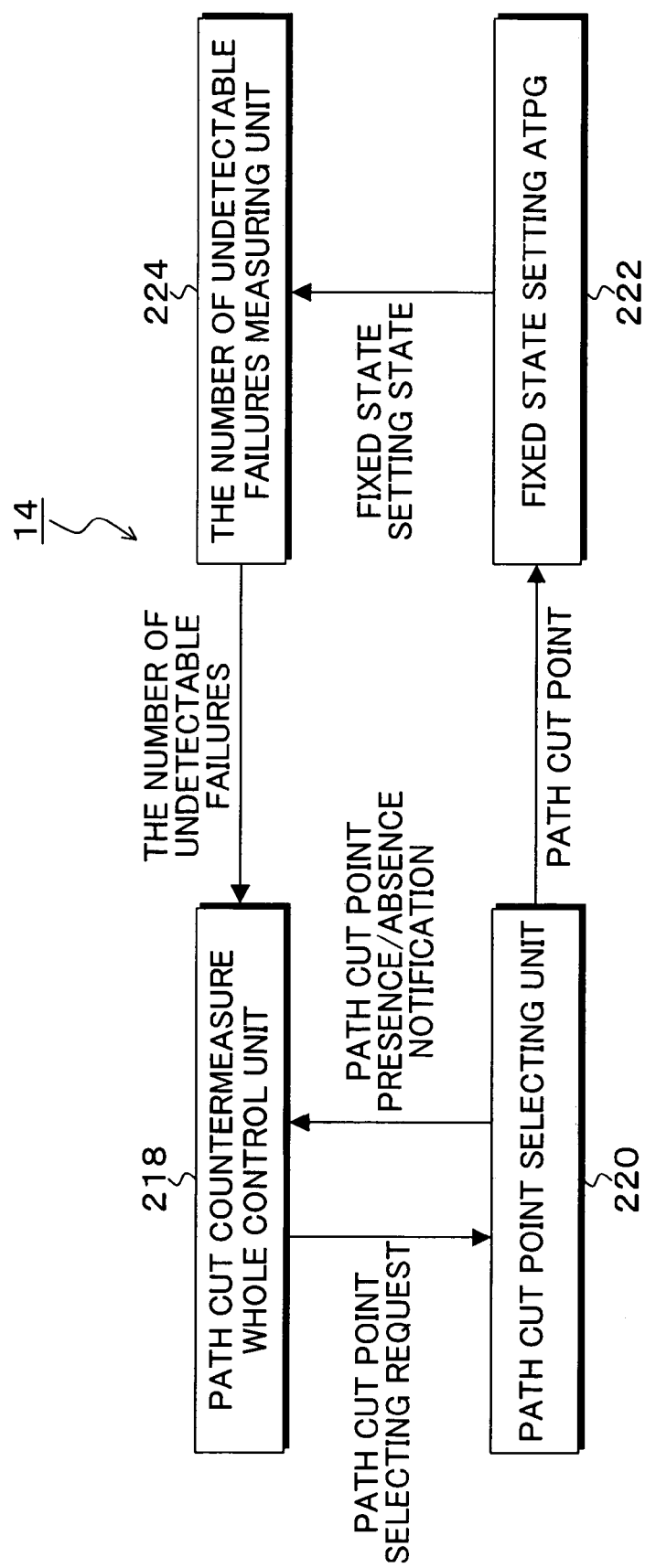
FIG. 25 is a block diagram of a path cut countermeasure unit in FIG. 1.

FIG. 25 is a block diagram of the path cut countermeasure unit 14 in the integrated circuit testing apparatus in FIG. 1. The path cut countermeasure unit 14 is constructed by: a path cut countermeasure whole control unit 218; a path cut point selecting unit 220; a fixed state setting ATPG unit 222; and a unit 224 for measuring the number of undetectable failures. By such a construction, in the gate input which drives the path cut point, the path cut countermeasure unit 14 gives the control value of the gate at the sending time and the receiving time and fixes the gate or gives the uncontrol value to all gates at the sending time and the receiving time, thereby allocating the state of the path cut point from the state at the receiving time serving as a fixed state to 0 at the sending time or from 1 at the sending time to 1 at the receiving time and fixing it. The reasons why such a path cut countermeasure is needed are as follows. Hitherto, a loop circuit has been known as a path which needs the path cut and many methods for path cut regarding the loop circuit have been proposed.

Figure 26:
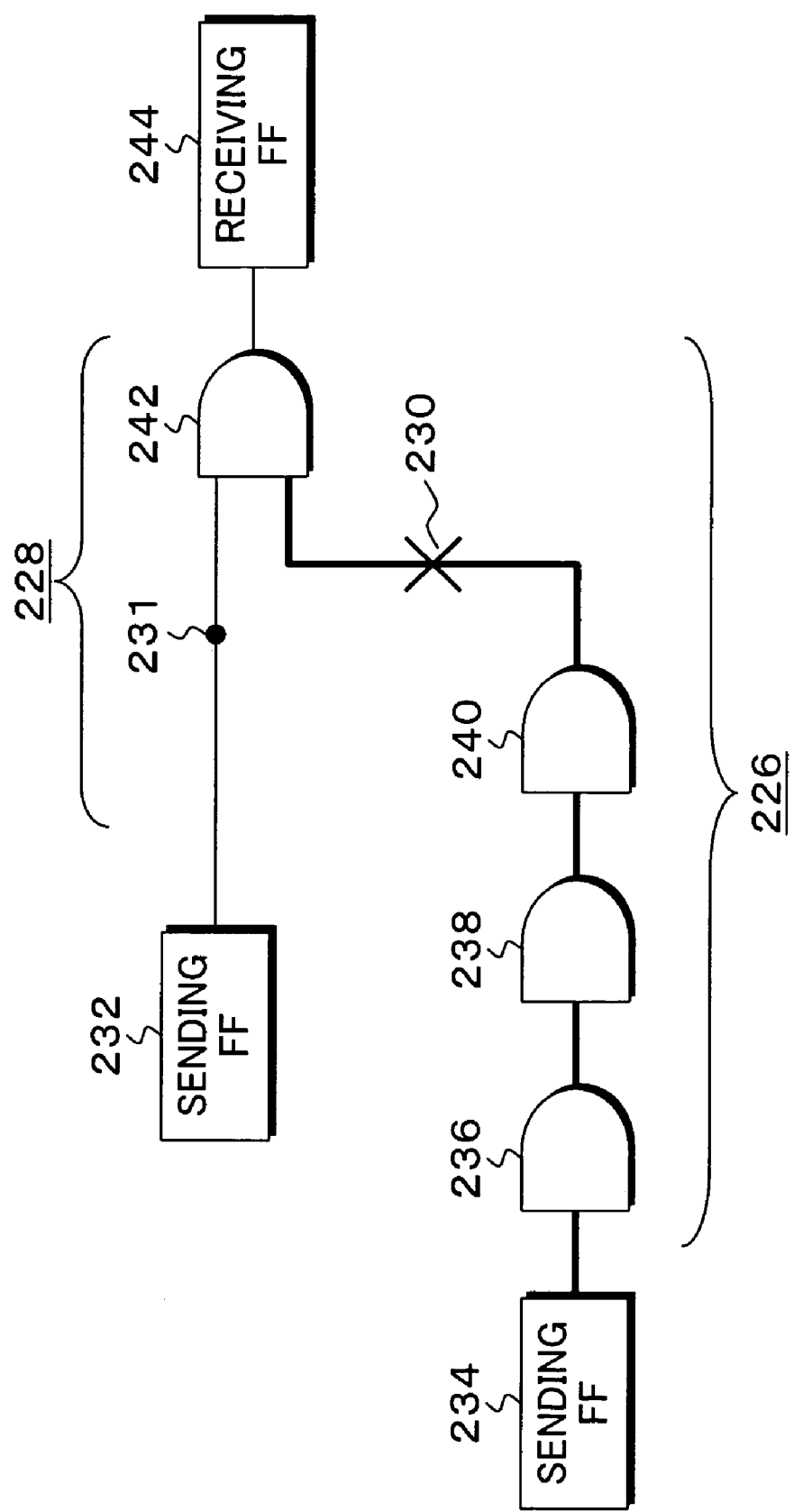
FIG. 26 is an explanatory diagram of a path cut countermeasure according to the invention in which $n\pi$ paths are set to targets.

On the other hand, as a path in which it is necessary to perform the path cut in the dynamic function test, besides the loop circuit, an nτ path 226 shown in FIG. 26 which does not guarantee the transfer in a 1-system cycle (1τ) exists. The nτ path 226 is a path which is validated only upon activation of a system such as setting or the like by an operation status register or upon debugging. Moreover, the nτ path 226 which needs the path cut in the dynamic function test does not construct a loop and is not a fixed path cut. It is necessary to cut the path in accordance with requirements for the timings such as sending time and receiving time.

In the path cut which is applied to the static function test, since the timing for cutting the target path has a sufficient surplus for the timing for applying the clock, there is no need to consider with respect to a hazard in which a disturbance-like change passes the network. On the other hand, in the dynamic function test, since the sending clock and the receiving clock are applied at a high speed, if the hazard occurs in the path serving as a cutting target, there is a risk such that an integrated circuit receives the hazard and the clock causes the integrated circuit to erroneously operate at the time of testing. It is, therefore, necessary to perform the path cut in consideration of suppression of the hazard.

As a path cut to a path such as an nτ path 226 in FIG. 26 in which the transfer in one cycle of the system clock which is peculiar to the dynamic function test is not guaranteed, if the path cut is performed by a method that is equivalent to the cutting of the conventional loop path, since the path is regarded as a loop in spite of the fact that it is not actually the loop and the loop path itself cannot be controlled, with respect to multi-input gates among gates constructing the path which is regarded as a loop, the control value of the gate is set to the input on the side which is not the path regarded as a loop. In a gate 242 on the connection destination side from a control point 231 and a path cut point 230 where the state setting for fixing the nτ path 226 serving as a cutting target at this time, it is inevitable that a failure which cannot be detected due to the propagation of the fixed state given to the path cut point 230 and the control point 231 occurs.

However, in the path cut which is performed to the conventional loop circuit as a target, since the state of the path cut point 230 has to be fixed by the control value of the gate 242, there is a problem such that in the dynamic function test, the selection of the cut point and the state selection for fixing the cut point are made in a non-optimum state. In the path cut of the static function test, since there is a surplus for the timing when the state is fixed at the cut point and the timing for applying the clock, in the case of fixing the control value of the gate to the path cut point and performing the path cut, there is no need to consider the hazard which occurs in the cutting target path. In the dynamic function test, however, there is a possibility that the control value is given so as to independently cut the path at the sending time and the receiving time. If such a transfer of the control value exists, there is a possibility that a hazard occurs in the target path of the path cut in dependence on the timing when the control value reaches the path cut point.

Figure 27A:
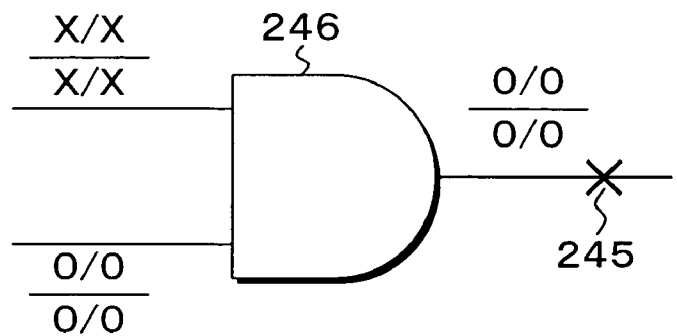
FIGS. 27A and 27B are explanatory diagrams of two path cut countermeasures according to the invention.
Figure 27B:
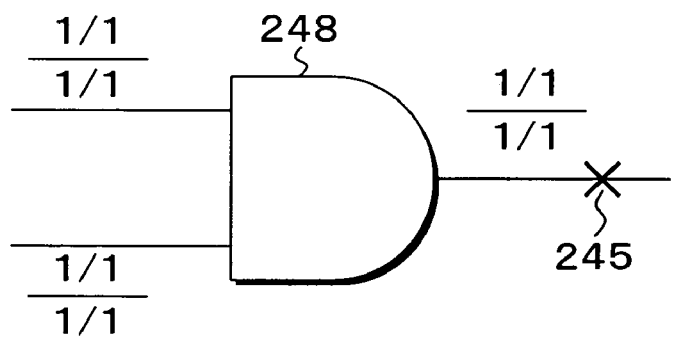

To prevent it, according to the invention, one of two path cut methods in FIGS. 27A and 27B is selected. FIG. 27A shows the same method as the path cut which is performed to the loop circuit as a target. In an input pin of an AND gate 246 to drive a path cut point 245, the control value 0 is given at the sending time and the receiving time, the state is fixed, and the fixed state in which the state of the path cut point 245 is set from the state 0 at the sending time to the state 0 at the receiving time is allocated and fixed.

FIG. 27B shows a path cut countermeasure newly added according to the invention. According to this path cut countermeasure, in a gate input of an AND gate 248 to drive the path cut point 245, the uncontrol value 1 of the AND gate 248 is given to all gate inputs at the sending time and the receiving time, and the state of the path cut point 245 is allocated from 1 at the sending time to 1 at the receiving time and fixed.

The path cut countermeasure in FIG. 27B is taken by paying attention to a condition such that in the dynamic function test, it is sufficient that the states of the path cut point at the sending time and the receiving time have the same value. If the fixed state is allocated to the path cut point of a certain path as a path cut countermeasure of the invention, a degree of freedom to the state selection of the automatic test pattern generation is reduced. Therefore, it means that the undetectable failure occurs. At this time, the following two selection cases exist: the case of allocating "from 0 to 0" between the sending time and the receiving time to the fixed state to one certain path cut point and the case of allocating "from 1 to 1".

Figure 28:
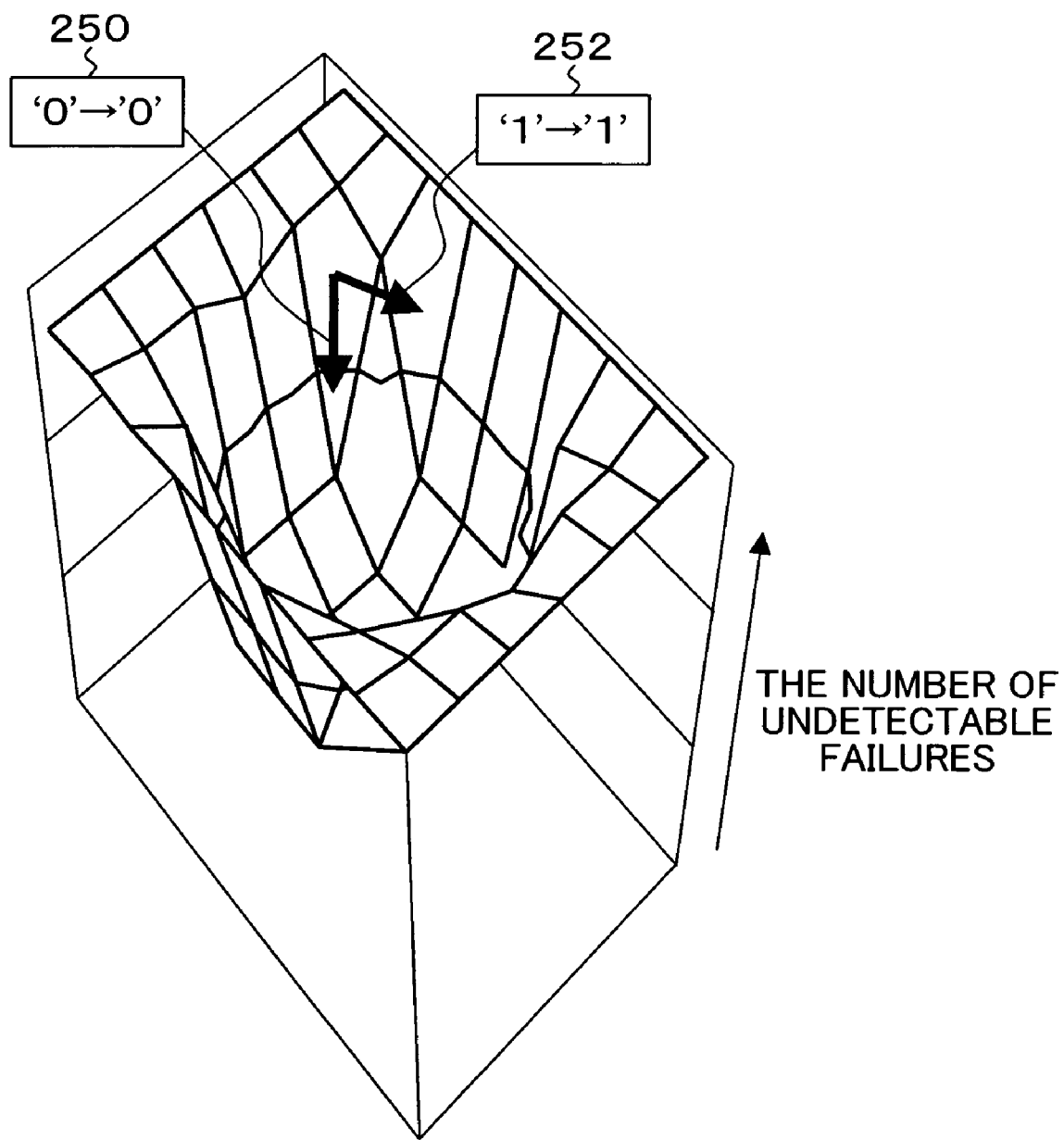
FIG. 28 is an explanatory diagram of a hyperplane in which the number of undetectable failures in a discrete space which is used for selection of the fixed state "from 1 to 1" or "from 0 to 0" that is set into a path cut point is shown as a height.

In the invention, therefore, the fixed state "from 0 to 0" or "from 1 to 1" is selected as a fixed state of the path cut point in order to minimize the occurrence of the undetectable failure. Specifically speaking, when the fixed state is allocated to the selected path cut point, with respect to each of the case of the fixed state "from 0 to 0" and the fixed state "from 1 to 1", the number of undetectable failures is measured by the fixed state setting ATPG unit 222 in FIG. 25 and a hyperplane as shown in FIG. 28 in which the number of undetectable failures in a discrete space where "from 0 to 0" and "from 1 to 1" are used as elements is increased is considered. In the hyperplane obtained, by measuring the number of undetectable failures, a fixed state in which the number of undetectable failures decreases so as to fall an oblique surface of the hyperplane, for example, the fixed state "from 0 to 0" in the case of FIG. 28 is selected and allocated to the path cut point, thereby minimizing the number of undetectable failures which occur and preventing a reduction in failure detection ratio.

Figure 29:
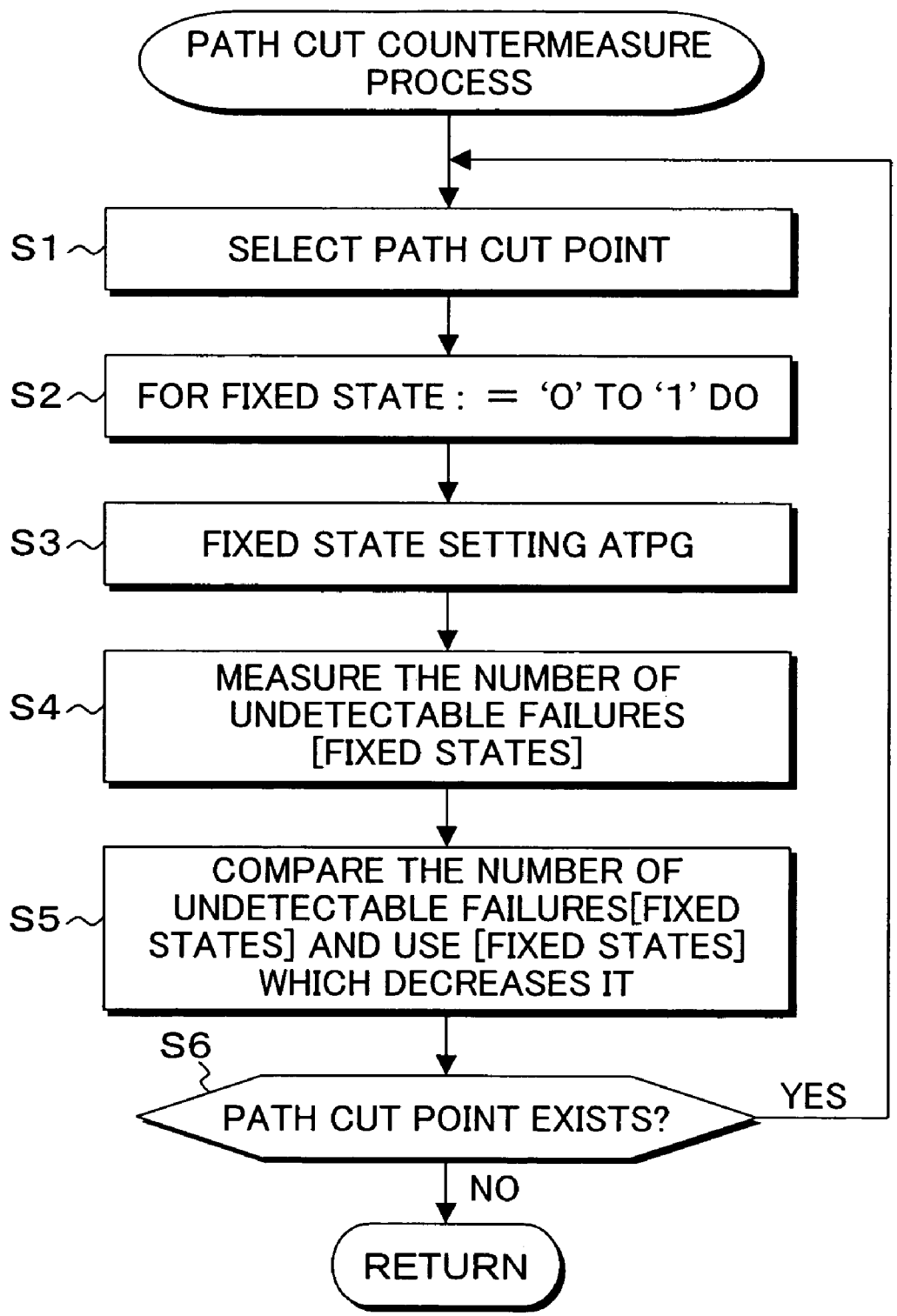
FIG. 29 is a flowchart for a path cut countermeasure process according to FIGS. 27A and 27B.

FIG. 29 is a flowchart for the path cut countermeasure process according to FIGS. 27A and 27B and comprises the following processing procedure.

Step S1: One path cut point is arbitrarily selected from a set of path cut points according to a user instruction.

Step S2: Both 0 and 1 are tried as a fixed state which is given to the path cut point with respect to the path cut point selected in step S1.

Step S3: A network state which satisfies the fixed state is obtained by the automatic test pattern generating process with respect to the cut point set in step S2.

Step S4: In the network state obtained by the automatic test pattern generating process in step S3, the number of failures which are measured as being undetectable is stored as the number of undetectable failures "fixed state".

Step S5: The number of undetectable failures [0] and the number of undetectable failures [1] regarding both of the fixed states (0, 1) which are obtained by the operations in steps S2 to S4 and have been set to the path cut point are compared. The state in which the number of undetectable failures is smaller is used as a fixed state to be set to the path cut point selected in step S1.

Step S6: If the path cut points which are not processed in steps S1 to S5 exist among the set of path cut points according to the user instruction, the processing routine is returned to step S1.

Figures 30A, 30B:
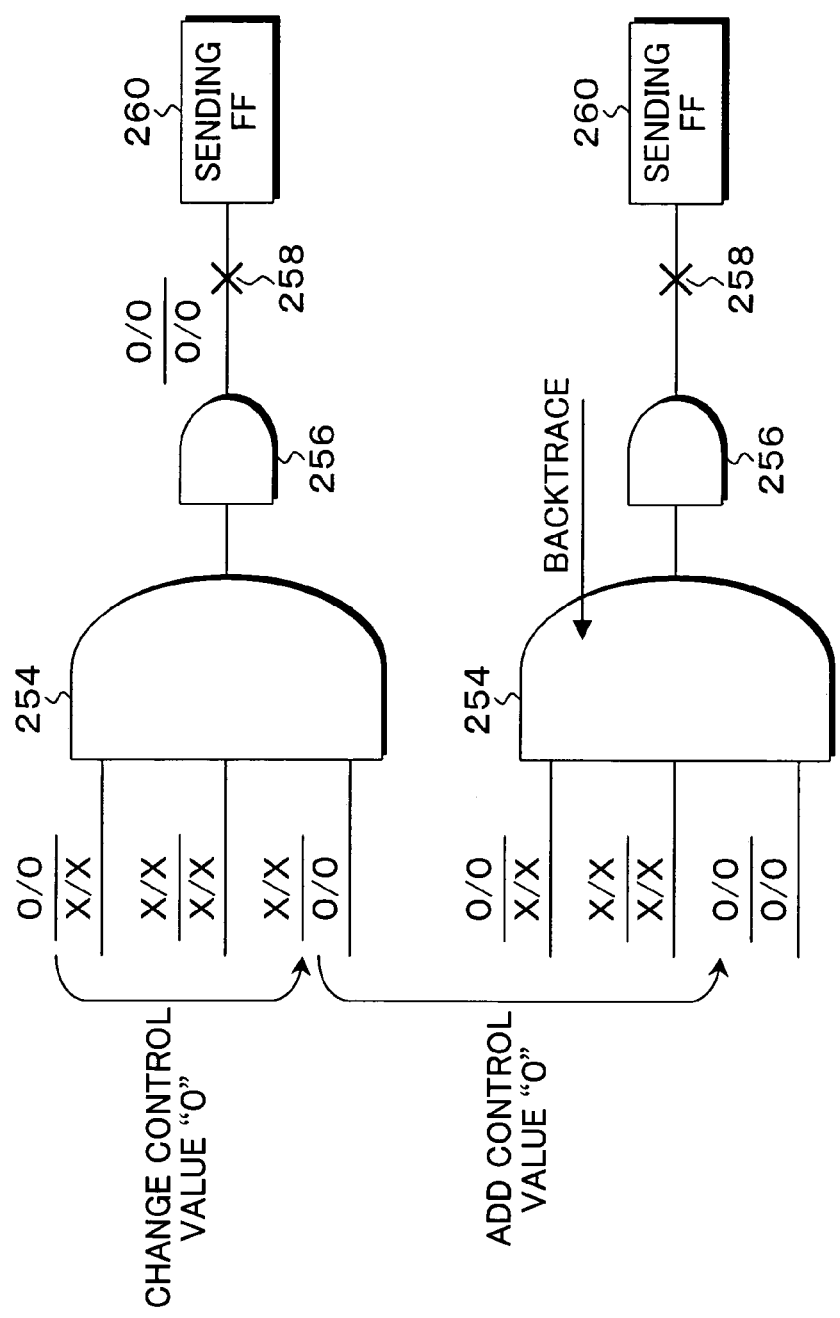
FIGS. 30A and 30B are explanatory diagrams of a hazard-freeing process which is executed when the allocation of the fixed state at the path cut point succeeds.

FIGS. 30A and 30B are explanatory diagrams of a hazard-freeing process which is executed when the allocation of the fixed state of the path cut point succeeds. In FIG. 30A, by the path cut countermeasure in FIG. 27A, with respect to an input pin 254-1 among three input pins 254-1 to 254-3 of an AND gate 254, the control value 0 of the AND gate 254 at the sending time and the receiving time is given and the state is fixed. Thus, the allocation of the fixed state which changes from the state 0 at the sending time to the state 0 at the receiving time succeeds at a path cut point 258.

However, in this case, in the AND gate 254 on the driver side, the control value 0 of the input pin 254-1 at the sending time is transferred to the control value 0 of the input pin 254-3 at the receiving time. Therefore, at the path cut point 258, although its change is statically "from 0 to 0", in another input serving as a don't care X, there is a possibility of occurrence of a hazard.

In the invention, therefore, as shown in FIGS. 30A and 30B, the back trace is performed when the allocation of the fixed state at the path cut point 258 succeeds, and if there is a transfer of the control value 0 from the sending time to the receiving time like an AND gate 254, also with respect to the input pin 254-3 to which the control value 0 is given at the receiving time, by allocating the don't care X to the control value 0 at the sending time, a hazard-free fixed state is formed to the path cut point 258.

(6. Narrowing Process)

Figure 31:
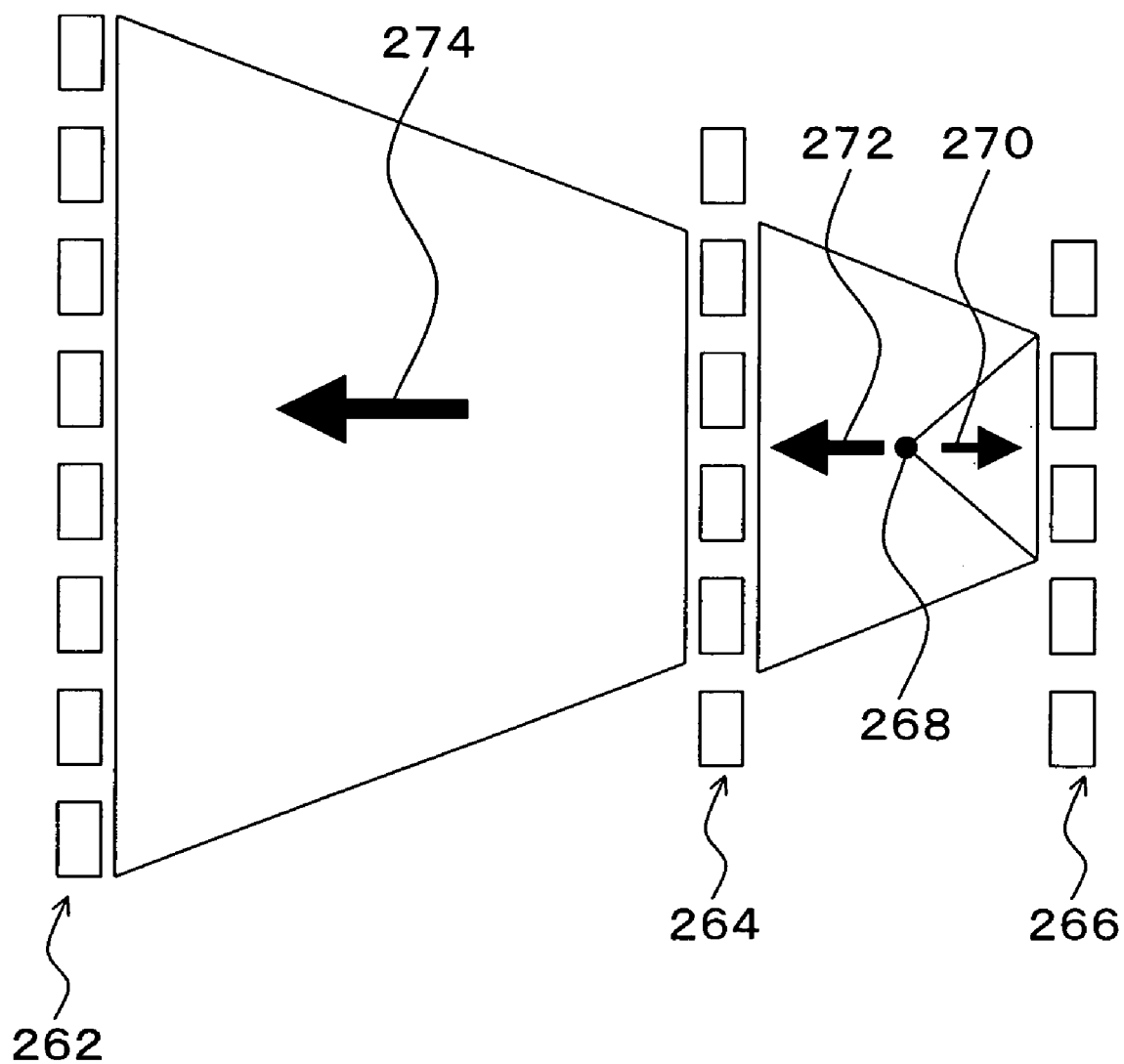
FIG. 31 is an explanatory diagram of a narrowing trace stopping process in the invention.

In the narrowing mark processing unit 28 provided for the ATPG core unit 24 in FIG. 6, as a preparation of the failure excitation by the failure exciting unit 30, as shown in FIG. 31, marking of a narrowing range by back traces 270 and 272 from a failure presumption point 268 to a sending FF group 264 via a receiving FF group 266 and marking of a narrowing range by a back trace 274 from the sending FF group 264 to a preparation FF group 262 are executed. At this time, if extents of the fan-out between the respective FFs are uniformly equal, generally, a tracing range from the sending FF group 264 to the preparation FF group 262 has an extent of the square on average as compared with a tracing range from the receiving FF group 266 to the sending FF group 264 and it takes a longer time for performing the narrowing.

Figure 32:
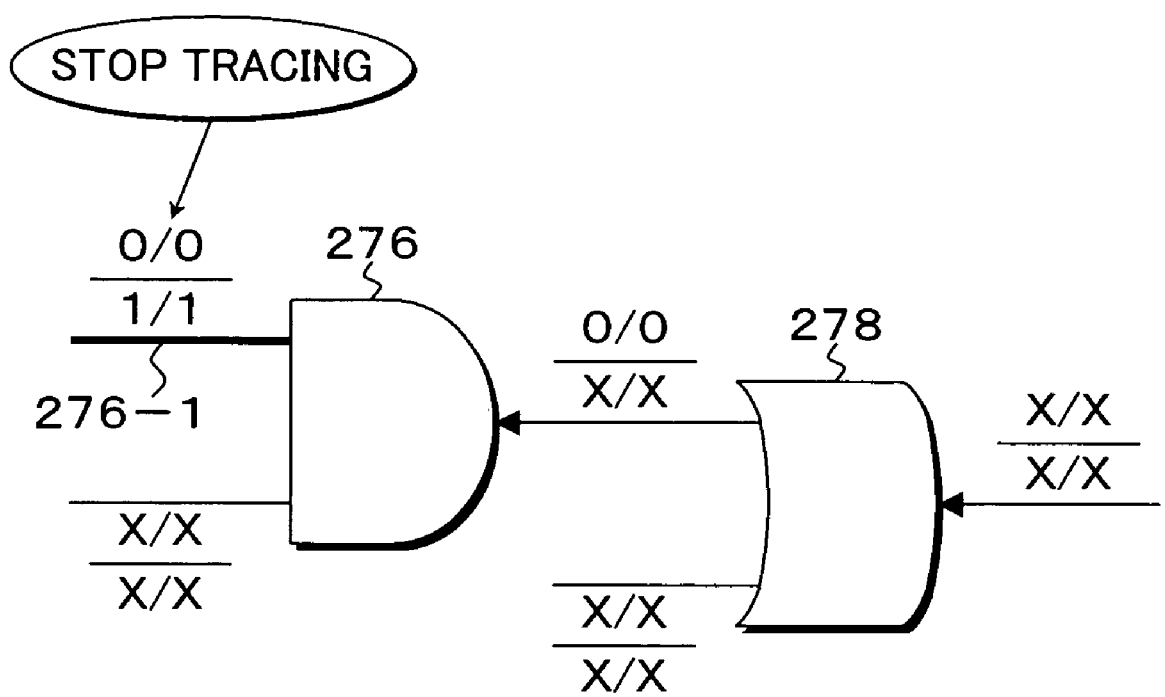
FIG. 32 is an explanatory diagram of narrowing trace stopping conditions.

FIG. 32 shows a back trace for marking the conditional implication propagation by the narrowing operation to a certain target failure. As a network state in this back trace, a state other than the don't care X is allocated as a state of an input pin 276-1 of an AND gate 276 with respect to both of the sending time and the receiving time. Therefore, the network state of the input pin 276-1 is not changed by any failure excitation and conditional implication operation of the failure propagation which are subsequently executed to the target failure. Therefore, the input pins up to the input pin 276-1 having the state other than the don't care X are excluded from the targets of the conditional implication propagation and the trace is stopped.

The network states at the sending time and the receiving time to stop the back trace of narrowing as mentioned above are determined in the case like a test mode where the fixed value of the network state is set or the case where the state allocation according to the success in the automatic test pattern generation to the further previous target failure is finished in the pattern compaction. Therefore, in the narrowing process of the invention, the marking process of a conditional implication propagating range for allowing the trace in the narrowing to be stopped by the pattern compaction, that is, the narrowing range is reduced and the high speed of the automatic test pattern generation can be realized.

According to the narrowing process of the invention, although the marking of the network is executed as a preparation prior to the failure excitation and the failure propagating operation to a certain failure target and the unmarking to remove the mark is executed after completion of the automatic test pattern generation according to the failure excitation and the propagating operation to the target failure, the network range to be traced does not depend on a failure value of the target. However, in the ordinary dynamic function test, as target failures, a pair of the leading delay failure shown in FIGS. 9A to 9D and the trailing delay failure shown in FIGS. 10A to 10D exists.

In the invention, therefore, when the automatic test pattern generation to one of the pair of failures comprising the leading failure and the trailing failure fails, if the other one of the pair of failures is not detected, the unmarking of the narrowing range is not executed but the narrowing range which has already been set is used in common. The residual undetected one of the pair of failures is used as a next target and the automatic test pattern generation according to the failure excitation and the failure propagating operation is executed.

Figure 33:
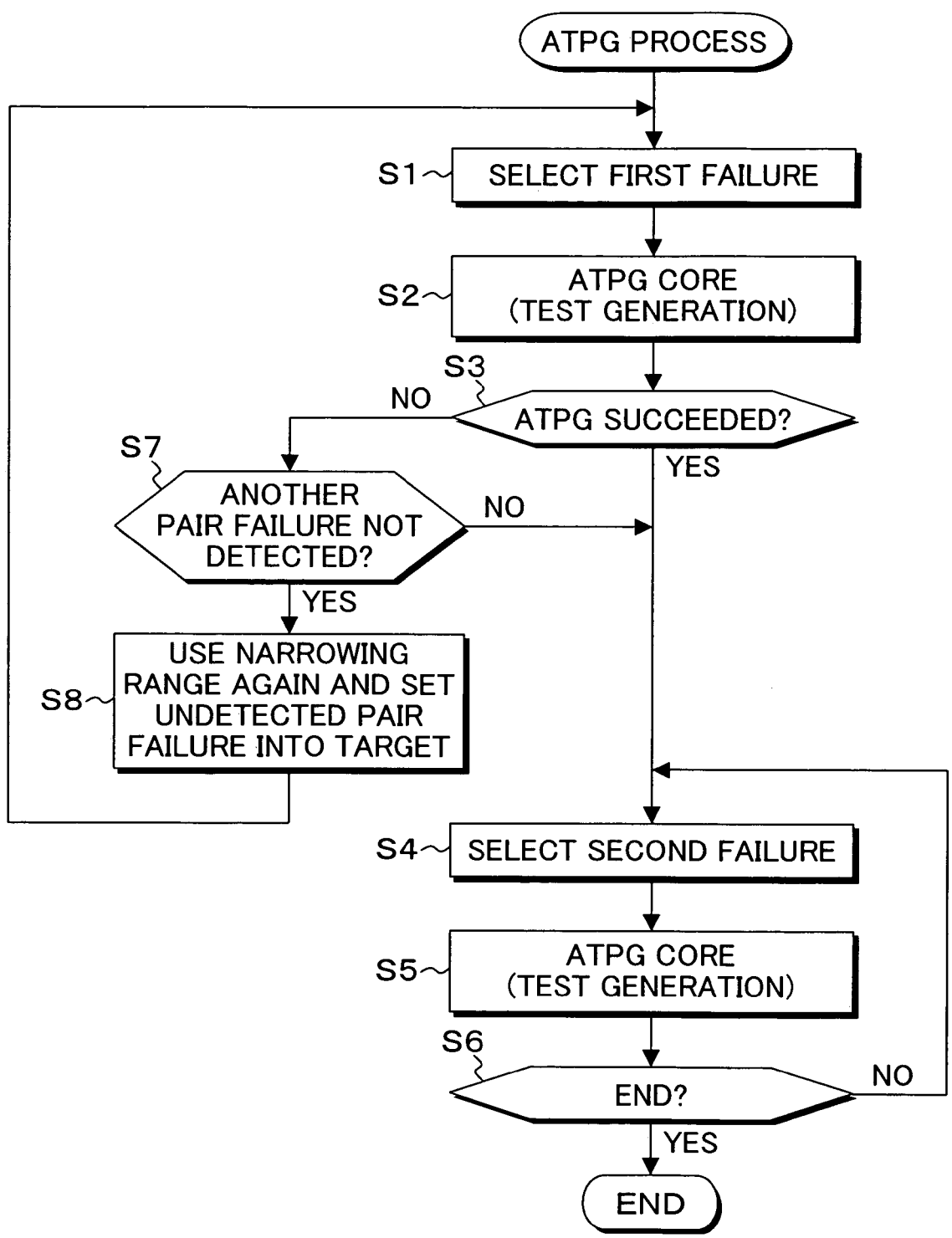
FIG. 33 is a flowchart for an automatic test pattern generating process using the narrowing in common with respect to pair failure targets.

FIG. 33 is a flowchart for the ATPG process using the pair of failures as targets. Steps S1 to S6 are substantially the same as the processes in FIG. 5. In addition to them, in the case of using the pair of failures as targets, when the ATPG fails with respect to one of the pair of failures, whether the other one of the pair of failures is not detected or not is discriminated in step S7. If it is not detected, step S8 follows, the narrowing range is used, the undetected one of the pair of failures is set as a target, and the ATPG process from step S1 is executed.

The invention provides a program for processing the integrated circuit test which is realized by the flowcharts shown in the embodiments and also provides a computer-readable storing medium in which the program has been stored. As a storing medium in this case, there are: a portable storing medium such as CD-ROM, floppy disk, DVD disk, magnetooptic disk, IC card, or the like; a storing apparatus such as a hard disk HDD or the like provided inside or outside of a computer system; a database to hold the program via a line; another computer system; its database; and further, a transmitting medium on the line. The invention is not limited to the foregoing embodiments but incorporates proper modifications without losing its objects and advantages. The invention is not limited by the numerical values shown in the foregoing embodiments.

As described above, according to the invention, as a state for activating the propagating path of the failure for the dynamic function test, the allocation of the don't care X at the sending time is permitted, after the change in network, the value is shifted to the uncontrol value from the don't care X, and the propagating path of the failure is activated. Therefore, even if the inevitable change is propagated to the network to which the activating conditions are given by the allocation of the state for performing the failure excitation, the automatic test pattern generating process can be executed, and the failure detection ratio can be fairly improved.

By admitting the change in uncontrol value at the receiving time from the don't care X at the sending time as activating conditions, the number of allocation states at the sending time decreases. Since the number of allocation states is reduced, a possibility of occurrence of a contradiction decreases. Thus, the number of test patterns which are generated decreases and the high processing speed can be realized.

By conditional-implicating the uncontrol "u" to the failure value at the receiving time of the sending FF to which the clock-off has been allocated, the allocation itself of the failure excitation is determined to be failure-undetectable in the failure observation. Thus, the wasteful targets are reduced and the high speed of the automatic test pattern generation can be realized. When the automatic test pattern generation to a certain failure fails, the failure in which the inverting relation is equal to that of the failed failure and the condition such that the failure value is equal to the control value of the gate is satisfied is determined to be the undetectable failure and excluded from the targets, so that the high speed of the automatic test pattern generation can be realized.

As a fixed state which is allocated to the path cut point of the dynamic function test, by setting either "from 0 to 0" or from "1 to 1" as a state from the sending time to the receiving time and selecting the fixed state which minimizes the number of undetectable failures in those states, the path cut of the nπ path in which the transfer in one cycle other than the loop circuit is certainly performed and the reduction in failure detection ratio due to the setting of the fixed state is prevented. Further, when the setting of the gate control value among a plurality of gates of the input of the gate to drive the path cut point is transferred to the control value of another input gate at the receiving time, by further adding and allocating the control value to one input pin at the sending time, a hazard-free fixed state in which the hazard is not propagated to the path cut point can be generated.

In the narrowing which is performed as a preparation of the failure excitation, by stopping the back track by the network which is not the don't care X by the back trace, the marking process for narrowing is reduced, so that the high speed of the automatic test pattern generation can be realized.

Further, with respect to the pair of failures of the leading delay failure and the trailing delay failure, if the automatic test pattern generation of one of the delay failures fails, the unmarking of the narrowing range is not performed but the narrowing range is used in common for the residual undetected delay failure between the pair of failures, so that it is sufficient to execute the narrowing process once with respect to the pair of failures and the processing amount can be reduced by half.

What is claimed is:
1. An integrated circuit testing method comprising:
a reading step wherein circuit data is read out by a circuit data reading unit;
a path cut step wherein a path cut point is selected from a target circuit and a state is fixed by a path cut countermeasure unit; and
an automatic test pattern generating step wherein test data to detect a delay failure with respect to the circuit whose path cut has been finished as a target is generated by an automatic test pattern generation unit, wherein said automatic test pattern generating step comprises:

a narrowing step wherein an area including a sending FF group corresponding to failure presumption points, a receiving FF, and further, a preparation FF group that is one-stage precedent to said sending FF group is specified as a processing target circuit by a narrowing processing unit;

a failure exciting step wherein states of failure excitation at sending time and receiving time which have an inverting relation such that the state changes from 0 to 1 in a leading failure and changes from 1 to 0 in a trailing failure are allocated to said failure presumption points by a failure exciting unit;

a path activating step wherein states at the sending time and the receiving time for activating a propagating path of said failure are allocated to the residual preparation FFs and sending FFs by a failure propagating state setting unit; and a failure propagating step wherein, by an automatic test pattern generation control unit, a system clock is supplied as a sending clock to said sending FF, a change is given to a network from the sending FF and propagated, the system clock is supplied as a receiving clock to said receiving FF, and the network change is captured, thereby propagating a state for detecting the delay failure to a path between the sending FF and the receiving FF and generating a test pattern when the propagation succeeds, and further, in said path activating step, an allocation of a don't care X is permitted as a state for activating the propagating path of the failure, and in said failure propagating step, after the change in network, the state is transferred from the don't care X to an uncontrol value, thereby activating the propagating path of the failure.

2. A method according to claim 1, wherein in said path cut step, in a gate input of driving the path cut point, a control value of a gate is given at the sending time and the receiving time and the state is fixed, or the uncontrol value of the gate is given to all gate inputs at the sending time and the receiving time and the state of said path cut point is fixed by allocating a fixed state "from 0 to 0" or "from 1 to 1".

3. A method according to claim 2, wherein said path cut step has a fixed state selecting step wherein, with respect to the fixed state "from 0 to 0" or "from 1 to 1" which is allocated to the path cut point, a failure detection impossible number is measured by said automatic test pattern generating step and the fixed state whose failure detection impossible number is small is selected.

4. A method according to claim 2, wherein said path cut step has a hazard-freeing step wherein in the case where a transfer in which a pin input position of the control value changes at the sending time and the receiving time exists among a plurality of input pins of the driver side gates for the path cut point, by adding and allocating the control value at the sending time to at least one input pin to which the control value is given at the receiving time, the hazard-free fixed state is generated for the path cut point.

5. A method according to claim 1, wherein in said narrowing step, as a preparation of said failure exciting step, a narrowing range is marked by back traces of two stages from the failure presumption point to the sending FF group via the receiving FF and from the sending FF group to the preparation FF group, and if both states at the sending time and the receiving time of the network are not the don't care X, the back trace after the network is stopped.

6. A method according to claim 5, wherein in said automatic test pattern generating step, if the detection of the delay failure fails with respect to either the leading delay failure or the trailing delay failure of the same network, the unmarking of the narrowing range which has been marked by the back trace in said narrowing step is not performed but the mark is used as it is, and the test pattern generation is executed by using the other undetected delay failure as a target.

7. A method according to claim 1, wherein said don't care X is a logic value constructing the test pattern which does not exert an influence on a failure detection ratio even if it is replaced with an opposite value.

8. A method according to claim 1, wherein after said failure propagating step is finished, said method comprises:

a compaction failure exciting step wherein the don't care X in said path activating step changes to a value opposite to that of the state at the receiving time and the state of the failure excitation is allocated; and a compaction failure propagating step wherein the system clock is supplied as a sending clock to said sending FF, the change is given to the network from the sending FF and propagated, the system clock is supplied as a receiving clock to said receiving FF, and the network change is captured, thereby propagating the state for detecting the delay failure to the path between the sending FF and the receiving FF and generating the test pattern when the propagation succeeds.

9. A method according to claim 1, wherein in said failure exciting step, when a clock-off is allocated to the sending FF at the sending time, an uncontrol value (u) showing that the failure excitation is impossible for a failure value is conditional-implicated in an output of said sending FF at the receiving time, the allocation itself of said uncontrol value (u) is determined that the failure excitation is impossible, and the failure is excluded from targets of the delay failure.

10. A method according to claim 1, wherein when the failure propagation fails in said failure propagating step, among the failures which are presumed into the network from the network in which the failed failure has been presumed to a branch input of a fan-out free area, the failure in which the inverting relation is equal to that of the failed failure and a failure value is equal to a control value of a gate is extracted and excluded as an undetectable failure.

11. A computer-readable storage medium storing a computer-readable program for executing a method of testing an integrated circuit, said method comprising the steps of:

a reading step wherein circuit data is read out;

a path cut step wherein a path cut point is selected from a target circuit and a state is fixed by a path cut countermeasure unit; and an automatic test pattern generating step wherein test data to detect a delay failure with respect to the circuit whose path cut has been finished as a target is generated, wherein said automatic test pattern generating step allows the computer to execute:

a narrowing step wherein an area including a sending FF group corresponding to failure presumption points, a receiving FF, and further, a preparation FF group that is one-stage precedent to said sending FF group is specified as a processing target circuit;

a failure exciting step wherein states of failure excitation at sending time and receiving time which have an inverting relation such that the state changes from 0 to 1 in a leading failure and changes from 1 to 0 in a trailing failure are allocated to said failure presumption points;

a path activating step wherein states at the sending time and the receiving time for activating a propagating path of said failure are allocated to the residual preparation FFs and sending FFs; and a failure propagating step wherein a system clock is supplied as a sending clock to said sending FF, a change is given to a network from the sending FF and propagated, the system clock is supplied as a receiving clock to said receiving FF, and the network change is captured, thereby propagating a state for detecting the delay failure to a path between the sending FF and the receiving FF and generating a test pattern when the propagation succeeds, and further, in said path activating step, an allocation of a don't care X is permitted as a state for activating the propagating path of the failure, and in said failure propagating step, after the change in network, the state is transferred from the don't care X to an uncontrol value, thereby activating the propagating path of the failure.

12. The computer-readable storage medium according to claim 11, wherein in said path cut step, in a gate input of driving the path cut point, a control value of a gate is given at the sending time and the receiving time and the state is fixed, or the uncontrol value of the gate is given to all gate inputs at the sending time and the receiving time and the state of said path cut point is fixed by allocating a fixed state "from 0 to 0" or "from 1 to 1".

13. The computer-readable storage medium according to claim 12, wherein said path cut step has a fixed state selecting step wherein, with respect to the fixed state "from 0 to 0" or "from 1 to 1" which is allocated to the path cut point, a failure detection impossible number is measured by said automatic test pattern generating step and the fixed state whose failure detection impossible number is small is selected.

14. The computer-readable storage medium according to claim 12, wherein said path cut step has a hazard-freeing step wherein in the case where a transfer in which a pin input position of the control value changes at the sending time and the receiving time exists among a plurality of input pins of the driver side gates for the path cut point, by adding and allocating the control value at the sending time to at least one input pin to which the control value is given at the receiving time, the hazard-free fixed state is generated for the path cut point.

15. The computer-readable storage medium according to claim 11, wherein in said narrowing step, as a preparation of said failure exciting step, a narrowing range is marked by back traces of two stages from the failure presumption point to the sending FF group via the receiving FF and from the sending FF group to the preparation FF group, and if both states at the sending time and the receiving time of the network are not the don't care X, the back trace after the network is stopped.

16. The computer-readable storage medium according to claim 15, wherein in said automatic test pattern generating step, if the detection of the delay failure fails with respect to either the leading delay failure or the trailing delay failure of the same network, unmarking of the narrowing range which has been marked by the back trace in said narrowing step is not performed but the mark is used as it is, and the test pattern generation is executed by using the other undetected delay failure as a target.

17. The computer-readable storage medium according to claim 11, wherein said don't care X is a logic value constructing the test pattern which does not exert an influence on a failure detection ratio even if it is replaced with an opposite value.

18. The computer-readable storage medium according to claim 11, wherein after said failure propagating step is finished, said program allows the computer to execute:

a compaction failure exciting step wherein the don't care X in said path activating step changes to a value opposite to that of the state at the receiving time and the state of the failure excitation is allocated; and a compaction failure propagating step wherein the system clock is supplied as a sending clock to said sending FF, the change is given to the network from the sending FF and propagated, the system clock is supplied as a receiving clock to said receiving FF, and the network change is captured, thereby propagating the state for detecting the delay failure to the path between the sending FF and the receiving FF and generating the test pattern when the propagation succeeds.

19. The computer-readable storage medium according to claim 11, wherein in said failure exciting step, when a clock-off is allocated to the sending FF at the sending time, an uncontrol value showing that the failure excitation is impossible for a failure value is conditional-implicated in an output of said sending FF at the receiving time, an allocation itself of said uncontrol value is determined that the failure excitation is impossible, and the failure is excluded from targets of the delay failure.

20. The computer-readable storage medium according to claim 11, wherein when the failure propagation fails in said failure propagating step, among the failures which are presumed into the network from the network in which the failed failure has been presumed to a branch input of a fan-out free area, the failure in which the inverting relation is equal to that of the failed failure and a failure value is equal to a control value of a gate is extracted and excluded as an undetectable failure.

21. A system for testing integrated circuits, said system comprising:

a first allocating means for allocating failure excitation states of circuit operating modes to failure presumption points of a processing target circuit including a sending FF group, a receiving FF group, and further, a preparation FF group that is one-stage precedent to said sending FF group;

a second allocating means for allocating a state showing a circuit operating mode for activating a propagating path of a failure at a sending time and a receiving time to the residual preparation FFs and sending FFs; and a failure propagating means for supplying a system clock as a sending clock to said sending FF, a change is given to a network from the sending FF and propagated, and for supplying the system clock as a receiving clock to said receiving FF, and the network change is grasped, thereby propagating the state showing the circuit operating mode for detecting the delay failure to a path between the sending FF and the receiving FF;

a generating means for generating a test pattern constructed by a set of input values to said sending FF group and output values of said receiving FF group as expectation values against said input values when a propagation of a state showing the circuit operating mode for detecting said delay failure is successful, wherein, when the state showing the circuit operating mode for activating the propagating path of the failure after said network change is a state which is shifted to an uncontrol value from a don't care value X, the propagating path of the failure is activated by permitting said don't care value X.

22. The system according to claim 21, further comprising:
a compaction failure exciting means for allocating said state in which the don't care value X is changed to a value opposite to that of the state showing the circuit operating mode at the receiving time; and a compaction failure propagating means for supplying the system clock is as a sending clock to said sending FF, the change is given to the network from the sending FF and propagated, and for supplying the system clock as a receiving clock to said receiving FF, and the network change is grasped, and for propagating the state showing the circuit operating mode for detecting the delay failure in the path between the sending FF and the receiving FF, and wherein the generating means generates a test pattern constructed by a set of input values to said sending FF group and output values of said receiving FF group as expectation values against said input values.

23. A system for testing integrated circuits, said system comprising:
a generating means for generating a test pattern for detecting a delay failure in a gate input for driving a path cut point of a circuit;

a fixing means for fixing a state showing a circuit operating mode by giving control values of a gate at a sending time and a receiving time, or by giving an uncontrol value of the gate to all gate inputs at the sending time and the receiving time; and an allocating means for allocating a fixed state having a change "from 0 to 0" or "from 1 to 1" as said state showing the circuit operating mode at said path cut point, thereby fixing said state.

24. A system according to claim 23, further comprising:
a generating means for generating a hazard-free fixed state for said path cut point in the case where a transfer accompanied with a change in pin input position of the control value exists among a plurality of input pins of the driver side gates to drive said path cut point between the sending time and the receiving time, and by adding and allocating the control value at the sending time to at least one input pin to which the control value is given at the receiving time.

25. A system for testing integrated circuits, said system comprising:
a marking means for marking a narrowing range by back traces of two stages from a failure presumption point of a circuit to generate a test pattern for detecting a delay failure to a sending FF group via a receiving FF group and from the sending FF group to a preparation FF group; and a stopping means for stopping the execution of the back trace if both states showing a circuit operating mode at the sending time and the receiving time of a network are not a don't care value X.

26. A system according to claim 25, wherein
if the detection of the delay failure fails with respect to either a leading delay failure or a trailing delay failure of the same network, the mark of the narrowing range per-formed in the back trace of said narrowing is not erased but said mark is used as it is, thereby executing the test pattern generation by using the other delay failure, as a target, whose delay failure is not detected.

27. A computer-readable storing medium which stores a program, wherein said program stores the following steps which are executed by a computer:
a failure exciting step wherein states showing circuit operating modes of failure excitation at a sending time and a receiving time are allocated to failure presumption points of a processing target circuit including a sending FF group, a receiving FF group, and further, a preparation FF group that is one-stage precedent to said sending FF group;

a path activating step wherein a state showing a circuit operating mode for activating a propagating path of said failure at the sending time and the receiving time is allocated to the residual preparation FFs and sending FFs; and a failure propagating step wherein a system clock is supplied as a sending clock to said sending FF, a change is given to a network from the sending FF and propagated, the system clock is supplied as a receiving clock to said receiving FF, and the network change is grasped, thereby propagating the state showing the circuit operating mode for detecting the delay failure to a path between the sending FF and the receiving FF, and when the propagation of the state showing the circuit operating mode for detecting said delay failure is successful, a test pattern constructed by a set of input values to said sending FF group and output values of said receiving FF group as expectation values against said input values is generated, and further, as said path activating step, when the state showing the circuit operating mode for activating the propagating path of the failure after said network change is a state which is shifted to an uncontrol value from a don't care value X, the propagating path of the failure is activated by permitting said don't care value X.

28. A medium according to claim 27, wherein after said failure propagating step is finished, said program further stores:
a compaction failure exciting step wherein said state in which the don't care value X in said path activating step is changed to a value opposite to that of the state showing the circuit operating mode at the receiving time is allocated; and a compaction failure propagating step wherein the system clock is supplied as a sending clock to said sending FF, the change is given to the network from the sending FF and propagated, the system clock is supplied as a receiving clock to said receiving FF, and the network change is grasped, thereby propagating the state showing the circuit operating mode for detecting the delay failure in the path between the sending FF and the receiving FF, and when the propagation of said state is successful, the test pattern constructed by a set of input values to said sending FF group and output values of said receiving FF group as expectation values against said input values is generated.

29. A computer-readable storing medium which stores a program, wherein said program stores the following steps which are executed by a computer:
generating a test pattern for detecting a delay failure in a gate input for driving a path cut point of a circuit;

fixing a state showing a circuit operating mode by giving control values of a gate at a sending time and a receiving time, or by giving an uncontrolled value of the gate to all gate inputs at the sending time and the receiving time; and allocating a fixed state having a change "from 0 to 0" or "from 1 to 1" as said state showing the circuit operating mode at said path cut point, thereby fixing said state.

30. A medium according to claim 29, wherein said program further stores a step wherein:

generating a hazard-free fixed state for said path cut point in the case where a transfer accompanied with a change in pin input position of the control value exists among a plurality of input pins of the driver side gates to drive said path cut point between the sending time and the receiving time, and by adding and allocating the control value at the sending time to at least one input pin to which the control value is given at the receiving time.

31. A computer-readable storing medium which stores a program, wherein said program stores the following narrowing step which is executed by a computer:

a narrowing range is marked by back traces of two stages from a failure presumption point of a circuit to generate a test pattern for detecting a delay failure to a sending FF group via a receiving FF group and from the sending FF group to a preparation FF group, and if both states showing a circuit operating mode at the sending time and the receiving time of a network are not a don't care value X, execution of the back trace after the network is stopped.

32. A medium according to claim 31, wherein said program further stores a step wherein:

if the detection of the delay failure fails with respect to either a leading delay failure or a trailing delay failure of the same network, the mark of the narrowing range performed in the back trace of said narrowing is not erased but said mark is used as it is, thereby executing the test pattern generation by using the other delay failure, as a target, whose delay failure is not detected.

33. A pattern forming method of forming a test pattern for detecting a delay failure of a circuit, comprising:

a failure exciting step wherein circuit states showing circuit operating modes of failure excitation at a sending time and a receiving time are allocated to failure presumption points of a processing target circuit including a sending FF group, a receiving FF group, and further, a preparation FF group that is one-stage precedent to said sending FF group;

a path activating step wherein a state showing a circuit operating mode for activating a propagating path of said failure at the sending time and the receiving time is allocated to the residual preparation FFs and sending FFs; and a failure propagating step wherein a system clock is supplied as a sending clock to said sending FF, a change is given to a network from the sending FF and propagated, the system clock is supplied as a receiving clock to said receiving FF, and the network change is grasped, thereby propagating the state showing the circuit operating mode for detecting a delay failure to a path between the sending FF and the receiving FF, and when the propagation of the state showing the circuit operating mode for detecting said delay failure is successful, a test pattern constructed by a set of input values to said sending FF group and output values of said receiving FF group as expectation values against said input values is generated, wherein, further, as said path activating step, when the state showing the circuit operating mode for activating the propagating path of the failure after said network change is a state which is shifted to an uncontrol value from a don't care value X, the propagating path of the failure is activated by permitting said don't care value X.

34. A method according to claim 33, wherein after said failure propagating step is finished, said method further comprises:

a compaction failure exciting step wherein said state in which the don't care value X in said path activating step is changed to a value opposite to that of the state showing the circuit operating mode at the receiving time is allocated; and a compaction failure propagating step wherein the system clock is supplied as a sending clock to said sending FF, the change is given to the network from the sending FF and propagated, the system clock is supplied as a receiving clock to said receiving FF, and the network change is grasped, thereby propagating the state showing the circuit operating mode for detecting the delay failure in the path between the sending FF and the receiving FF, and when the propagation of said state is successful, the test pattern constructed by a set of input values to said sending FF group and output values of said receiving FF group as expectation values against said input values is generated.

35. A pattern forming method comprising a step wherein:

generating a test pattern for detecting a delay failure in a gate input for driving a path cut point of a circuit;

fixing a state showing a circuit operating mode by giving control values of a gate at a sending time and a receiving time, or by giving an uncontrolled value of the gate to all gate inputs at the sending time and the receiving time; and allocating a fixed state having a change "from 0 to 0" or "from 1 to 1" as said state showing the circuit operating mode at said path cut point, thereby fixing said state.

36. A method according to claim 35, further comprising a step wherein:

generating a hazard-free fixed state for said path cut point in the case where a transfer accompanied with a change in pin input position of the control value exists among a plurality of input pins of the driver side gates to drive said path cut point between the sending time and the receiving time, and by adding and allocating the control value at the sending time to at least one input pin to which the control value is given at the receiving time.

37. A pattern forming method comprising a narrowing step wherein:

a narrowing range is marked by back traces of two stages from a failure presumption point of a circuit to generate a test pattern for detecting a delay failure to a sending FF group via a receiving FF group and from the sending FF group to a preparation FF group, and if both states showing a circuit operating mode at the sending time and the receiving time of a network are not a don't care value X, execution of the back trace after the network is stopped.

38. A method according to claim 37, wherein
if the detection of the delay failure fails with respect to either a leading delay failure or a trailing delay failure of the same network,
the mark of the narrowing range performed in the back trace of said narrowing is not erased but said mark is used as it is,
thereby generating the test pattern by using the other delay failure, as a target, whose delay failure is not detected.

39. A pattern forming apparatus for forming a test pattern for detecting a delay failure of a circuit, comprising:
a failure exciting unit which allocates states showing circuit operating modes of failure excitation at a sending time and a receiving time to
failure presumption points of a processing target circuit including a sending FF group, a receiving FF group, and further, a preparation FF group that is one-stage precedent to said sending FF group;
a path activating unit which allocates a state showing a circuit operating mode for activating a propagating path of said failure at the sending time and the receiving time to the residual preparation FFs and sending FFs; and
a failure propagating unit constructed in such a manner that a system clock is supplied as a sending clock to said sending FF, a change is given to a network from the sending FF and propagated, the system clock is supplied as a receiving clock to said receiving FF, and the network change is grasped, thereby propagating the state showing the circuit operating mode for detecting the delay failure to a path between the sending FF and the receiving FF, and
when the propagation of the state showing the circuit operating mode for detecting said delay failure is successful, a test pattern constructed by a set of input values to said sending FF group and output values of said receiving FF group as expectation values against said input values is generated,
wherein, further, when the state showing the circuit operating mode for activating the propagating path of the failure after said network change is a state which is shifted to an uncontrol value from a don't care value X, said path activating unit activates the propagating path of the failure by permitting said don't care value X.

40. An apparatus according to claim 39, wherein after the process in said failure propagating unit is finished, said apparatus further comprises:
a compaction failure exciting unit which allocates said state in which the don't care value X in said path activating unit is changed to a value opposite to that of the state showing the circuit operating mode at the receiving time; and
a compaction failure propagating unit constructed in such a manner that the system clock is supplied as a sending clock to said sending FF, the change is given to the network from the sending FF and propagated, the system clock is supplied as a receiving clock to said receiving FF, and the network change is grasped, thereby propagating the state showing the circuit operating mode for detecting the delay failure in the path between the sending FF and the receiving FF, and
when the propagation of said state is successful, the test pattern constructed by a set of input values to said sending FF group and output values of said receiving FF group as expectation values against said input values is generated.

41. A pattern forming apparatus for forming a test pattern for detecting a delay failure of a circuit, comprising:
a generating means for generating a test pattern for detecting a delay failure in a gate input for driving a path cut point of a circuit;
a fixing means for fixing a state showing a circuit operating mode by giving control values of a gate at a sending time and a receiving time, or by giving an uncontrolled value of the gate to all gate inputs at the sending time and the receiving time; and
an allocating means for allocating a fixed state having a change "from 0 to 0" or "from 1 to 1" as said state showing the circuit operating mode at said path cut point, thereby fixing said state.

42. An apparatus according to claim 41, further comprising:
a generating means for generating a hazard-free fixed state for said path cut point in the case where a transfer accompanied with a change in pin input position of the control value exists among a plurality of input pins of the driver side gates to drive said path cut point between the sending time and the receiving time, and
by adding and allocating the control value at the sending time to at least one input pin to which the control value is given at the receiving time.

43. A pattern forming apparatus for forming a test pattern for detecting a delay failure of a circuit, comprising:
a narrowing processing unit constructed in such a manner that
a narrowing range is marked by back traces of two stages from a failure presumption point of a circuit to generate a test pattern for detecting a delay failure to a sending FF group via a receiving FF group and from the sending FF group to a preparation FF group, and
if both states showing a circuit operating mode at the sending time and the receiving time of a network are not a don't care value X, execution of the back trace after the network is stopped.

44. An apparatus according to claim 43, further comprising a pattern generating unit constructed in such a manner that
if the detection of the delay failure fails with respect to either a leading delay failure or a trailing delay failure of the same network,
the mark of the narrowing range performed in the back trace of said narrowing is not erased but said mark is used as it is,
thereby executing the test pattern generation by using the other delay failure, as a target, whose delay failure is not detected.

45. A system for testing integrated circuits, comprising:
a reading means for reading out circuit data;
a path cut means for selecting a path cut point from a target circuit and for fixing a state by a path cut countermeasure unit; and
an automatic test pattern generating means for generating test data to detect a delay failure with respect to the circuit whose path cut has been finished as a target
a narrowing means for specifying a processing target circuit where the processing target circuit includes a sending FF group corresponding to failure presumption points, a receiving FF, and further, a preparation FF group that is one-stage precedent to said sending FF group;
a failure exciting means for allocating states of failure excitation at sending time and receiving time which have an inverting relation such that the state changes from 0 to 1 in a leading failure and changes from 1 to 0 in a trailing failure to said failure presumption points;

a path activating means for allocating states at the sending time and the receiving time for activating a propagating path of said failure to the residual preparation FFs and sending FFs; and a failure propagating means for sending a system clock as a sending clock to said sending FF, a change is given to a network from the sending FF and propagated, and for supplying the system clock is supplied as a receiving clock to said receiving FF, and the network change is captured, thereby propagating a state for detecting the delay failure to a path between the sending FF and the receiving FF and generating a test pattern when the propagation succeeds, and further, in said path activating means, an allocation of a don't care X is permitted as a state for activating the propagating path of the failure, and in said failure propagating means, after the change in network, the state is transferred from the don't care X to an uncontrol value, thereby activating the propagating path of the failure.

46. An integrated circuit testing apparatus comprising:

a circuit data reading unit which reads out circuit data;

a path cut countermeasure unit which selects a path cut point from a target circuit and fixes a state; and an automatic test pattern generation unit which generates test data to detect a delay failure with respect to the circuit whose path cut has been finished as a target, wherein said automatic test pattern generation unit comprises:

a narrowing unit which specifies an area including a sending FF group corresponding to failure presumption points, a receiving FF, and further, a preparation FF group that is one-stage precedent to said sending FF group as a processing target circuit;

a failure exciting unit which allocates states of failure excitation at sending time and receiving time which have an inverting relation such that the state changes from 0 to 1 in a leading failure and changes from 1 to 0 in a trailing failure to said failure presumption points;

a failure propagating state setting unit which allocates states at the sending time and the receiving time for activating a propagating path of said failure to the residual preparation FFs and sending FFs; and an automatic test pattern generation control unit which supplies a system clock as a sending clock to the sending FF, gives a change to a network from the sending FF and propagates the change, supplies the system clock as a receiving clock to said receiving FF, and captures the network change, thereby propagating a state for detecting the delay failure to a path between the sending FF and the receiving FF and generating a test pattern when the propagation succeeds, and further, said failure propagating state setting unit permits an allocation of a don't care X as a state for activating the propagating path of the failure, and said automatic test pattern generation control unit transfers the state from the don't care X to an uncontrol value after the change in network, thereby activating the propagating path of the failure.

47. A system for testing integrated circuits, said system comprising:

an allocating means for allocating a state showing a circuit operating mode of failure excitation to failure presumption points of a circuit for generating a test pattern for detecting a delay failure;

an implicating means for conditionally implicating an uncontrolled value (u) showing that the failure excitation is impossible in a failure value corresponding to an output of said sending FF at a receiving time when a clock-off has been allocated to a sending FF at a sending time, and an exclusion means for excluding said failure presumption points from targets of the delay failure when said uncontrol value (u) has been allocated to said failure presumption points, and when it is determined that the failure excitation is impossible.

48. A system for testing integrated circuits, said system comprising:

a detecting means for detecting a failure when failure propagation of a circuit to generate a test pattern for detecting a delay failure;

a presumption means for presuming said failure propagation to a branch input in a fan-out free area where a circuit having a branch output does not exist;

an extracting means for extracting a failure value that is equal to a control value of a gate where the failure in which an inverting relation of a failure value is equal to that of said failed failure; and an excluding means for excluding the failure presumed on said network as an undetectable failure.

49. A computer-readable storing medium which stores a program, wherein said program stores the following steps which are executed by a computer:

when a state showing a circuit operating mode of failure excitation is allocated to failure presumption points of a circuit for generating a test pattern for detecting a delay failure, if a clock-off has been allocated to a sending FF at a sending time, an uncontrol value (u) showing that the failure excitation is impossible is conditional-implicated in a failure value corresponding to an output of said sending FF at a receiving time, and when said uncontrol value (u) has been allocated to said failure presumption points, it is determined that the failure excitation is impossible, and said failure presumption points are excluded from targets of the delay failure.

50. A computer-readable storing medium which stores a program, wherein said program stores the following steps which are executed by a computer:

when failure propagation of a circuit to generate a test pattern for detecting a delay failure fails, among the failures which are presumed on a network from failure presumption points, on the network, where the failure which failed in said failure propagation has been presumed to a branch input in a fan-out free area where a circuit having a branch output does not exist, the failure in which an inverting relation of a failure value is equal to that of said failed failure and the failure value is equal to a control value of a gate is extracted, thereby excluding the failure presumed on said network as an undetectable failure.

51. A pattern forming method comprising a step wherein:

when a state showing a circuit operating mode of failure excitation is allocated to failure presumption points of a circuit for generating a test pattern for detecting a delay failure, if a clock-off has been allocated to a sending FF at a sending time, an uncontrol value (u) showing that the failure excitation is impossible is conditional-implicated in a failure value corresponding to an output of said sending FF at a receiving time, and when said uncontrol value (u) has been allocated to said failure presumption points, it is determined that the failure excitation is impossible, and said failure presumption points are excluded from targets of the delay failure.

52. A pattern forming method comprising a step wherein:
when failure propagation of a circuit to generate a test pattern for detecting a delay failure fails,
among the failures which are presumed on a network from failure presumption points, on the network, where the failure which failed in said failure propagation has been presumed to a branch input in a fan-out free area where a circuit having a branch output does not exist,
the failure in which an inverting relation of a failure value is equal to that of said failed failure and the failure value is equal to a control value of a gate is extracted,
thereby excluding the failure presumed on said network as an undetectable failure.

53. A pattern forming apparatus for forming a test pattern for detecting a delay failure of a circuit, comprising:
a failure exciting unit constructed in such a manner that
when a state showing a circuit operating mode of failure excitation is allocated to failure presumption points of a circuit for generating the test pattern for detecting a delay failure,
if a clock-off has been allocated to a sending FF at a sending time, an uncontrol value (u) showing that the failure excitation is impossible is conditional-implicated in a failure value corresponding to an output of said sending FF at a receiving time, and
when said uncontrol value (u) has been allocated to said failure presumption points, it is determined that the failure excitation is impossible, and said failure presumption points are excluded from targets of the delay failure.

54. A pattern forming apparatus for forming a test pattern for detecting a delay failure of a circuit, comprising:
a failure propagating unit constructed in such a manner that
when failure propagation of a circuit to generate the test pattern for detecting a delay failure fails,
among the failures which are presumed on a network from failure presumption points, on the network, where the failure which failed in said failure propagation has been presumed to a branch input in a fan-out free area where a circuit having a branch output does not exist,
the failure in which an inverting relation of a failure value is equal to that of said failed failure and the failure value is equal to a control value of a gate is extracted,
thereby excluding the failure presumed on said network as an undetectable failure.

* * * * *